(12) United States Patent        (10) Patent No.:     US 12,362,303 B2
     Okada et al.                 (45) Date of Patent:         Jul. 15, 2025

(54) SEMICONDUCTOR MEMORY DEVICE

(71) Applicant: Kioxia Corporation, Tokyo (JP)

(72) Inventors: Nobuaki Okada, Kawasaki (JP);
                Masaki Unno, Fujisawa (JP); Hiroyuki Takenaka, Kamakura (JP); Yoshiaki Takahashi, Yokohama (JP); Hiroshi Maejima, Setagaya (JP)

(73) Assignee: Kioxia Corporation, Tokyo (JP)

( * ) Notice: Subject to any disclaimer, the term of this patent is extended or adjusted under 35 U.S.C. 154(b) by 386 days.

(21) Appl. No.: 17/813,812

(22) Filed: Jul. 20, 2022

(65) Prior Publication Data

US 2023/0307395 A1    Sep. 28, 2023

(30) Foreign Application Priority Data

Mar. 23, 2022 (JP) ................. 2022-046752

(51) Int. Cl.
    H01L 25/065   (2023.01)
    H01L 23/00    (2006.01)
    H01L 25/18    (2023.01)
(52) U.S. Cl.
    CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)
(58) Field of Classification Search
    CPC ................. H01L 25/0657; H01L 25/18; H01L 2224/08145; H01L 2924/1431; H01L 24/08; H01L 2924/14511; H10B 43/27; H10B 43/40; H10B 80/00
    See application file for complete search history.

(56) References Cited

U.S. PATENT DOCUMENTS

| 10,453,518 | B1 | 10/2019 | Nagai |
| 2016/0079164 | A1 | 3/2016 | Fukuzumi et al. |
| 2020/0335513 | A1 | 10/2020 | Morozumi et al. |
| 2021/0082877 | A1* | 3/2021 | Uchiyama .............. H01L 24/16 |
| 2021/0118862 | A1 | 4/2021 | Maejima et al. |
| 2021/0375790 | A1* | 12/2021 | Oda .................. H01L 24/80 |

(Continued)

FOREIGN PATENT DOCUMENTS

| JP | 2016-62901 A | 4/2016 |
| JP | 2021-64731 A | 4/2021 |

*Primary Examiner* — Thanh Y. Tran
(74) *Attorney, Agent, or Firm* — Oblon, McClelland, Maier & Neustadt, L.L.P.

(57) ABSTRACT

A semiconductor memory device comprises a first chip and a second chip bonded via bonding electrodes. The first chip comprises a semiconductor substrate. The second chip comprises: first conductive layers; semiconductor layers facing the first conductive layers; a first wiring layer including bit lines; a second wiring layer including wirings; and a third wiring layer including first bonding electrodes. The wirings each comprise: a first portion provided in a region overlapping one of the bit lines, and is electrically connected to the one of the bit lines; and a second portion provided in a region overlapping one of the first bonding electrodes, and is connected to the one of the first bonding electrodes. At least some of these wirings comprise a third portion connected to one end portion in a second direction of the first portion and one end portion in the second direction of the second portion.

20 Claims, 43 Drawing Sheets

(56) References Cited

U.S. PATENT DOCUMENTS

| | | | |
|---|---|---|---|
| 2022/0344361 A1* | 10/2022 | Jeon | H10B 43/10 |
| 2023/0061301 A1* | 3/2023 | Kim | H10B 43/35 |
| 2023/0083442 A1* | 3/2023 | Murakami | H01L 24/08 |
| | | | 257/777 |
| 2023/0117267 A1* | 4/2023 | Choi | H01L 24/08 |
| | | | 257/777 |

* cited by examiner

SEMICONDUCTOR MEMORY DEVICE

CROSS-REFERENCE TO RELATED APPLICATIONS

This application is based upon and claims the benefit of Japanese Patent Application No. 2022-046752, filed on Mar. 23, 2022, the entire contents of which are incorporated herein by reference.

BACKGROUND

Field

The present embodiment relates to a semiconductor memory device.

Description of the Related Art

There is known a semiconductor memory device comprising: a substrate; a plurality of conductive layers stacked in a direction intersecting a surface of this substrate; a semiconductor layer facing these plurality of conductive layers; and a gate insulating layer provided between the conductive layers and the semiconductor layer. The gate insulating layer comprises a memory portion capable of storing data, such as an insulating electric charge accumulating layer of the likes of silicon nitride (SiN) or a conductive electric charge accumulating layer of the likes of a floating gate, for example.

DETAILED DESCRIPTION

Figure 1:
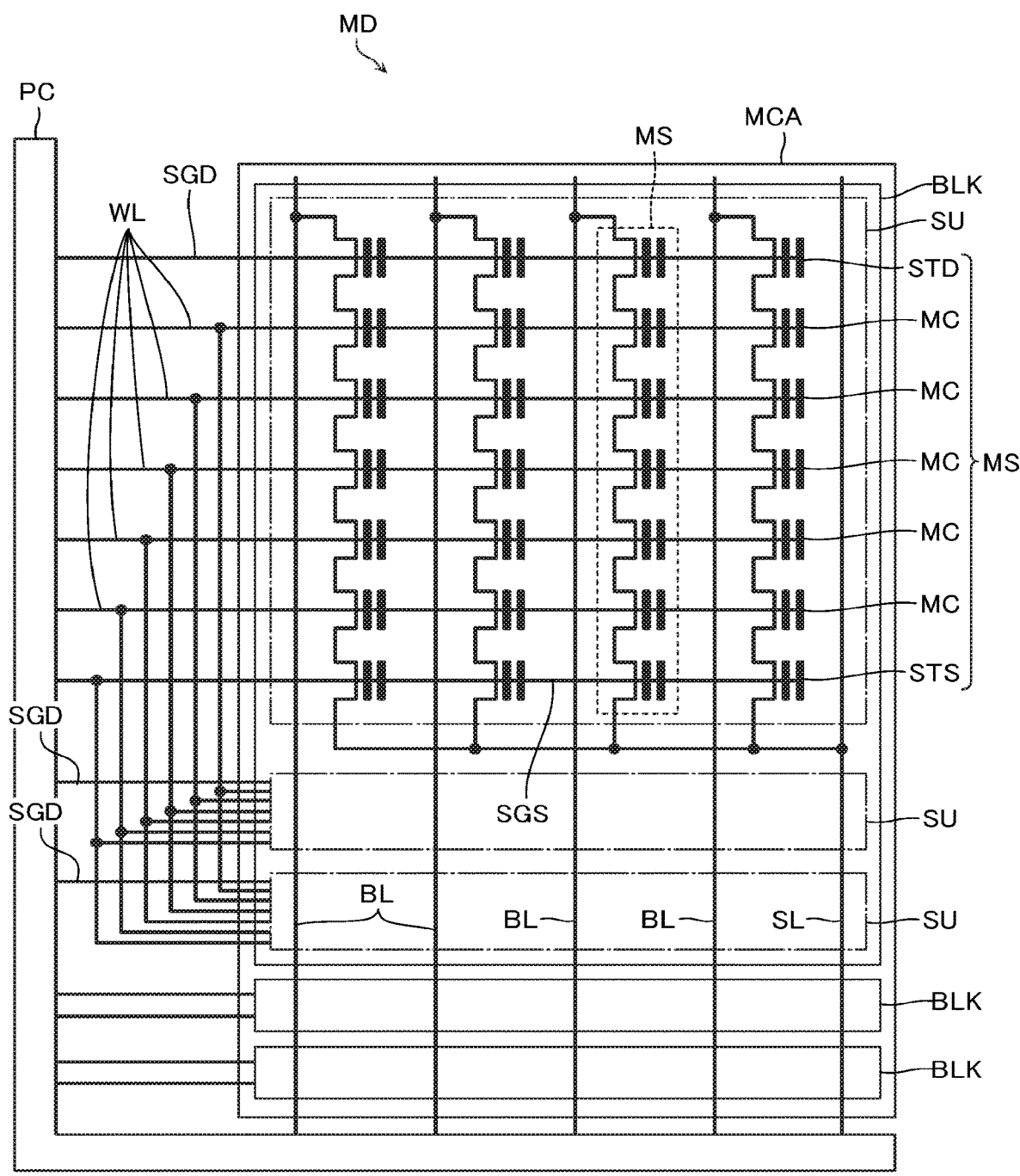
FIG. 1 is a schematic circuit diagram showing a configuration of a part of a memory die MD.

A semiconductor memory device according to an embodiment comprises a first chip and a second chip that have been bonded via a plurality of bonding electrodes. The first chip comprises: a semiconductor substrate; and a plurality of transistors provided on the semiconductor substrate. The second chip comprises: a plurality of first conductive layers; a plurality of semiconductor layers; a first wiring layer; a second wiring layer; and a second chip bonding electrode layer. The plurality of first conductive layers are arranged in a first direction that intersects a surface of the semiconductor substrate. The plurality of semiconductor layers extend in the first direction and face the plurality of first conductive layers. The first wiring layer is provided between the plurality of semiconductor layers and the first chip, and includes a plurality of bit lines electrically connected to the plurality of semiconductor layers. The second wiring layer is provided between the first wiring layer and the first chip, and includes a plurality of wirings. The second chip bonding electrode layer is provided between the second wiring layer and the first chip, and includes a plurality of first bonding electrodes being some of the plurality of bonding electrodes. The plurality of bit lines extend in a second direction that intersects the first direction, and are arranged in a third direction that intersects the first direction and the second direction. The plurality of wirings in the second wiring layer each comprise a first portion and a second portion. The first portion is provided in a region overlapping one of the plurality of bit lines viewed from the first direction, extends in the second direction, and is electrically connected to the one of the plurality of bit lines. The second portion is provided in a region overlapping one of the plurality of first bonding electrodes viewed from the first direction, and is electrically connected to the one of the plurality of first bonding electrodes. At least some of the plurality of wirings in the second wiring layer each comprise a third portion. The third portion extends in the third direction and is connected to one end portion in the second direction of the first portion and one end portion in the second direction of the second portion.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even if the second transistor is in an OFF state.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "electrically conduct" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X direction, a direction parallel to the upper surface of the substrate and perpendicular to the X direction will be referred to as a Y direction, and a direction perpendicular to the upper surface of the substrate will be referred to as a Z direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may correspond to any of the X direction, the Y direction, and the Z direction, but need not do so.

Moreover, in the present specification, expressions such as "above" or "below" will be defined with reference to the substrate. For example, an orientation of moving away from the substrate along the above-described Z direction will be referred to as above, and an orientation of coming closer to the substrate along the Z direction will be referred to as below. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be referred to as a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

[Circuit Configuration of Memory Die MD]

FIG. 1 is a schematic circuit diagram showing a configuration of a part of a memory die MD. As shown in FIG. 1, the memory die MD comprises a memory cell array MCA and a peripheral circuit PC. As shown in FIG. 1, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Other ends of these plurality of memory strings MS are each connected to the peripheral circuit PC via a common source line SL.

The memory string MS comprises a drain side select transistor STD, a plurality of memory cells MC (memory transistors), and a source side select transistor STS. The drain side select transistor STD, the plurality of memory cells MC, and the source side select transistor STS are connected in series between the bit line BL and the source line SL. Hereafter, the drain side select transistor STD and the source side select transistor STS will sometimes simply be referred to as select transistors (STD, STS).

The memory cell MC is a field effect type transistor. The memory cell MC comprises a semiconductor layer, a gate insulating film, and a gate electrode. The semiconductor layer functions as a channel region. The gate insulating film includes a charge accumulating film. A threshold voltage of the memory cell MC changes according to an amount of charge in the charge accumulating film. The memory cell MC stores one bit or a plurality of bits of data. Note that the gate electrodes of the plurality of memory cells MC corresponding to one memory string MS are respectively connected with word lines WL. These word lines WL are respectively commonly connected to all of the memory strings MS in one memory block BLK.

The select transistors (STD, STS) are field effect type transistors. The select transistors (STD, STS) each comprise a semiconductor layer, a gate insulating film, and a gate electrode. The semiconductor layer functions as a channel region. The gate insulating film may include a charge accumulating layer. The gate electrodes of the select transistors (STD, STS) are respectively connected with select gate lines (SGD, SGS). One drain side select gate line SGD is commonly connected to all of the memory strings MS in one string unit SU. One source side select gate line SGS is commonly connected to all of the memory strings MS in one memory block BLK.

Figure 2:
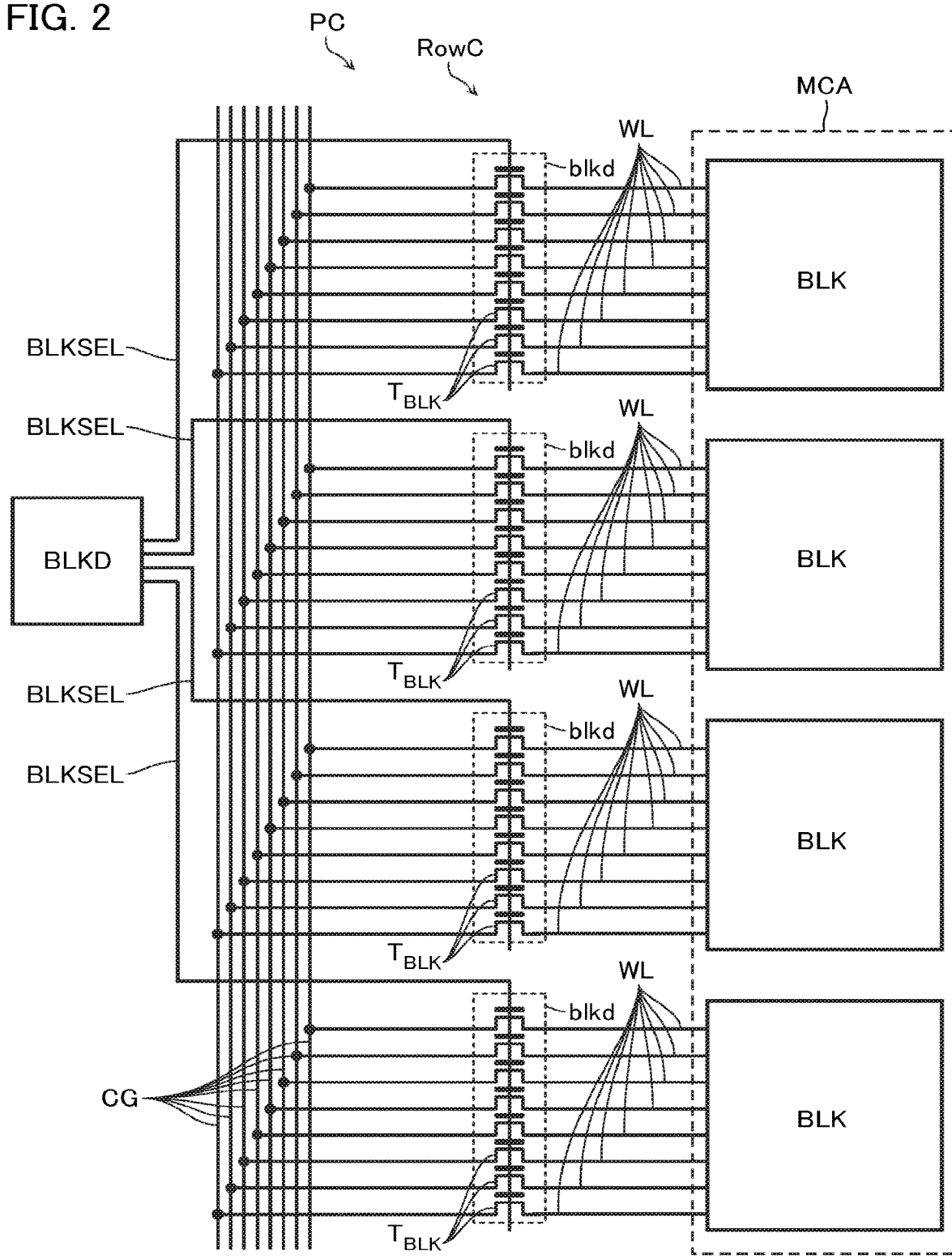
FIG. 2 is a schematic circuit diagram showing a configuration of a part of a peripheral circuit PC.

FIG. 2 is a schematic circuit diagram showing a configuration of a part of the peripheral circuit PC. As shown in FIG. 2, for example, the peripheral circuit PC comprises a row control circuit RowC. The row control circuit RowC comprises a plurality of block decode units blkd and a block decoder BLKD.

The plurality of block decode units blkd correspond to the plurality of memory blocks BLK in the memory cell array MCA. The block decode unit blkd comprises a plurality of transistors $T_{BLK}$. The plurality of transistors $T_{BLK}$ correspond to the plurality of word lines WL in the memory block BLK. The transistor $T_{BLK}$ is a field effect type NMOS transistor, for example. A drain electrode of the transistor $T_{BLK}$ is connected to the word line WL. A source electrode of the transistor $T_{BLK}$ is connected to a wiring CG. The wirings CG are connected to all of the block decode units blkd in the row control circuit RowC. A gate electrode of the transistor $T_{BLK}$ is connected to a signal supply line BLKSEL. A plurality of the signal supply lines BLKSEL are provided correspondingly to all of the block decode units blkd. Moreover, the signal supply line BLKSEL is connected to all of the transistors $T_{BLK}$ in the block decode unit blkd.

The block decoder BLKD decodes a block address during a read operation or write operation. Moreover, one of the plurality of signal supply lines BLKSEL is set to an "H" state and the remaining signal supply lines BLKSEL are set to an "L" state, depending on the block address that has been decoded.

Figure 3:
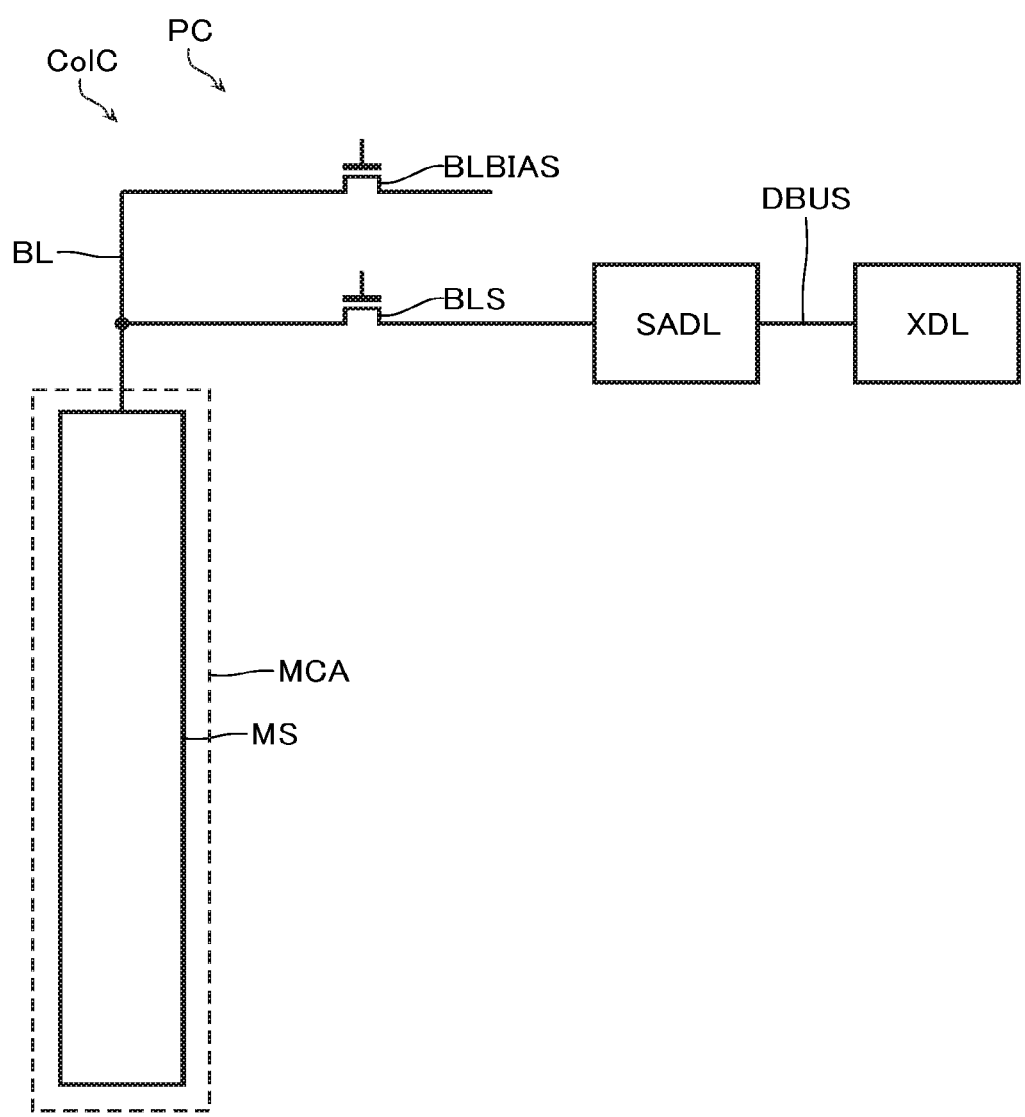
FIG. 3 is a schematic circuit diagram showing a configuration of a part of the peripheral circuit PC.

FIG. 3 is a schematic circuit diagram showing a configuration of a part of the peripheral circuit PC. As shown in FIG. 3, for example, the peripheral circuit PC comprises a column control circuit ColC. The column control circuit ColC comprises: switch transistors BLS, BLBIAS that are connected to the bit line BL; a sense amplifier circuit SADL which is connected to the bit line BL via the switch transistor BLS; and a latch circuit XDL which is connected to the sense amplifier circuit SADL.

The switch transistors BLS, BLBIAS are field effect type NMOS transistors, for example. Drain electrodes of the switch transistors BLS, BLBIAS are connected to the bit line BL. A source electrode of the switch transistor BLS is connected to the sense amplifier circuit SADL. A source electrode of the switch transistor BLBIAS is connected to an unillustrated voltage supply line.

The sense amplifier circuit SADL comprises a sense circuit, a latch circuit, and a voltage transfer circuit. The sense circuit comprises a sense transistor and a data wiring. A gate electrode of the sense transistor is electrically connected to the bit line BL. A drain electrode of the sense transistor is connected to the data wiring. The sense transistor attains an ON state depending on voltage or current of the bit line BL. The data wiring is charged or discharged depending on an ON/OFF state of the sense transistor. The latch circuit latches data of "1" or "0" depending on voltage of the data wiring. The voltage transfer circuit electrically conducts the bit line BL with either of two voltage supply lines, depending on the data latched in the latch circuit.

The latch circuit XDL is electrically connected to the data wiring within the sense amplifier circuit SADL via a wiring DBUS. Data included in the latch circuit XDL is sequentially transferred to the sense amplifier circuit SADL or an unillustrated input/output control circuit.

[Structure of Memory Die MD]

Figure 4:
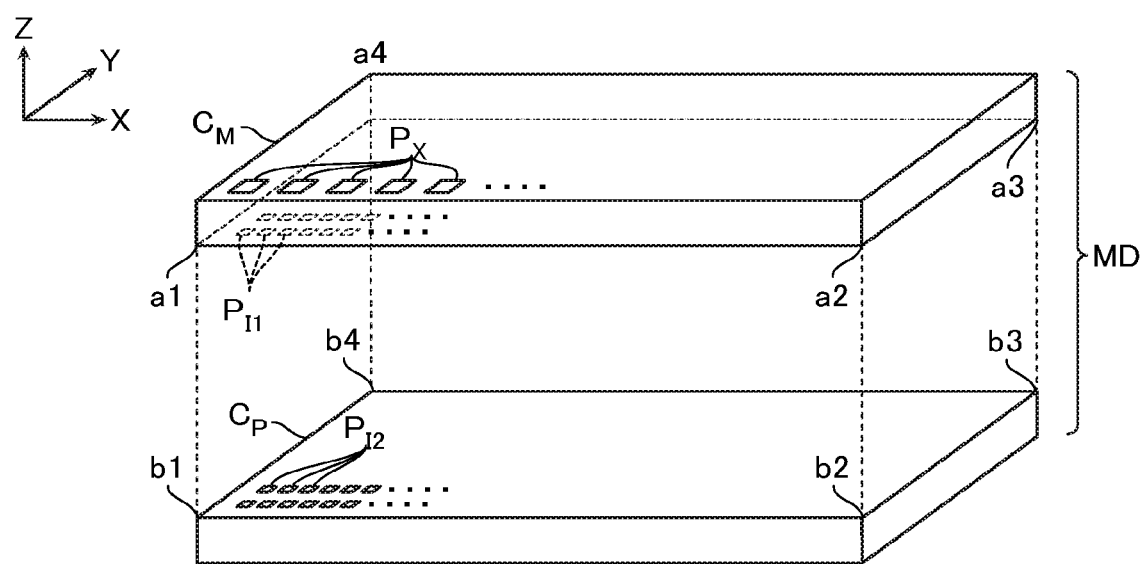
FIG. 4 is a schematic exploded perspective view showing a configuration example of a semiconductor memory device according to the present embodiment.

FIG. 4 is a schematic exploded perspective view showing a configuration example of a semiconductor memory device according to the present embodiment. As shown in FIG. 4, the memory die MD comprises: a chip $C_M$ on a memory cell array MCA side; and a chip $C_P$ on a peripheral circuit PC side.

An upper surface of the chip $C_M$ is provided with a plurality of external pad electrodes $P_X$ connectable to unillustrated bonding wires. Moreover, a lower surface of the chip $C_M$ is provided with a plurality of bonding electrodes $P_{I1}$. Moreover, an upper surface of the chip $C_P$ is provided with a plurality of bonding electrodes $P_{I2}$. Hereafter, a surface provided with the plurality of bonding electrodes $P_{I1}$, of the chip $C_M$ will be referred to as a front surface of the chip $C_M$, and a surface provided with the plurality of external pad electrodes $P_X$, of the chip $C_M$ will be referred to as a back surface of the chip $C_M$. Moreover, a surface provided with the plurality of bonding electrodes $P_{I2}$, of the chip $C_P$ will be referred to as a front surface of the chip $C_P$, and a surface on an opposite side to the front surface, of the chip $C_P$ will be referred to as a back surface of the chip $C_P$. In the example illustrated, the front surface of the chip $C_P$ is provided above the back surface of the chip $C_P$, and the back surface of the chip $C_M$ is provided above the front surface of the chip $C_M$.

The chip $C_M$ and the chip $C_P$ are disposed in such a manner that the front surface of the chip $C_M$ faces the front surface of the chip $C_P$. The plurality of bonding electrodes $P_{I1}$ are respectively provided correspondingly to the plurality of bonding electrodes $P_{I2}$, and are disposed at positions enabling bonding to the plurality of bonding electrodes $P_{I2}$. The bonding electrodes $P_{I1}$ and bonding electrodes $P_{I2}$ function as bonding electrodes for bonding and electrically conducting the chip $C_M$ and chip $C_P$.

Note that in the example of FIG. 4, corners a1, a2, a3, a4 of the chip $C_M$ respectively correspond to corners b1, b2, b3, b4 of the chip $C_P$.

Figure 5:
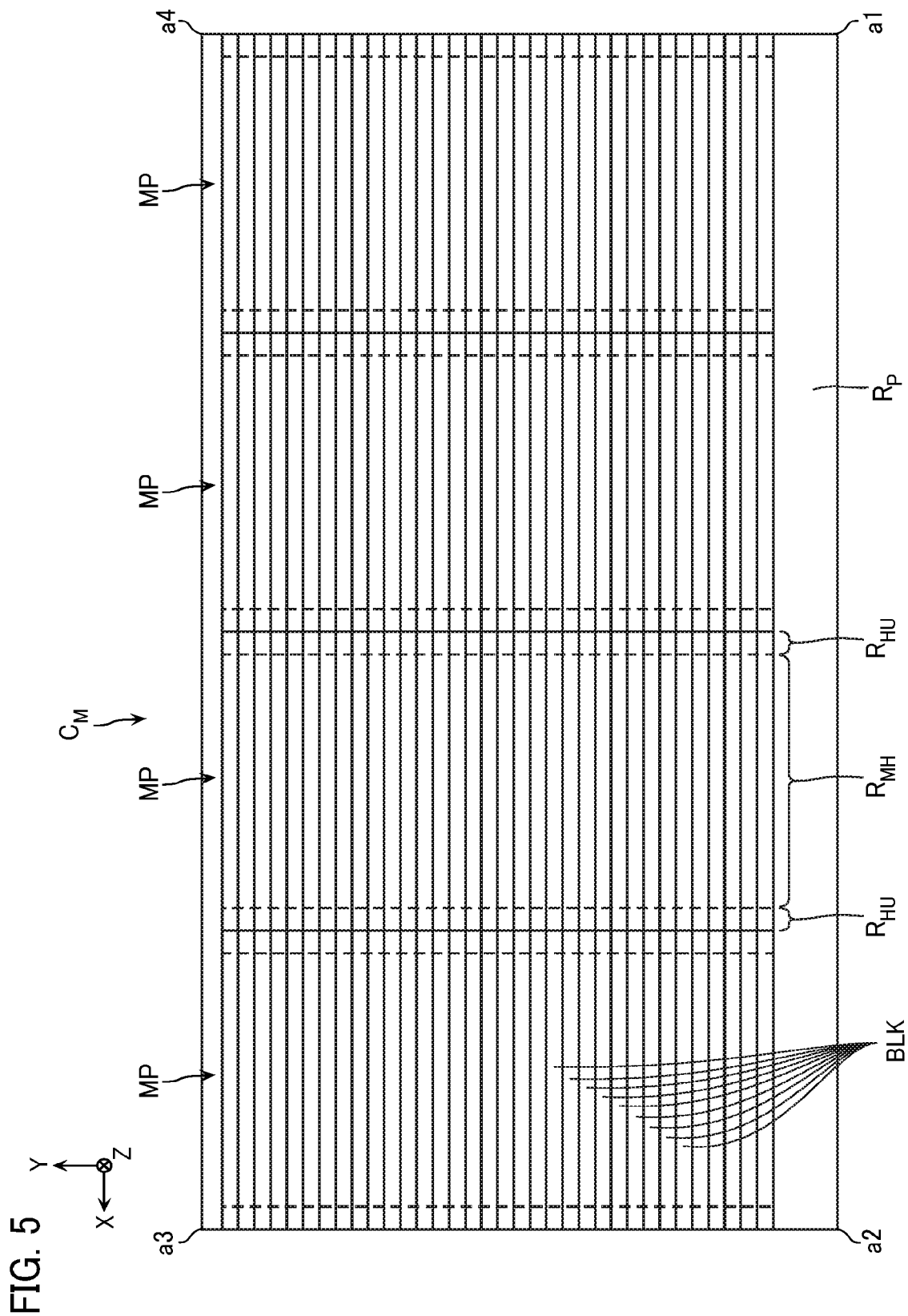
FIG. 5 is a schematic bottom view showing a configuration example of a chip $C_M$.
Figure 6:
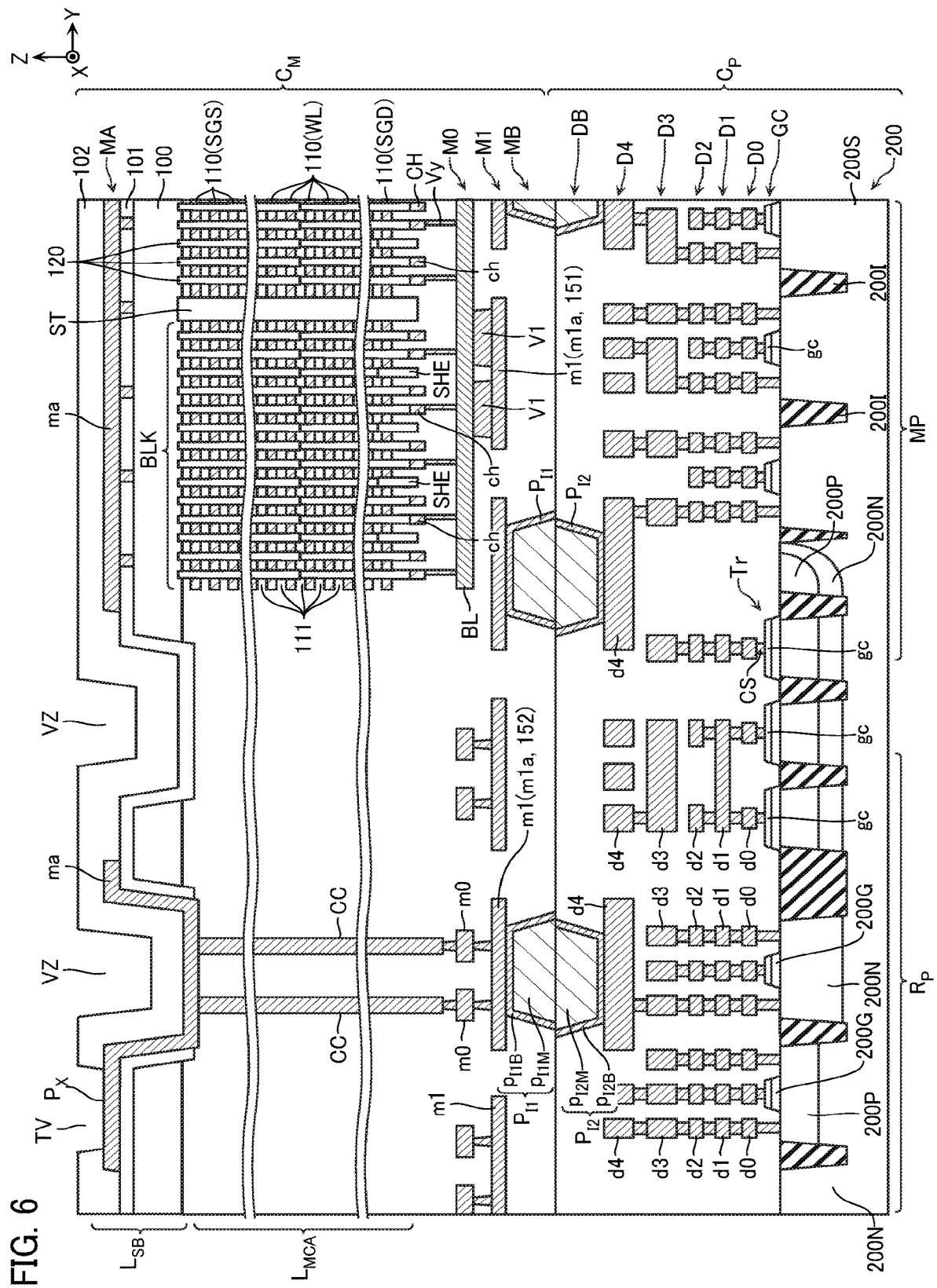
FIG. 6 is a schematic cross-sectional view showing a configuration of a part of the memory die MD.
Figure 7:
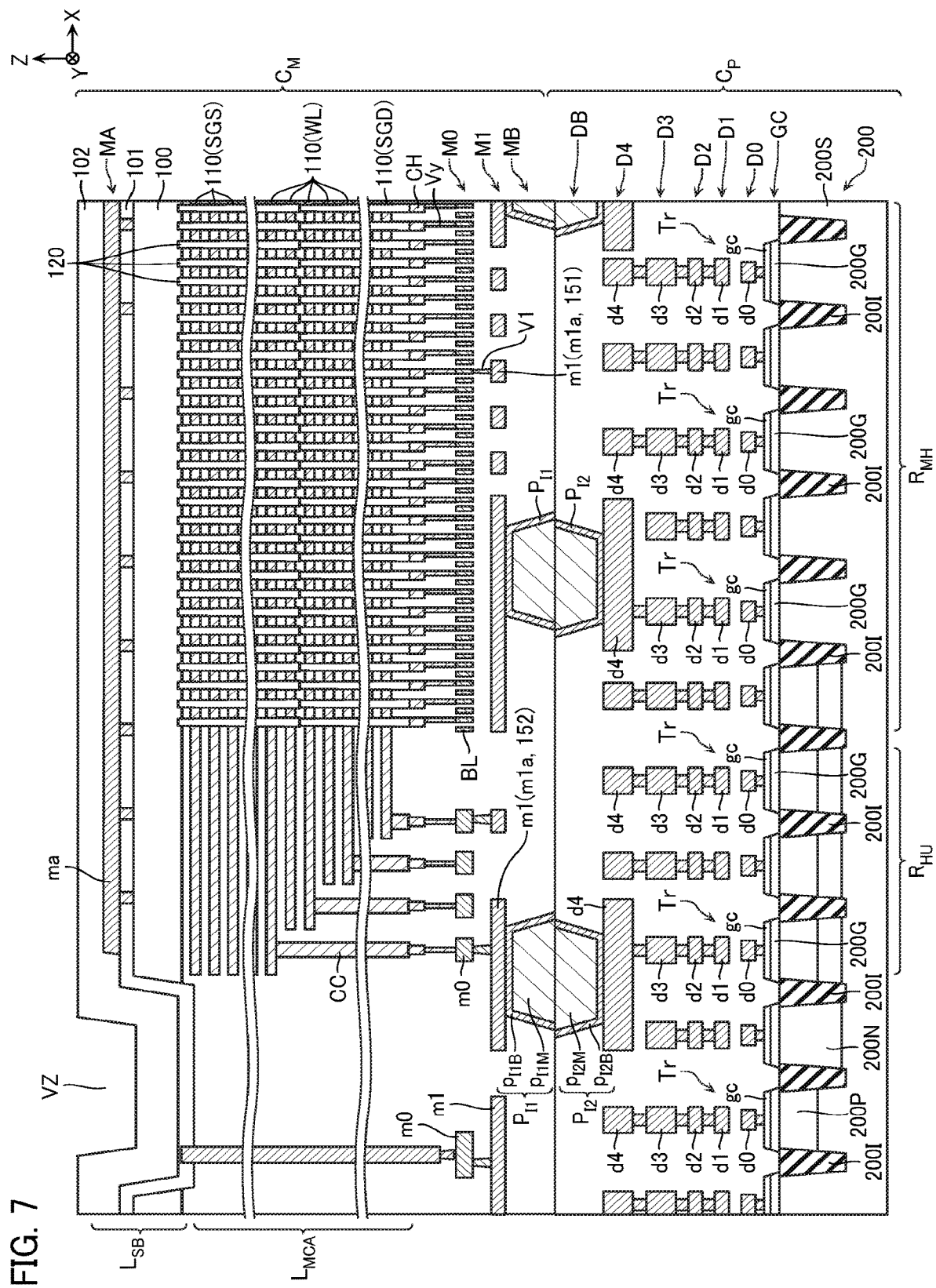
FIG. 7 is a schematic cross-sectional view showing a configuration of a part of the memory die MD.
Figure 8:
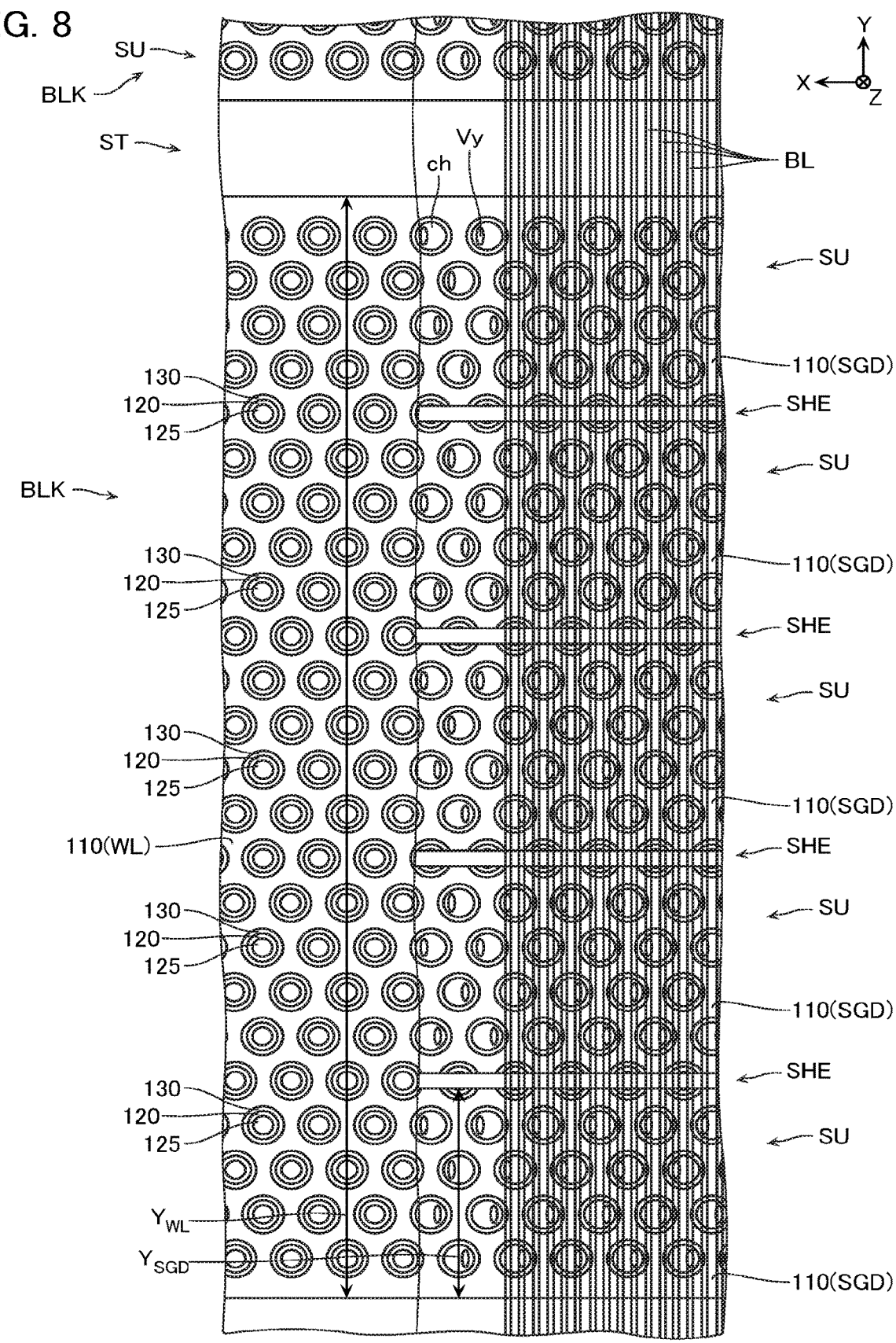
FIG. 8 is a schematic bottom view showing a configuration of a part of the chip $C_M$.
Figure 9:
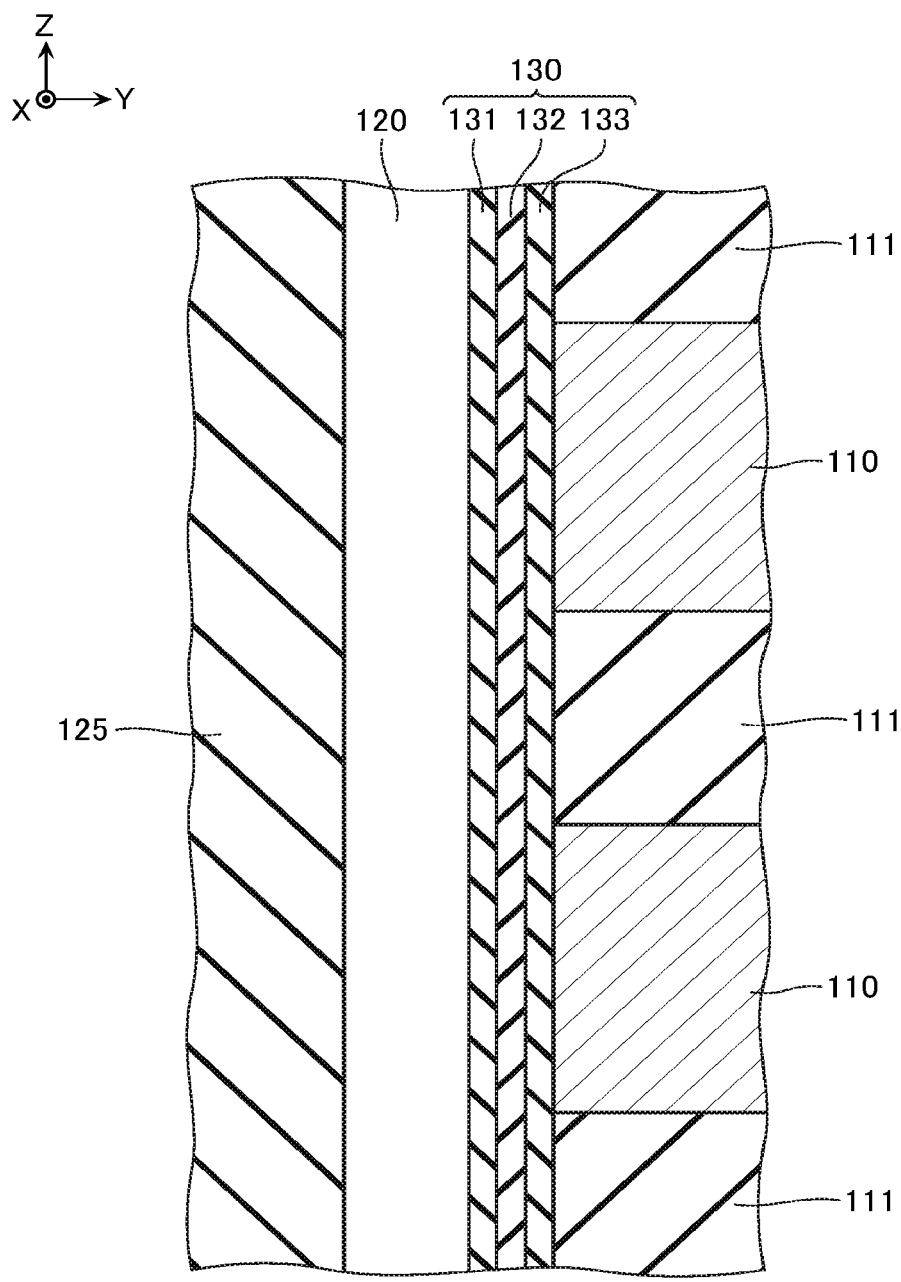
FIG. 9 is a schematic cross-sectional view showing a configuration of a part of the chip $C_M$.
Figure 10:
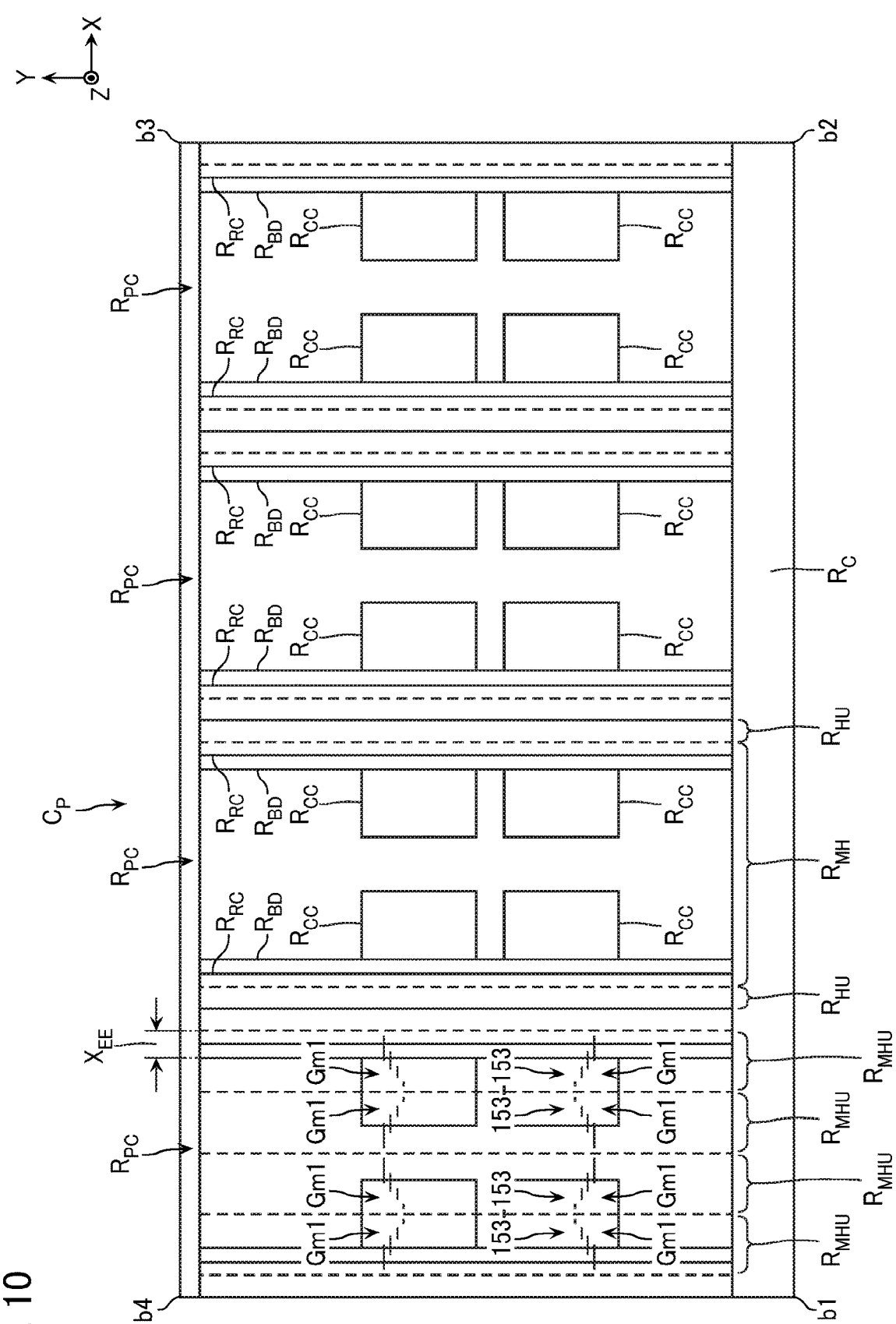
FIG. 10 is a schematic plan view showing a configuration example of a chip $C_P$.
Figure 11:
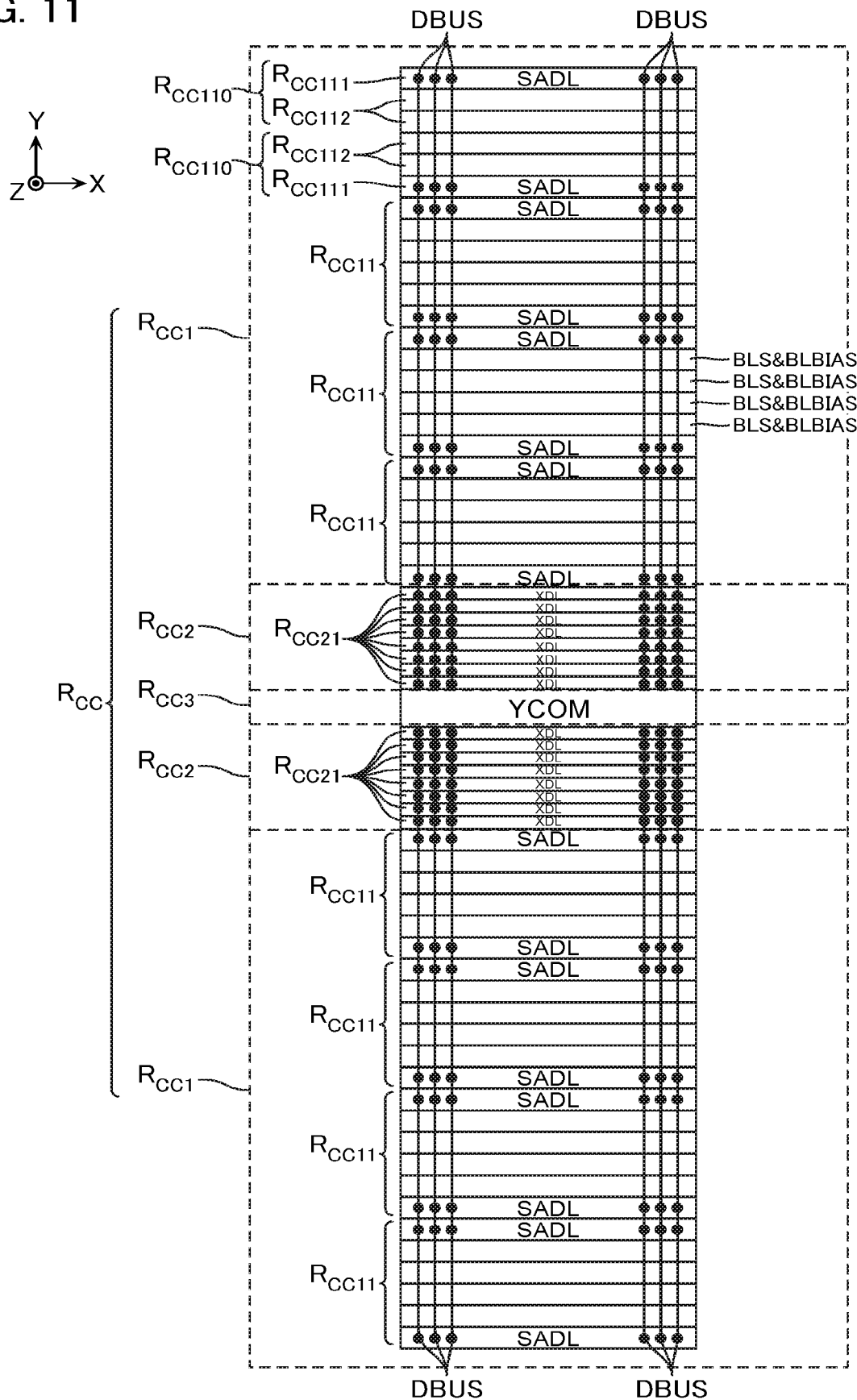
FIG. 11 is a schematic plan view showing an enlarged part of FIG. 10.
Figure 12:
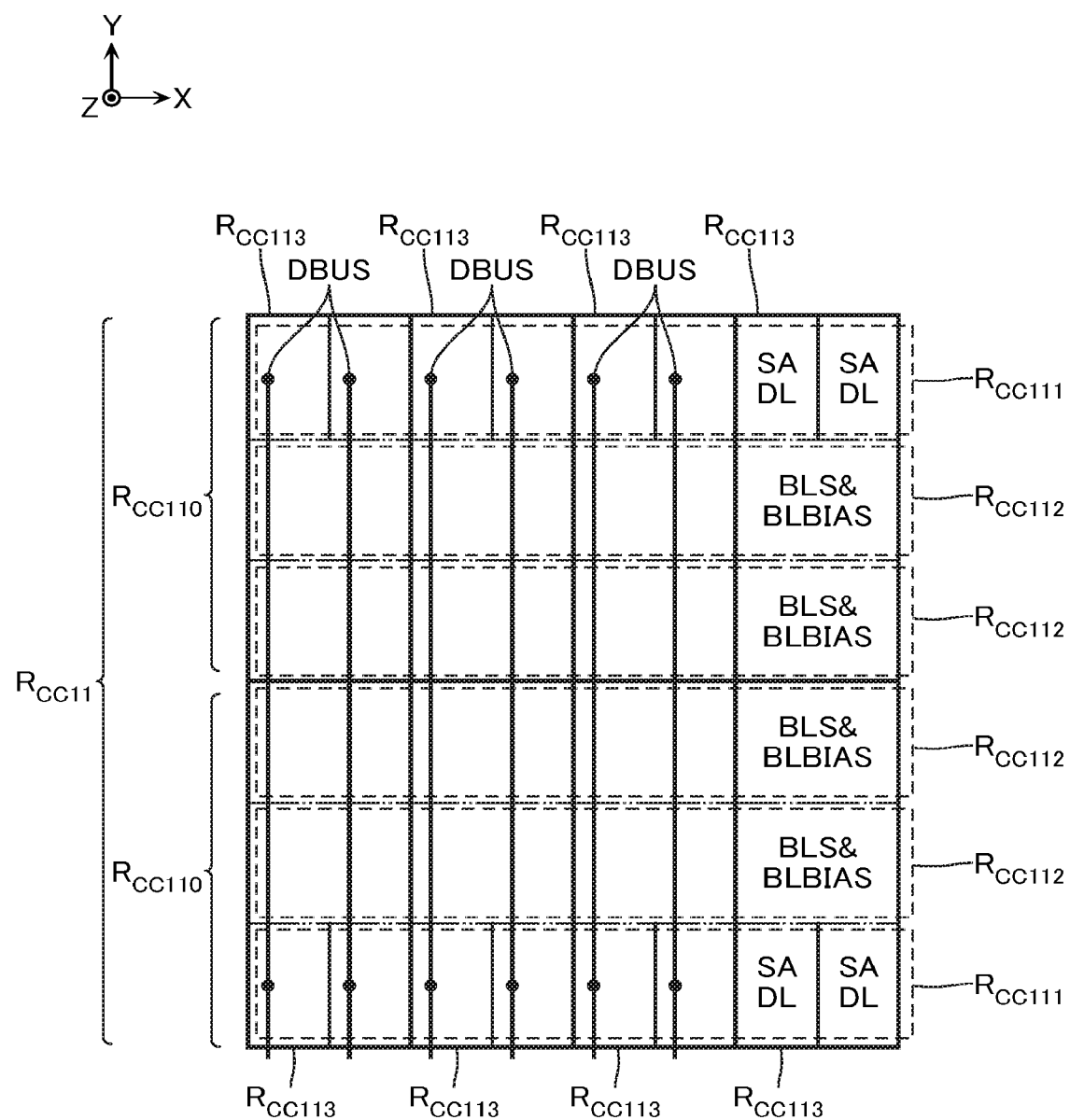
FIG. 12 is a schematic plan view showing an enlarged part of FIG. 11.
Figure 13:
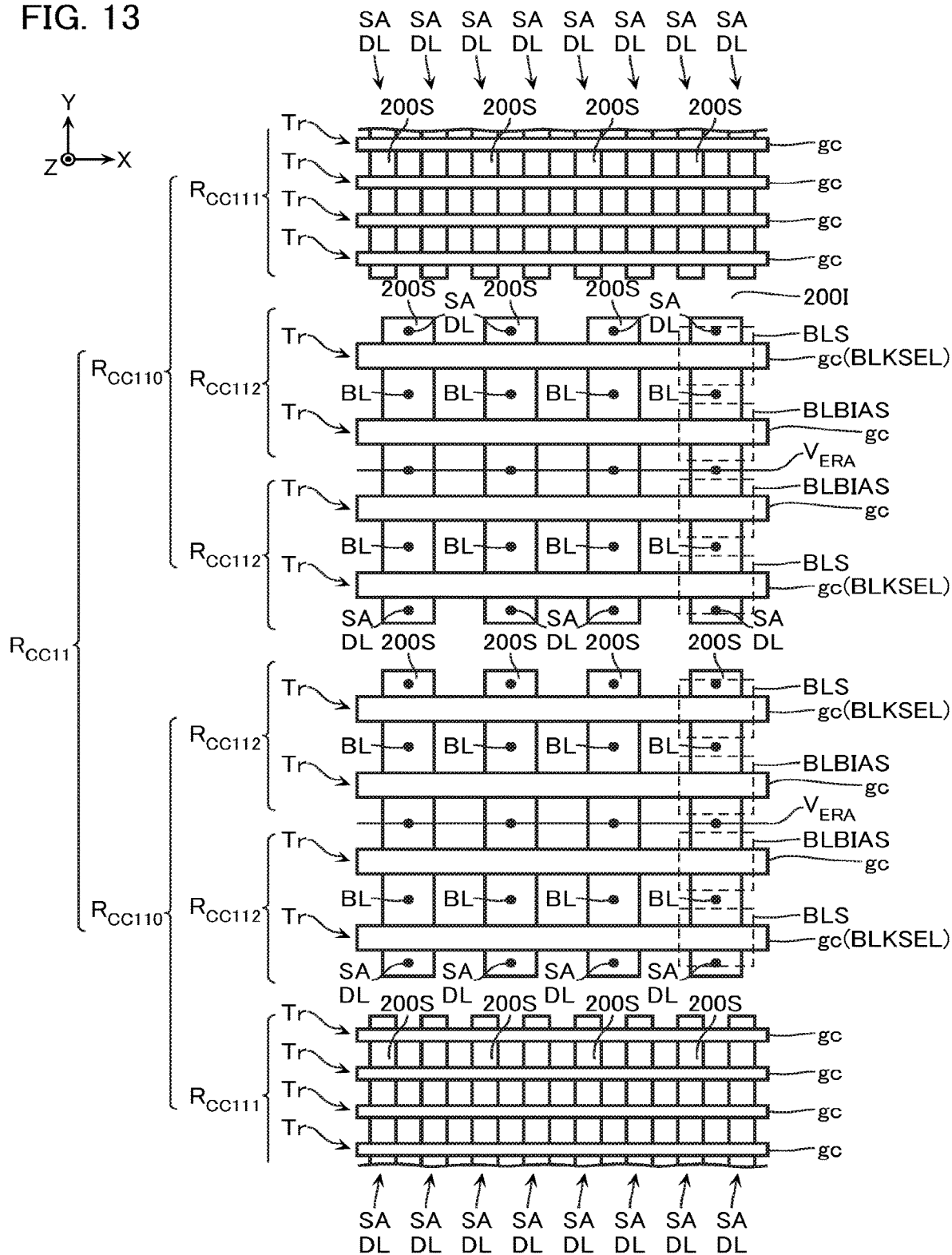
FIG. 13 is a schematic plan view showing an enlarged part of FIG. 11.

FIG. 5 is a schematic bottom view showing a configuration example of the chip $C_M$. In FIG. 5, some of configurations such as the bonding electrodes $P_{I1}$ are omitted. FIGS. 6 and 7 are schematic cross-sectional views showing a configuration of a part of the memory die MD. FIG. 8 is a schematic bottom view showing a configuration of a part of the chip $C_M$. FIG. 9 is a schematic cross-sectional view showing a configuration of a part of the chip $C_M$. Although FIG. 9 shows a YZ cross section, a similar structure to in FIG. 9 will be observed, even in the case where a cross section other than a YZ cross section (for example, an XZ cross section) along a central axis of a semiconductor layer 120 has been observed. FIG. 10 is a schematic plan view showing a configuration example of the chip $C_P$. In FIG. 10, some of configurations such as the bonding electrodes $P_{I2}$ are omitted. FIG. 11 is a schematic plan view showing an enlarged part of FIG. 10. FIGS. 12 and 13 are schematic plan views showing enlarged parts of FIG. 11.

[Structure of Chip $C_M$]

In the example of FIG. 5, the chip $C_M$ comprises four memory planes MP arranged in the X direction. Moreover, these fours memory planes MP each comprise a plurality of the memory blocks BLK arranged in the Y direction. Moreover, in the example of FIG. 5, the plurality of memory blocks BLK each comprise: hookup regions $R_{HU}$ provided in both end portions in the X direction; and a memory hole region $R_{MH}$ provided between these hookup regions $R_{HU}$. Moreover, the chip $C_M$ comprises a peripheral region $R_P$ provided further to a side at one end in the Y direction of the chip $C_M$ than the four memory planes MP.

Note that in the example illustrated, the hookup region $R_{HU}$ is provided in both end portions in the X direction of the memory plane MP. However, such a configuration is merely an exemplification, and a specific configuration may be appropriately adjusted. For example, the hookup region $R_{HU}$ may be provided in one end portion in the X direction of the memory plane MP, rather than in both end portions in the X direction of the memory plane MP. Moreover, the hookup region $R_{HU}$ may be provided at a center position or near center position in the X direction of the memory plane MP.

As shown in FIG. 6, for example, the chip $C_M$ comprises: a substrate layer $L_{SB}$; a memory cell array layer $L_{MCA}$ provided below the substrate layer $L_{SB}$; a via contact electrode layer CH provided below the memory cell array layer $L_{MCA}$; a plurality of wiring layers M0, M1 provided below the via contact electrode layer CH; and a chip bonding electrode layer MB provided below the wiring layers M0, M1.

[Structure of Substrate Layer $L_{SB}$ of Chip $C_M$]

As shown in FIG. 6, for example, the substrate layer $L_{SB}$ comprises: a conductive layer 100 provided on an upper surface of the memory cell array layer $L_{MCA}$; an insulating layer 101 provided on an upper surface of the conductive layer 100; a back surface wiring layer MA provided on an upper surface of the insulating layer 101; and an insulating layer 102 provided on an upper surface of the back surface wiring layer MA.

The conductive layer 100 may include a semiconductor layer of the likes of silicon (Si) implanted with an N type impurity such as phosphorus (P) or P type impurity such as boron (B), may include a metal of the likes of tungsten (W), or may include a silicide of the likes of tungsten silicide (WSi), for example.

The conductive layer 100 functions as a part of the source line SL (FIG. 1). Four conductive layers 100 are provided correspondingly to the four memory planes MP (FIG. 5). End portions in the X direction and Y direction of the memory plane MP are provided with a region VZ that does not include the conductive layer 100.

The insulating layer 101 includes the likes of silicon oxide ($SiO_2$), for example.

The back surface wiring layer MA includes a plurality of wirings ma. These plurality of wirings ma may include the likes of aluminum (Al), for example.

Some of the plurality of wirings ma function as a part of the source line SL (FIG. 1). Four of these wirings ma are provided correspondingly to the four memory planes MP (FIG. 5). These wirings ma are respectively electrically connected to the conductive layers 100.

Moreover, some of the plurality of wirings ma function as the external pad electrode $P_X$. This wiring ma is provided in the peripheral region $R_P$. This wiring ma is connected to a via contact electrode CC within the memory cell array layer $L_{MCA}$ in the region VZ not including the conductive layer 100. Moreover, part of the wiring ma is exposed to outside of the memory die MD via an opening TV provided in the insulating layer 102.

The insulating layer 102 is a passivation layer consisting of an insulating material such as a polyimide, for example.

[Structure in Memory Hole Region $R_{MH}$ of Memory Cell Array Layer $L_{MCA}$ of Chip $C_M$]

As described with reference to FIG. 5, the memory cell array layer $L_{MCA}$ is provided with a plurality of the memory blocks BLK arranged in the Y direction. As shown in FIG. 6, an inter-block insulating layer ST of the likes of silicon oxide ($SiO_2$) is provided between two memory blocks BLK adjacent in the Y direction.

As shown in FIG. 6, for example, the memory block BLK comprises: a plurality of conductive layers 110 arranged in the Z direction; and a plurality of the semiconductor layers 120 extending in the Z direction. Moreover, as shown in FIG. 9, a gate insulating film 130 is provided between each of the plurality of conductive layers 110 and plurality of semiconductor layers 120.

The conductive layer 110 comprises a substantially plate-like shape extending in the X direction. The conductive layer 110 may include a stacked film of a barrier conductive film of the likes of titanium nitride (TiN) and metal film of the likes of tungsten (W) or molybdenum (Mo), and so on. Moreover, the conductive layer 110 may include the likes of polycrystalline silicon including an impurity such as phosphorus (P) or boron (B), for example. An inter-layer insulating layer 111 of the likes of silicon oxide ($SiO_2$) is provided between the plurality of conductive layers 110 arranged in the Z direction.

One or plurality of conductive layers 110 positioned in the uppermost layer, of the plurality of conductive layers 110 function as the gate electrodes of the source side select transistors STS (FIG. 1) and as the source side select gate line SGS (refer to FIG. 6). These plurality of conductive layers 110 are electrically independent every memory block BLK.

Moreover, a plurality of conductive layers 110 positioned below these uppermost layer-positioned conductive layers 110 function as the gate electrodes of the memory cells MC (FIG. 1) and as the word lines WL. These plurality of conductive layers 110 are each electrically independent every memory block BLK.

Moreover, one or plurality of conductive layers 110 positioned below these word line WL-functioning conductive layers 110, function as the gate electrodes of the drain side select transistors STD and as the drain side select gate line SGD. As shown in FIG. 8, for example, a width $Y_{SGD}$ in the Y direction of these plurality of conductive layers 110 is smaller than a width $Y_{WL}$ in the Y direction of the conductive layers 110 functioning as the word lines WL. Moreover, an insulating layer SHE of the likes of silicon oxide ($SiO_2$) is provided between two conductive layers 110 adjacent in the Y direction.

As shown in FIG. 8, for example, the semiconductor layers 120 are arranged in a certain pattern in the X direction and the Y direction. The semiconductor layers 120 respectively function as channel regions of the plurality of memory cells MC and select transistors (STD, STS) included in one memory string MS (FIG. 1). The semiconductor layer 120 includes the likes of polycrystalline silicon (Si), for example. The semiconductor layer 120 has a substantially cylindrical shape, and has its central portion provided with an insulating layer 125 of the likes of silicon oxide. An outer peripheral surface of the semiconductor layer 120 is surrounded by each of a plurality of the conductive layers 110, and faces these plurality of conductive layers 110.

Moreover, an upper end of the semiconductor layer 120 is provided with an unillustrated impurity region. This impurity region is connected to the above-described conductive layer 100 (refer to FIG. 6). This impurity region includes an N type impurity such as phosphorus (P) or P type impurity such as boron (B), for example.

Moreover, a lower end of the semiconductor layer 120 is provided with an unillustrated impurity region. This impurity region is connected to the bit line BL via a via contact electrode ch and a via contact electrode Vy. This impurity region includes an N type impurity such as phosphorus (P), for example.

As shown in FIG. 8, for example, the gate insulating film 130 has a substantially cylindrical shape covering the outer peripheral surface of the semiconductor layer 120. As shown in FIG. 9, for example, the gate insulating film 130 comprises a tunnel insulating film 131, a charge accumulating film 132, and a block insulating film 133 that are stacked between the semiconductor layer 120 and the conductive layers 110. The tunnel insulating film 131 and the block insulating film 133 include the likes of silicon oxide ($SiO_2$) or silicon oxynitride (SiON), for example. The charge accumulating film 132 includes a film capable of accumulating a charge, of the likes of silicon nitride (SiN), for example. The tunnel insulating film 131, the charge accumulating film 132, and the block insulating film 133 have substantially cylindrical shapes, and extend in the Z direction along the outer peripheral surface of the semiconductor layer 120 excluding a contact portion of the semiconductor layer 120 and the conductive layer 100.

Note that FIG. 9 showed an example where the gate insulating film 130 comprises the charge accumulating film 132 of the likes of silicon nitride. However, the gate insulating film 130 may comprise a floating gate of the likes of polycrystalline silicon including an N type or P type impurity, for example.

[Structure in Hookup Region $R_{HU}$ of Memory Cell Array Layer $L_{MCA}$ of Chip $C_M$]

As shown in FIG. 7, the hookup region $R_{HU}$ is provided with a plurality of the via contact electrodes CC. These plurality of via contact electrodes CC each extend in the Z direction and have their upper end connected to the conductive layer 110.

[Structure in Peripheral Region $R_P$ of Memory Cell Array Layer $L_{MCA}$ of Chip $C_M$]

As shown in FIG. 6, for example, a plurality of the via contact electrodes CC are provided in the peripheral region $R_P$, correspondingly to the external pad electrodes $P_X$. These plurality of via contact electrodes CC have their upper end connected to the external pad electrode $P_X$.

[Structure of Via Contact Electrode Layer CH]

The plurality of via contact electrodes ch included in the via contact electrode layer CH are electrically connected to at least one from among configurations in the memory cell array layer $L_{MCA}$ and configurations in the chip $C_P$, for example.

The via contact electrode layer CH includes the plurality of via contact electrodes ch as a plurality of wirings. These plurality of via contact electrodes ch may include for example a stacked film of a barrier conductive film of the likes of titanium nitride (TiN) and metal film of the likes of tungsten (W), and so on. The via contact electrodes ch are provided correspondingly to the plurality of semiconductor layers 120, and are connected to the lower ends of the plurality of semiconductor layers 120.

[Structure of Wiring Layers M0, M1 of Chip CM]

The plurality of wirings included in the wiring layers M0, M1 are electrically connected to at least one from among configurations in the memory cell array layer $L_{MCA}$ and configurations in the chip $C_P$, for example.

The wiring layer M0 includes a plurality of wirings m0. These plurality of wirings m0 may include for example a stacked film of a barrier conductive film of the likes of titanium nitride (TiN) and metal film of the likes of copper (Cu), and so on. Note that some of the plurality of wirings m0 function as the bit lines BL. As shown in FIG. 8, for example, the bit lines BL are arranged in the X direction and extend in the Y direction.

As shown in FIG. 6, for example, the wiring layer M1 includes a plurality of wirings m1. These plurality of wirings m1 may include for example a stacked film of a barrier conductive film of the likes of titanium nitride (TiN) and metal film of the likes of tungsten (W), and so on. Note that a wiring pattern in the wiring layer M1 will be mentioned later.

[Structure of Chip Bonding Electrode Layer MB]

The plurality of wirings included in the chip bonding electrode layer MB are electrically connected to at least one from among configurations in the memory cell array layer $L_{MCA}$ and configurations in the chip $C_P$, for example.

The chip bonding electrode layer MB includes a plurality of the bonding electrodes $P_{I1}$. These plurality of bonding electrodes $P_{I1}$ may include for example a stacked film of a barrier conductive film $p_{I1B}$ of the likes of titanium nitride (TiN) and metal film $p_{I1M}$ of the likes of copper (Cu), and so on.

[Structure of Chip $C_P$]

As shown in FIG. 10, for example, the chip $C_P$ comprises four peripheral circuit regions $R_{PC}$ arranged in the X direction correspondingly to the memory planes MP. Both end portions in the X direction, of these four peripheral circuit regions $R_{PC}$ are each provided with a row control circuit region $R_{RC}$. Moreover, between these two row control circuit regions $R_{RC}$, there are provided two block decoder regions $R_{BD}$ arranged in the X direction. Moreover, between these two block decoder regions $R_{BD}$, there are provided four column control circuit regions $R_{CC}$ arranged in the X direction and the Y direction. Moreover, other regions in the peripheral circuit region $R_{PC}$ also have circuits disposed therein, although illustration of this is omitted. Moreover, a region facing the peripheral region $R_P$, of the chip $C_P$ is provided with a circuit region $R_C$.

The row control circuit region $R_{RC}$ is provided with a plurality of the block decode units blkd described with reference to FIG. 2. The block decoder region $R_{BD}$ is provided with the block decoder BLKD described with reference to FIG. 2. The column control circuit region $R_{CC}$ is provided with the column control circuit ColC described with reference to FIG. 3. The circuit region $R_C$ is provided with an unillustrated input/output circuit. This input/output circuit is connected to the external pad electrode $P_X$ via the via contact electrode CC, and so on, described with reference to FIG. 6.

Moreover, in FIG. 10, a region overlapping the hookup region $R_{HU}$ (FIG. 5) viewed from the Z direction is shown by a dotted line. Moreover, in the example of FIG. 10, the memory hole region $R_{MH}$ is divided into four regions $R_{MHU}$ in the X direction. Widths in the X direction of these four regions $R_{MHU}$ may be all the same, but need not be all the same. For example, widths in the X direction of the $1^{st}$ and $4^{th}$ of the regions $R_{MHU}$ counting from a negative side in the X direction may be larger than widths in the X direction of the other regions $R_{MHU}$.

In the example of FIG. 10, a part of the row control circuit region $R_{RC}$ is provided in a region overlapping the hookup region $R_{HU}$ (FIG. 5) viewed from the Z direction. Moreover, a part of the row control circuit region $R_{RC}$ is provided in a region overlapping the memory hole region $R_{MH}$(FIG. 5) viewed from the Z direction. Moreover, in the example of FIG. 10, a width in the X direction of the row control circuit region $R_{RC}$ is larger than a width in the X direction of the hookup region $R_{HU}$ (FIG. 5).

Moreover, in the example of FIG. 10, a center position in the X direction of the column control circuit region $R_{CC}$ coincides with a boundary of the $1^{st}$ and $2^{nd}$ of the regions $R_{MHU}$ counting from a negative side in the X direction or boundary of the $3^{rd}$ and $4^{th}$ of the regions $R_{MHU}$ counting from a negative side in the X direction. Note that the center position in the X direction of the column control circuit region $R_{CC}$ need not coincide with the boundary of the $1^{st}$ and $2^{nd}$ of the regions $R_{MHU}$ counting from a negative side in the X direction or boundary of the $3^{rd}$ and $4^{th}$ of the regions $R_{MHU}$ counting from a negative side in the X direction.

As shown in FIG. 11, the column control circuit region $R_{CC}$ comprises: two regions $R_{CC1}$ arranged in the Y direction; two regions $R_{CC2}$ provided between these two regions $R_{CC1}$ and arranged in the Y direction; and a region $R_{CC3}$ provided between these two regions $R_{CC2}$.

The region $R_{CC1}$ comprises four regions $R_{CC11}$ arranged in the Y direction. These four regions $R_{CC11}$ each comprise: two regions $R_{CC111}$ arranged in the Y direction; and four regions $R_{CC112}$ provided between these two regions $R_{CC111}$ and arranged in the Y direction. The region $R_{CC111}$ is provided with a plurality of the sense amplifier circuits SADL described with reference to FIG. 3. The region $R_{CC112}$ is provided with pluralities of the switch transistors BLS, BLBIAS described with reference to FIG. 3. Note that in the description below, a region including one region $R_{CC111}$ and the two regions $R_{CC112}$ corresponding to this one region $R_{CC111}$ will sometimes be referred to as a region $R_{CC110}$.

As shown in FIG. 12, the region $R_{CC110}$ comprises a plurality of (in the example illustrated, four) regions $R_{CC113}$ arranged in the X direction. These plurality of regions $R_{CC113}$ each include a part of the region $R_{CC1}$ and parts of the regions $R_{CC112}$. A portion corresponding to the region $R_{CC111}$, in the region $R_{CC113}$ is provided with two of the sense amplifier circuits SADL (FIG. 3) arranged in the X direction. A portion corresponding to the region $R_{CC112}$, in the region $R_{CC113}$ is provided with a pair of the switch transistors BLS (FIG. 3), BLBIAS (FIG. 3).

Note that FIG. 13 exemplifies a plurality of transistors Tr provided in the region $R_{CC110}$.

For example, the region $R_{CC111}$ is provided with a plurality of the transistors Tr configuring the sense amplifier circuit SADL. That is, FIG. 13 exemplifies: a plurality of semiconductor substrate regions 200S arranged in the X direction and extending in the Y direction; and a plurality of electrodes gc arranged in the Y direction and extending in the X direction. Intersecting portions of these plurality of semiconductor substrate regions 200S and plurality of electrodes gc are each provided with the transistor Tr configuring the sense amplifier circuit SADL. A plurality of the transistors Tr configuring one sense amplifier circuit SADL are arranged in the Y direction.

Moreover, two regions $R_{CC112}$ arranged in the Y direction are provided with a plurality of the transistors Tr configuring the switch transistors BLS, BLBIAS. That is, FIG. 13 exemplifies: a plurality of the semiconductor substrate regions 200S arranged in the X direction and extending in the Y direction; and a plurality of the electrodes gc arranged in the Y direction and extending in the X direction. Intersecting portions of these plurality of semiconductor substrate regions 200S and plurality of electrodes gc are each provided with the transistor Tr configuring the switch transistors BLS, BLBIAS. In the example illustrated, two of the switch transistors BLS are arranged in the Y direction, and between these two switch transistors BLS, there are provided two of the switch transistors BLBIAS arranged in the Y direction.

A source region of the switch transistor BLS is provided with a via contact electrode electrically connected to the sense amplifier circuit SADL. Source regions of two of the switch transistors BLBIAS arranged in the Y direction are provided in a common region in the semiconductor substrate region 200S. This region is provided with a via contact electrode electrically connected to a voltage supply line supplied with an erase voltage $V_{ERA}$ during an erase operation. Drain regions of the two switch transistors BLS, BLBIAS arranged in the Y direction are provided in a common region in the semiconductor substrate region 200S. This region is provided with a via contact electrode electrically connected to the bit line BL.

As shown in FIG. 11, the region $R_{CC2}$ comprises eight regions $R_{CC21}$ arranged in the Y direction. These eight regions $R_{CC21}$ are each provided with a plurality of the latch circuits XDL (FIG. 3) arranged in the X direction. The number of latch circuits XDL arranged in the X direction in one region $R_{CC21}$ is the same as the number of sense amplifier circuits SADL arranged in the X direction in one region $R_{CC111}$. For example, when one region $R_{CC111}$ is provided with eight sense amplifier circuits SADL arranged in the X direction, one region $R_{CC21}$ is provided with eight latch circuits XDL arranged in the X direction, as exemplified in FIG. 12.

Moreover, in the present embodiment, as shown in FIG. 12, a plurality of the wirings DBUS are provided correspondingly to a plurality of the sense amplifier circuits SADL arranged in the X direction. As shown in FIG. 11, these plurality of wirings DBUS each extend in the Y direction and are commonly connected to eight of the sense amplifier circuits SADL arranged in the Y direction and eight of the latch circuits XDL arranged in the Y direction. Note that FIG. 11 exemplifies merely some of the plurality of wirings DBUS.

As shown in FIG. 11, the region $R_{CC3}$ is provided with a circuit YCOM that controls the likes of the sense amplifier circuit SADL and latch circuit XDL described with reference to FIG. 3.

Moreover, as shown in FIG. 6, for example, the chip $C_P$ comprises: a semiconductor substrate 200; an electrode layer GC provided above the semiconductor substrate 200; wiring layers D0, D1, D2, D3, D4 provided above the electrode layer GC; and a chip bonding electrode layer DB provided above the wiring layers D0, D1, D2, D3, D4.

[Structure of Semiconductor Substrate 200 of Chip $C_P$]

The semiconductor substrate 200 includes P type silicon (Si) that includes a P type impurity such as boron (B), for example. A surface of the semiconductor substrate 200 is provided with, for example: an N type well region 200N including an N type impurity such as phosphorus (P); a P type well region 200P including a P type impurity such as boron (B); the semiconductor substrate region 200S not provided with the N type well region 200N and P type well region 200P; and an insulating region 200I. Some of the P type well regions 200P are provided in the semiconductor substrate region 200S, and some of the P type well regions 200P are provided in the N type well region 200N. The N type well region 200N, the P type well regions 200P provided in the N type well region 200N and semiconductor substrate region 200S, and the semiconductor substrate region 200S respectively function as parts of the plurality of transistors Tr, a plurality of capacitors, and so on, configuring the peripheral circuit PC.

[Structure of Electrode Layer GC of Chip $C_P$]

The electrode layer GC is provided on the upper surface of the semiconductor substrate 200 via an insulating layer 200G. The electrode layer GC includes a plurality of the electrodes gc that face the surface of the semiconductor substrate 200. Moreover, each of the regions of the semiconductor substrate 200 and the plurality of electrodes gc included in the electrode layer GC are respectively connected to via contact electrodes CS.

The N type well region 200N, the P type well regions 200P provided in the N type well region 200N and semiconductor substrate region 200S, and the semiconductor substrate region 200S, of the semiconductor substrate 200 respectively function as channel regions of the plurality of transistors Tr, one of electrodes of the plurality of capacitors, and so on, configuring the peripheral circuit PC.

The plurality of electrodes gc included in the electrode layer GC respectively function as gate electrodes of the plurality of transistors Tr, the other of the electrodes of the plurality of capacitors, and so on, configuring the peripheral circuit PC.

The via contact electrode CS extends in the Z direction, and has its lower end connected to an upper surface of the semiconductor substrate 200 or electrode gc. A connecting portion of the via contact electrode CS and semiconductor substrate 200 is provided with an impurity region including an N type impurity or P type impurity. The via contact electrode CS may include for example a stacked film of a barrier conductive film of the likes of titanium nitride (TiN) and metal film of the likes of tungsten (W), and so on.

[Structure of Wiring Layers D0, D1, D2, D3, D4 of Chip $C_P$]

As shown in FIG. 6, for example, a plurality of wirings included in the wiring layers D0, D1, D2, D3, D4 are electrically connected to at least one from among configurations in the memory cell array layer $L_{MCA}$ and configurations in the chip $C_P$, for example.

The wiring layers D0, D1, D2 respectively include pluralities of wirings d0, d1, d2. These pluralities of wirings d0, d1, d2 may include for example a stacked film of a barrier conductive film of the likes of titanium nitride (TiN) and metal film of the likes of tungsten (W), and so on.

The wiring layers D3, D4 respectively include pluralities of wirings d3, d4. These pluralities of wirings d3, d4 may include for example a stacked film of a barrier conductive film of the likes of titanium nitride (TiN), tantalum nitride (TaN), or stacked film of tantalum nitride (TaN) and tantalum (Ta), and a metal film of the likes of copper (Cu), and so on.

[Structure of Chip Bonding Electrode Layer DB]

A plurality of wirings included in the chip bonding electrode layer DB are electrically connected to at least one from among configurations in the memory cell array layer $L_{MCA}$ and configurations in the chip $C_P$, for example.

The chip bonding electrode layer DB includes a plurality of the bonding electrodes $P_{I2}$. These plurality of bonding electrodes $P_{I2}$ may include for example a stacked film of a barrier conductive film $P_{I2B}$ of the likes of titanium nitride (TiN), tantalum nitride (TaN), or stacked film of tantalum nitride (TaN) and tantalum (Ta), and a metal film $p_{I2M}$ of the likes of copper (Cu), and so on.

Note that when the metal films $p_{I1M}$, $p_{I2M}$ of the likes of copper (Cu) are employed in the bonding electrode $P_1$ and bonding electrode $P_{I2}$, the metal film $p_{I1M}$ and the metal film $p_{I2M}$ become one metal film, and identification of their boundary with each other becomes difficult. However, due to distortion of shape where the bonding electrode $P_1$ and bonding electrode $P_{I2}$ have been bonded resulting from positional shift of bonding, and due to positional shift (generation of discontinuous places in side surfaces) of the barrier conductive films $p_{I1B}$, $P_{I2B}$, bonding structure can be identified. Moreover, when the bonding electrode $P_{I1}$ and bonding electrode $P_{I2}$ are formed by a damascene method, their respective side surfaces have a tapered shape. Therefore, a cross section along the Z direction in a portion where the bonding electrode $P_{I1}$ and bonding electrode $P_{I2}$ have been bonded has a non-rectangular shape due to side walls being non-linearly shaped. Moreover, when the bonding electrode $P_{I1}$ and bonding electrode $P_{I2}$ are bonded, a structure where a barrier metal covers each of a bottom surface, side surface, and upper surface of the Cu forming the bonding electrode $P_{I1}$ and bonding electrode $P_{I2}$ is formed. In contrast, in a general wiring layer employing Cu, the upper surface of the Cu is provided with an insulating layer (of the likes of SiN or SiCN) functioning to prevent oxidation of the Cu, and is not provided with a barrier metal. Therefore, distinction from a general wiring layer is possible, even when positional shift of bonding has not occurred.

[Wiring Pattern in Wiring Layer M1]

As described with reference to FIG. 2, and so on, the word lines WL are respectively connected with the transistors $T_{BLK}$. Now, since the word line WL is sometimes supplied with a comparatively large voltage, a high withstand voltage transistor is used as the transistor $T_{BLK}$. Now, the high withstand voltage transistor is sometimes comparatively large. As a result, area of the row control circuit region $R_RC$ described with reference to FIG. 10 is sometimes comparatively large.

Now, conceivably, in the case that area of the row control circuit region $R_{RC}$ is larger than area of the hookup region $R_{HU}$, a part of the row control circuit region $R_{RC}$ is provided in a region overlapping the hookup region $R_{HU}$ viewed from the Z direction, and the remaining part is provided in a region not overlapping the memory plane MP viewed from the Z direction. However, sometimes, in this case, area of the peripheral circuit region $R_{PC}$ overall gets larger than area of the memory plane MP, and circuit area of the memory die MD increases.

Accordingly, in the present embodiment, as described with reference to FIG. 10, a part of the row control circuit region $R_{RC}$ is provided in a region overlapping the hookup region $R_{HU}$ viewed from the Z direction, and the remaining part is provided in a region overlapping the memory hole region $R_{MH}$ viewed from the Z direction.

When such a structure is adopted, it results in some of the bit lines BL being provided at a position overlapping the row control circuit region $R_{RC}$ or block decoder region $R_{BD}$, not the column control circuit region $R_{CC}$, viewed from the Z direction.

Figure 15:
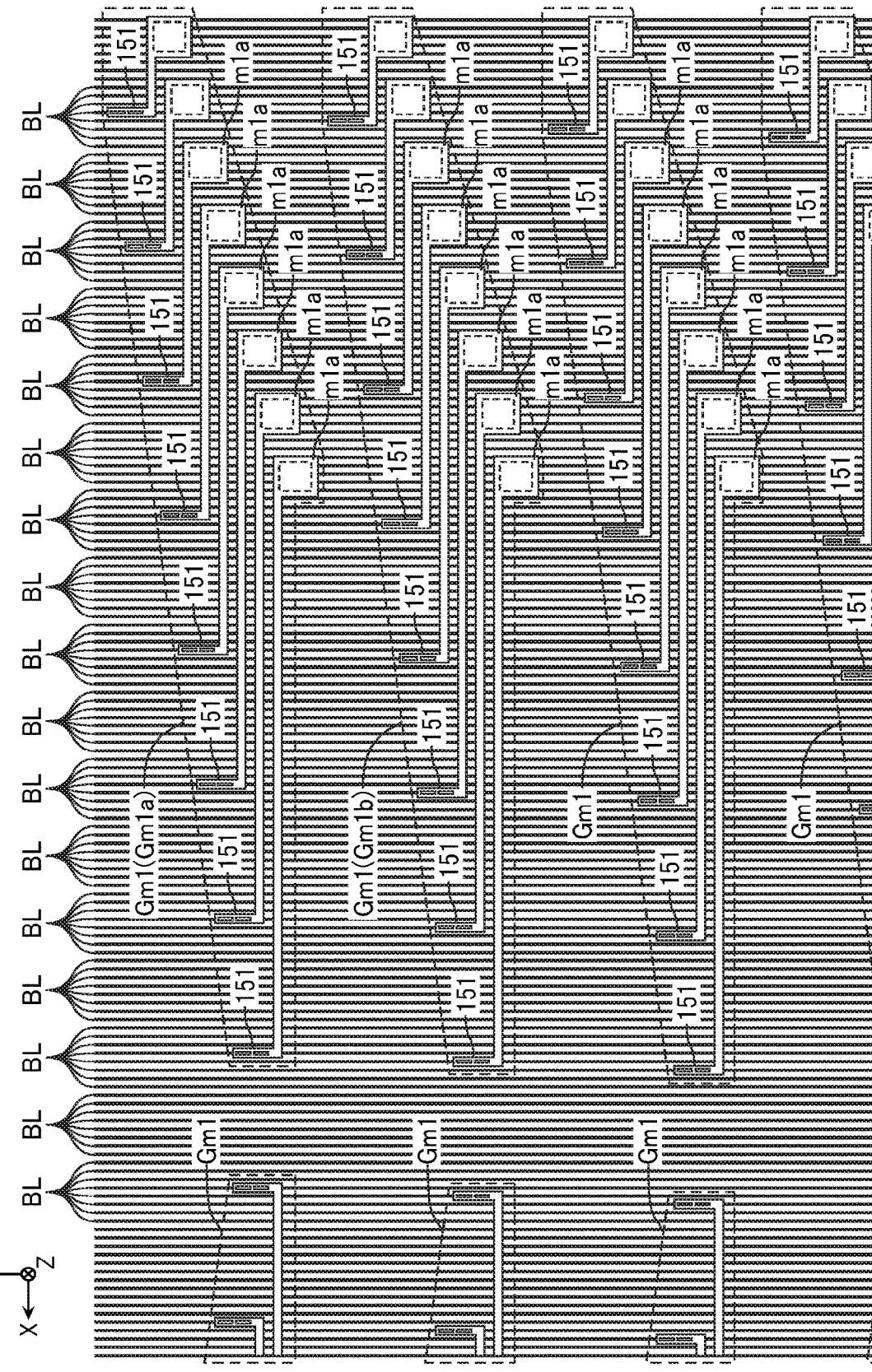
FIG. 15 is a schematic bottom view for explaining the wiring pattern in the wiring layer M1.

Accordingly, in the present embodiment, the wiring layer M1 is provided with a wiring m1a extending in the X direction of the kind shown in FIG. 15, and the bit line BL and a configuration in the column control circuit region $R_{CC}$ are electrically connected via this wiring m1a. Such a configuration makes it possible to provide a semiconductor memory device in which increase in circuit area of the memory die MD associated with increase in area of the row control circuit region $R_{RC}$ is suppressed, and degree-of-integration of the semiconductor memory device is thereby able to be raised.

The wiring pattern in the wiring layer M1 will be described below.

Figure 14:
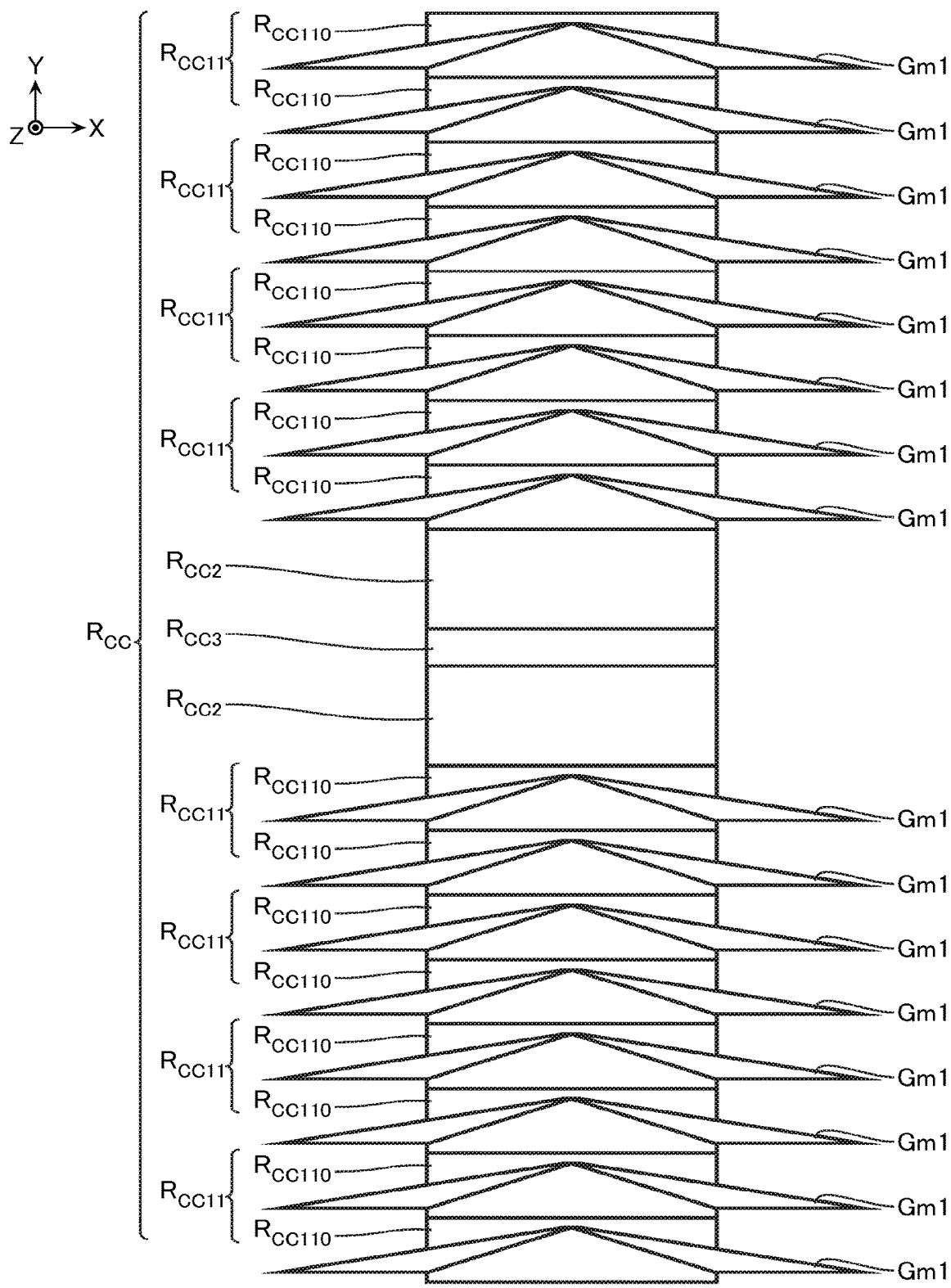
FIG. 14 is a schematic plan view for explaining a wiring pattern in a wiring layer M1.
Figure 16:
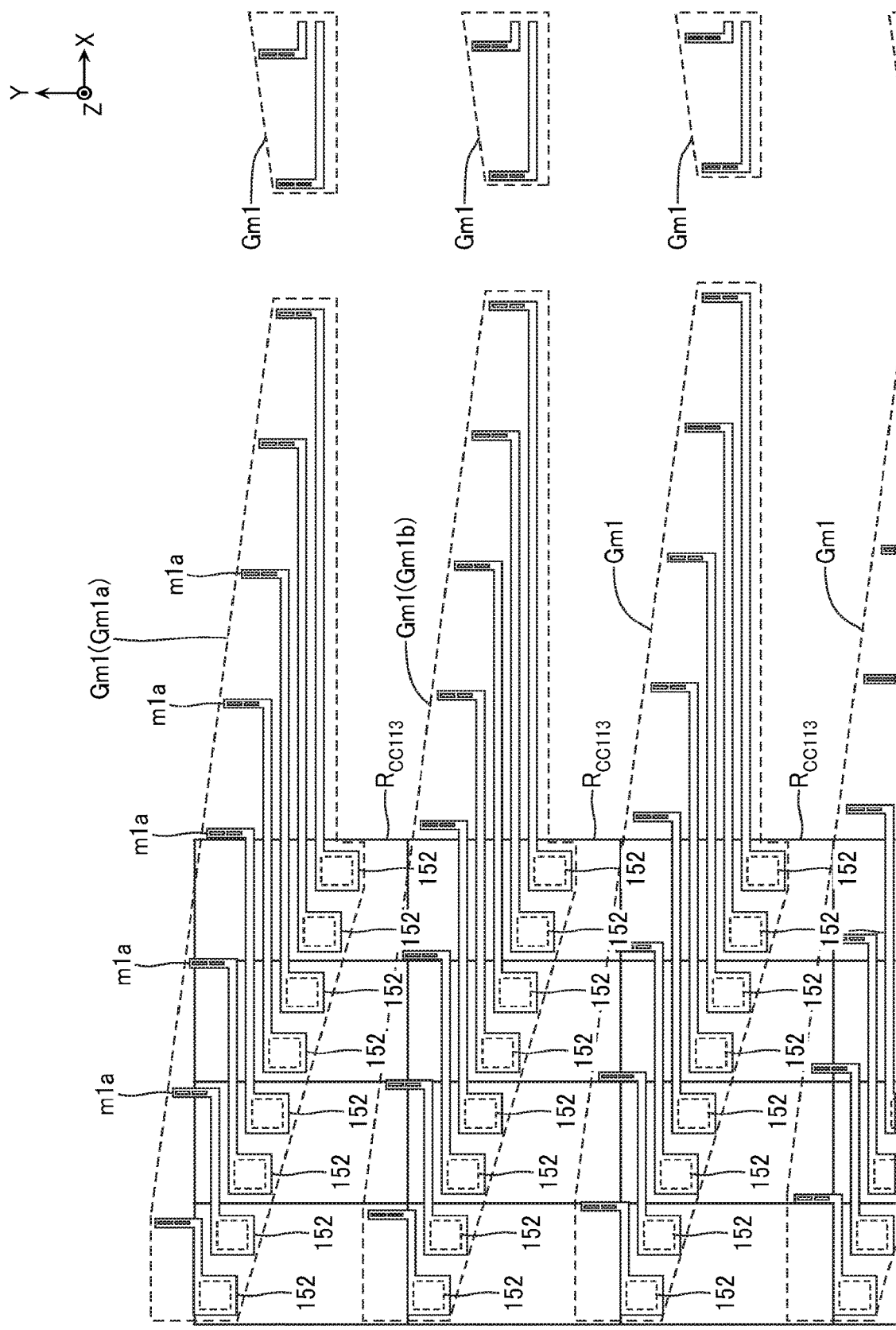
FIG. 16 is a schematic plan view for explaining the wiring pattern in the wiring layer M1.
Figure 17:
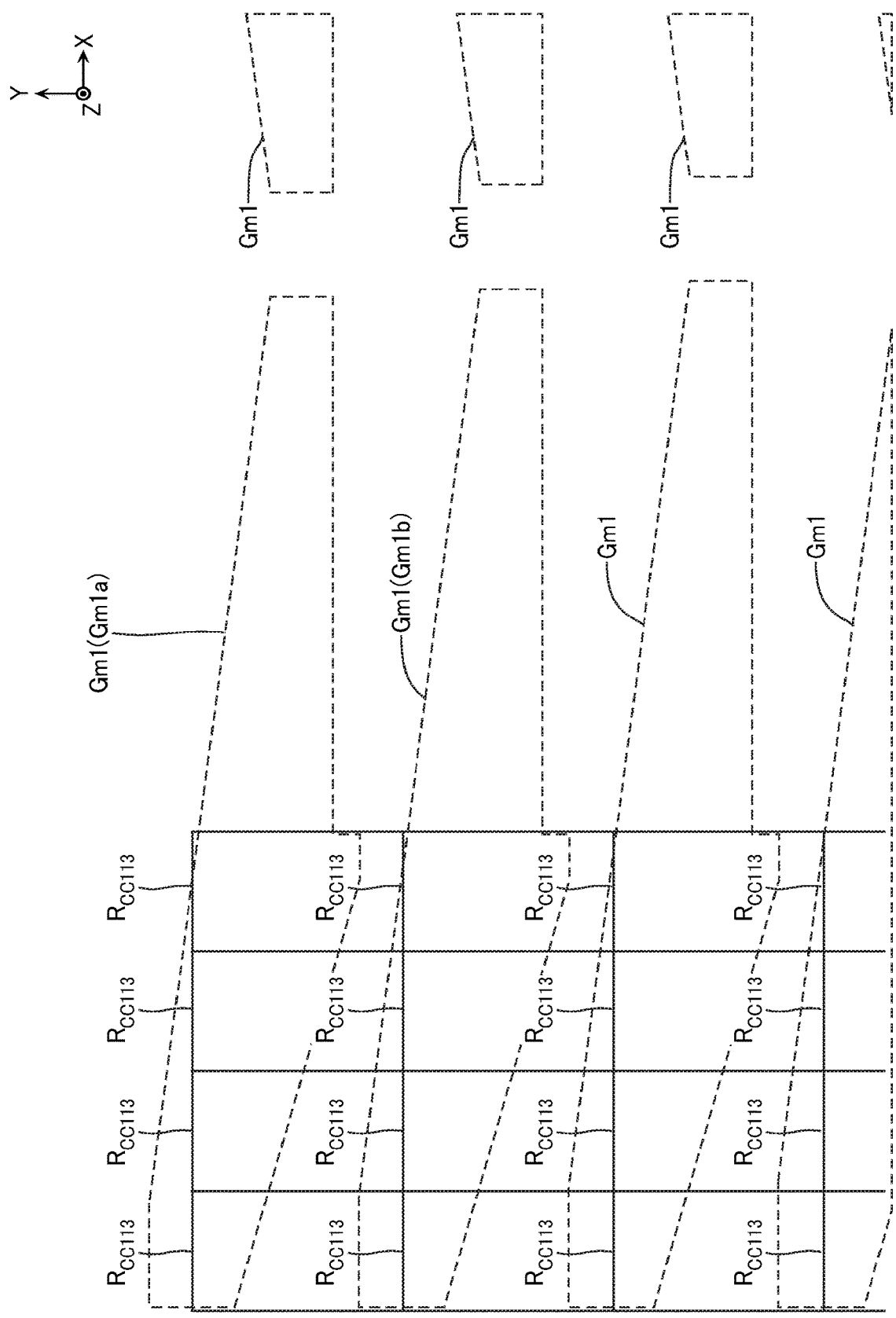
FIG. 17 is a schematic plan view for explaining the wiring pattern in the wiring layer M1.
Figure 18:
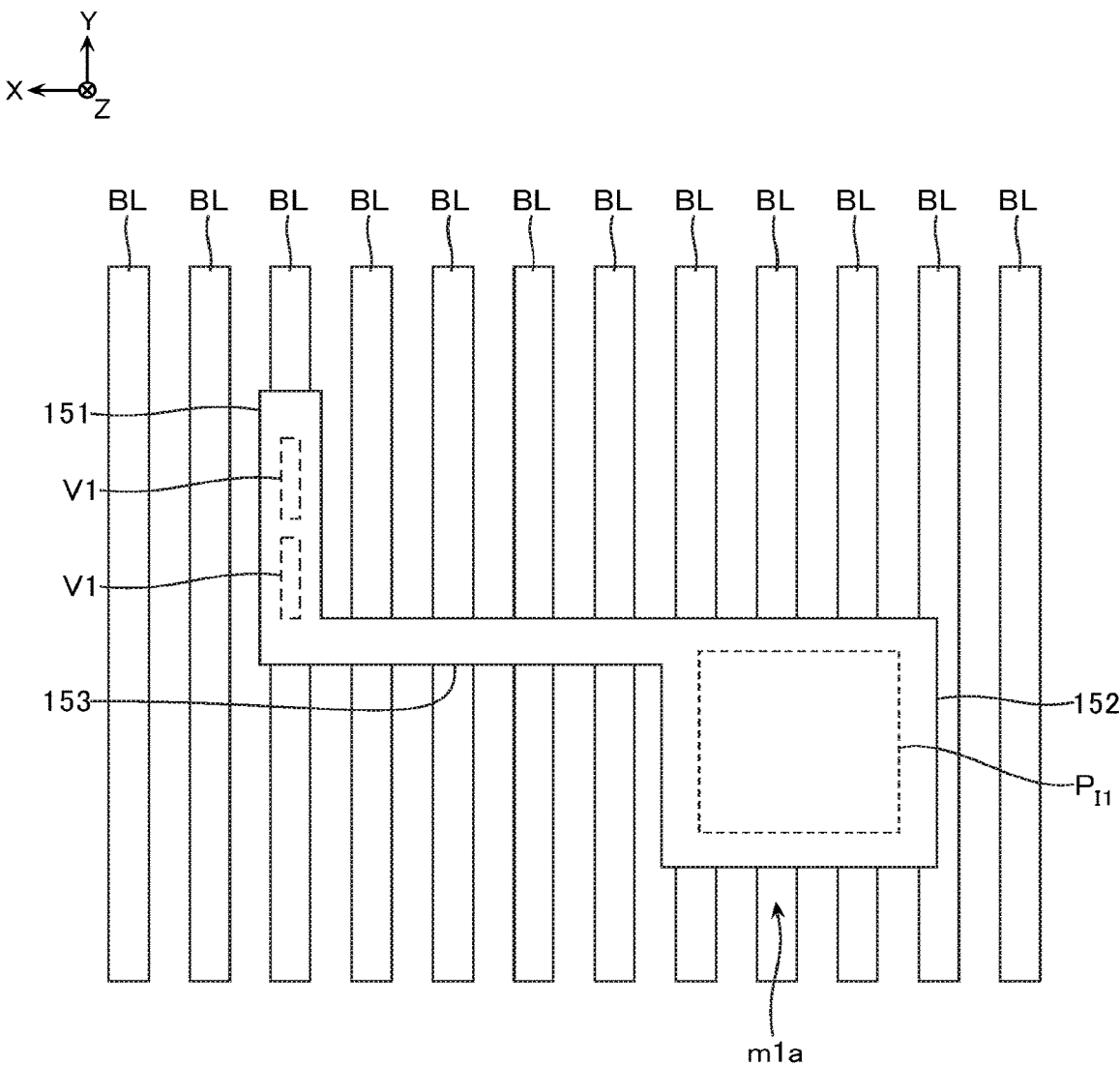
FIG. 18 is a schematic bottom view for explaining a wiring m1$a$.
Figure 19:
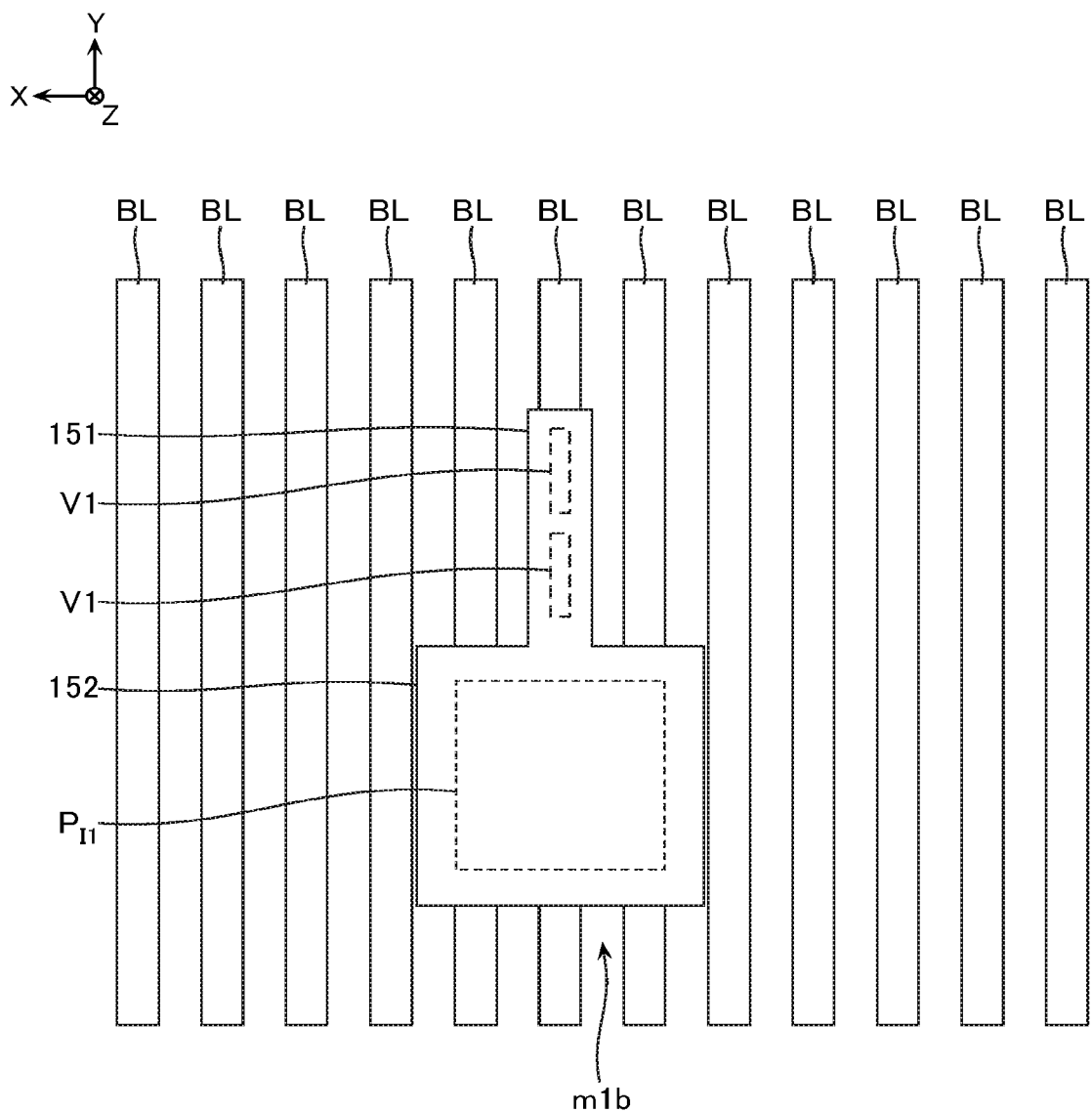
FIG. 19 is a schematic bottom view for explaining a wiring m1$b$.
Figure 20:
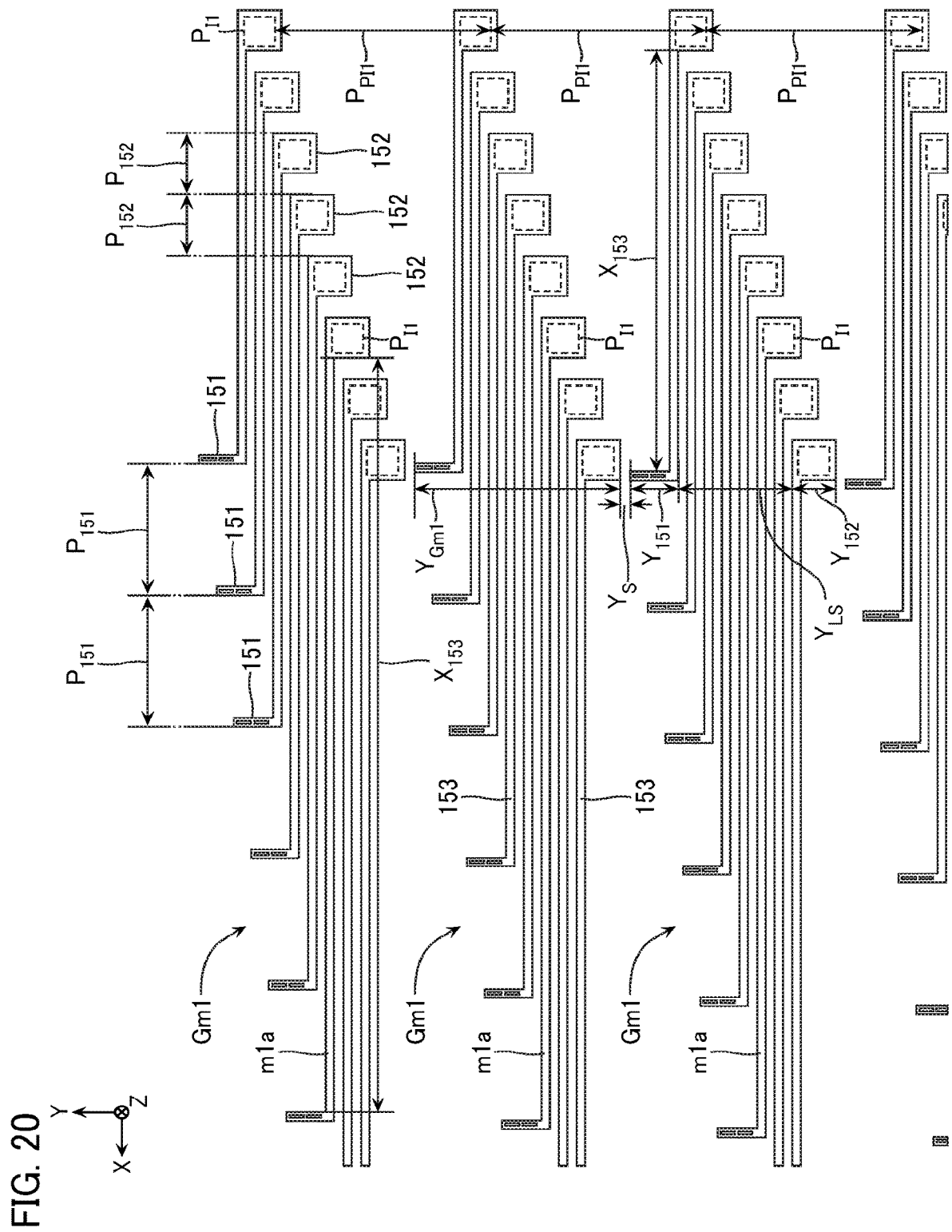
FIG. 20 is a schematic bottom view for explaining the wiring pattern in the wiring layer M1.

FIG. 14 is a schematic plan view for explaining the wiring pattern in the wiring layer M1. In FIG. 14, configurations in the wiring layer M1 and configurations in the chip $C_P$ are illustrated overlapped. FIG. 15 is a schematic bottom view for explaining the wiring pattern in the wiring layer M1. In FIG. 15, configurations in the wiring layer M1 and configurations in the wiring layer M0 are illustrated overlapped. FIGS. 16 and 17 are schematic plan views for explaining the wiring pattern in the wiring layer M1. In FIG. 16, configurations in the wiring layer M1 and configurations in the chip $C_P$ are illustrated overlapped. FIG. 17 illustrates configuration of a region corresponding to FIG. 16. However, in FIG. 17, the wiring m1a is omitted. FIG. 18 is a schematic bottom view for explaining the wiring m1a. FIG. 19 is a schematic bottom view for explaining a wiring m1b. FIG. 20 is a schematic bottom view for explaining the wiring pattern in the wiring layer M1.

As shown in FIG. 15, the memory hole region $R_{MH}$ of the wiring layer M1 is provided with a plurality of wiring groups Gm1. As shown in FIG. 14, for example, the wiring groups Gm1 are provided correspondingly to the plurality of regions $R_{CC110}$ arranged in the Y direction, and are arranged in the Y direction with the same pitch as these plurality of regions $R_{CC110}$. Moreover, the wiring groups Gm1 are each provided in a range of one of the plurality of regions $R_{HMU}$ described with reference to FIG. 10.

As shown in FIG. 15, for example, the wiring groups Gm1 each comprise a plurality (in the example of FIG. 15, eight) of the wirings m1a. The wirings m1a are some of the plurality of wirings m1 described with reference to FIGS. 6, 7, and so on.

As shown in FIG. 18, the wiring m1a comprises: a portion 151 provided at a position overlapping the bit line BL viewed from the Z direction; a portion 152 provided at a position overlapping the bonding electrode $P_{I1}$ viewed from the Z direction; and a portion 153 connected to these portions 151, 152.

The portion 151 extends in the Y direction. As shown in FIG. 6, an upper surface of the portion 151 is connected to two via contact electrodes V1 arranged in the Y direction. These two via contact electrodes V1 are connected to a lower surface of the bit line BL. Moreover, as shown in FIG. 18, a length in the Y direction of these two via contact electrodes V1 is larger than a length in the X direction of these two via contact electrodes V1. Moreover, a length in the Y direction of the portion 151 is larger than a total Y length of these two via contact electrodes V1. Moreover, a length in the X direction of the portion 151 is larger than a length in the X direction of these two via contact electrodes V1. The portion 151 covers entire lower surfaces of these two via contact electrodes V1.

Note that although in the example illustrated, two via contact electrodes V1 are provided correspondingly to one portion 151, such a configuration is merely an exemplification. For example, one via contact electrode V1 may be provided correspondingly to one portion 151, or three or more via contact electrodes V1 may be provided correspondingly to one portion 151.

Now, the bit lines BL are arranged in the X direction over the whole of the memory hole region $R_H$. The portions 151 too are provided over the whole of the memory hole region $R_{MH}$, correspondingly to these plurality of bit lines BL.

The portions 151 included in one of the wiring groups Gm1 (a wiring group Gm1a) exemplified in FIG. 15 are provided at positions that, viewed from the Z direction, overlap the 16n+12$^{th}$ (where n is an integer of 0 or more) bit lines BL counting from a negative side in the X direction. Moreover, the portions 151 included in one of the wiring groups Gm1 (a wiring group Gm1b) exemplified in FIG. 15 are provided at positions that, viewed from the Z direction, overlap the 16n+13$^{th}$ bit lines BL counting from a negative side in the X direction. Similarly, the portions 151 included in one of 16 of the wiring groups Gm1 arranged in the Y direction are provided at positions that, viewed from the Z direction, overlap the 16n+m$^{th}$ (where m is an integer not less than 1 and not more than 16) bit lines BL counting from a negative side in the X direction.

As shown in FIG. 18, the portion 152 is formed in a substantially rectangular shape. As shown in FIG. 6, a lower surface of the portion 152 is connected to the bonding electrode $P_{I1}$. As shown in FIG. 18, a length in the Y direction of the portion 152 is larger than a length in the Y direction of the bonding electrode $P_{I1}$. Moreover, a length in the X direction of the portion 152 is larger than a length in the X direction of the bonding electrode $P_{I1}$. The portion 152 covers an entire upper surface of the bonding electrode $P_{I1}$.

The bonding electrodes $P_{I1}$ are arranged in the X direction and the Y direction over the whole of the column control circuit region $R_{CC}$ described with reference to FIG. 10. The portions 152 too are provided over the whole of the column control circuit region $R_{CC}$, correspondingly to these plurality of bonding electrodes $P_{f1}$.

FIGS. 16 and 17 exemplify a plurality of the regions $R_{CC113}$. As shown in FIGS. 16 and 17, the portions 152 included in the wiring group Gm1a are provided at positions that, viewed from the Z direction, overlap the $1^{st}$ region $R_{CC113}$ counting from a positive side in the Y direction, of four regions $R_{CC113}$ arranged in the Y direction. Moreover, the portions 152 included in the wiring group Gm1b are provided at positions that, viewed from the Z direction, overlap the $2^{nd}$ region $R_{CC113}$ counting from a positive side in the Y direction, of four regions $R_{CC113}$ arranged in the Y direction. Similarly, the portions 152 included in one of a plurality of the wiring groups Gm1 arranged in the Y direction are provided at positions that, viewed from the Z direction, overlap one of a plurality of the regions $R_{CC113}$ arranged in the Y direction.

Moreover, in the example of FIG. 16, positions in the X direction of the plurality of portions 152 included in each wiring group Gm1 all differ. Moreover, the plurality of regions $R_{CC113}$ are each provided at a position overlapping two of the portions 152 viewed from the Z direction. These two portions 152 are respectively electrically connected to the two sense amplifier circuits SADL (refer to FIG. 12) included in their corresponding region $R_{CC113}$.

As shown in FIG. 18, the portion 153 extends in the X direction. Moreover, one end portion in the X direction of the portion 153 is connected to one end portion in the Y direction (in the example illustrated, an end portion on a negative side in the Y direction) of the portion 151. Another end portion in the X direction of the portion 153 is connected to one end portion in the Y direction (in the example illustrated, an end portion on a positive side in the Y direction) of the portion 152. Note that a center position in the Y direction of the portion 153 is between a center position in the Y direction of the portion 151 and a center position in the Y direction of the portion 152.

As shown in FIG. 20, in the case of focusing on the eight wirings m1a included in one wiring group Gm1, the portions 153 are arranged in the Y direction with a certain pitch. Moreover, a pitch $P_{151}$ in the X direction of the portions 151 is larger than a pitch $P_{152}$ in the X direction of the portions 152. Hence, in the case of focusing on the eight wirings m1a included in one wiring group Gm1, lengths $X_{153}$ in the X direction of the portions 153 of these eight wirings m1a all differ. In the example of FIG. 16, the further to a positive side in the Y direction a wiring m1a of these eight wirings m1a is disposed, the shorter the length $X_{153}$ in the X direction of its portion 153 is, and the further to a negative side in the Y direction a wiring m1a of these eight wirings m1a is disposed, the longer the length $X_{153}$ in the X direction of its portion 153 is.

As described with reference to FIG. 10, the plurality of wiring groups Gm1 are provided in a range of one of the plurality of regions $R_{MHU}$ arranged in the X direction. For example, the wiring m1a whose length in the X direction is greatest is connected to: the bit line BL provided in a vicinity of an end portion in the X direction of the region $R_{MHU}$; and the bonding electrode PT1 provided in a vicinity of an end portion in the X direction of the column control circuit region $R_{CC}$. Hence, a maximum value of the length $X_{153}$ in the X direction of the portion 153 may substantially match a distance $X_{EE}$ (FIG. 10) in the X direction from the end portion in the X direction of the region $R_{MHU}$ to the end portion in the X direction of the column control circuit region $R_{CC}$, for example. The maximum value of the length $X_{153}$ is at least smaller than a length in the X direction of the region $R_{MHU}$.

Note that some of the eight wirings included in some of the wiring groups Gm1 may be wirings m1b of the kind exemplified in FIG. 19, not the wirings m1a. The wiring m1b is basically configured similarly to the wiring m1a. However, the wiring m1b does not comprise the portion 153. In the wiring m1b, one end portion in the Y direction of the portion 151 is connected to the portion 152.

For example, in a region in a vicinity of the center in the X direction of the column control circuit region $R_{CC}$, the bit line BL and the bonding electrode $P_{f1}$ electrically connected to this bit line BL sometimes overlap viewed from the Z direction. Such a bit line BL is connected with the wiring m1b, not the wiring m1a.

Next, a pitch $P_{Pf1}$ in the Y direction of the bonding electrodes $P_{f1}$ will be described with reference to FIG. 20.

The pitch $P_{Pf1}$ in the Y direction of the bonding electrodes $P_{f1}$ is conceivably assumed to be greater than or equal to a total value of: a width $Y_{Gm1}$ in the Y direction of the wiring group Gm1; and a minimum distance $Y_S$ permissible as a distance between two wiring groups Gm1 arranged in the Y direction.

Moreover, it is possible for the width $Y_{Gm1}$ in the Y direction of the wiring group Gm1 to be expressed as follows. In the example illustrated, the wiring group Gm1 includes eight wirings m1a arranged in the Y direction. The width $Y_{Gm1}$ includes a width $Y_{151}$ in the Y direction of the portion 151 of the wiring m1a provided furthest to a positive side in the Y direction, of these eight wirings m1a. Moreover, the width $Y_{Gm1}$ includes a width $Y_{152}$ in the Y direction of the portion 152 of the wiring m1a provided furthest to a negative side in the Y direction, of these eight wirings m1a. Moreover, the width $Y_{Gm1}$ includes widths in the Y direction of the portions 153 of the other six wirings m1a, of these eight wirings m1a. Moreover, the width $Y_{Gm1}$ includes distances between these eight wirings m1a. Hence, assuming a total width of the widths in the Y direction of the six portions 153 and the distances between the eight wirings m1a to be $Y_{LS}$, it is possible for the width $Y_{Gm1}$ in the Y direction of the wiring group Gm1 to be expressed as a total value of: the width $Y_{151}$; the width $Y_{152}$; and the width $Y_{LS}$.

From the above, the pitch $P_{Pf1}$ in the Y direction of the bonding electrodes $P_1$ may be assumed to be greater than or equal to a total value of: the width $Y_{151}$; the width $Y_{152}$; the width $Y_{LS}$; and the minimum distance $Y_S$.

Second Embodiment

FIGS. 21 to 25 are schematic plan views showing a configuration of a part of a semiconductor memory device according to a second embodiment. In the following description, portions similar to in the first embodiment will be assigned with the same symbols as in the first embodiment, and descriptions thereof omitted.

The semiconductor memory device according to the second embodiment is basically configured similarly to the semiconductor memory device according to the first embodiment.

However, in the semiconductor memory device according to the first embodiment, as described with reference to FIG. 14, a plurality of the wiring groups Gm1 are arranged in the Y direction with the same pitch as the regions $R_{CC110}$, and one wiring group Gm1 is provided correspondingly to one region $R_{CC110}$.

Figure 21:
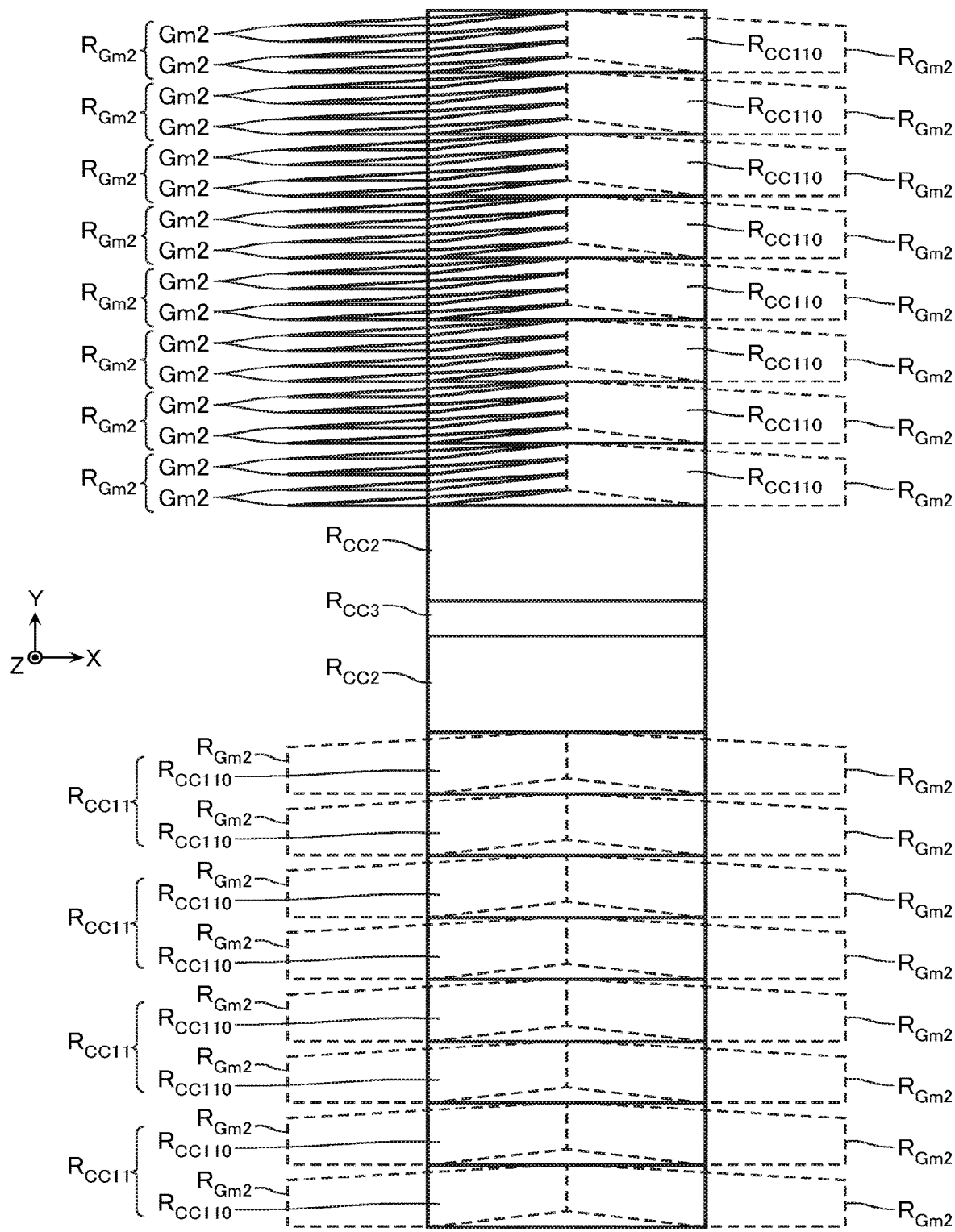
FIG. 21 is a schematic plan view showing a configuration of a part of a semiconductor memory device according to a second embodiment.

On the other hand, in the semiconductor memory device according to the second embodiment, as shown in FIG. 21, a plurality of wiring groups Gm2 are arranged in the Y direction with a smaller pitch than the regions $R_{CC110}$, and a plurality (in the example illustrated, four) of the wiring groups Gm2 are provided correspondingly to one region $R_{CC110}$.

The wiring group Gm2 comprises a plurality of the wirings m1a, similarly to the wiring group Gm1. Note that some of the plurality of wirings included in some of the wiring groups Gm2 may be the wirings m1b of the kind exemplified in FIG. 19, not the wirings m1a. Note that in FIG. 21, a region provided with four of the wiring groups Gm2 is indicated as a region $R_{Gm2}$.

Figure 22:
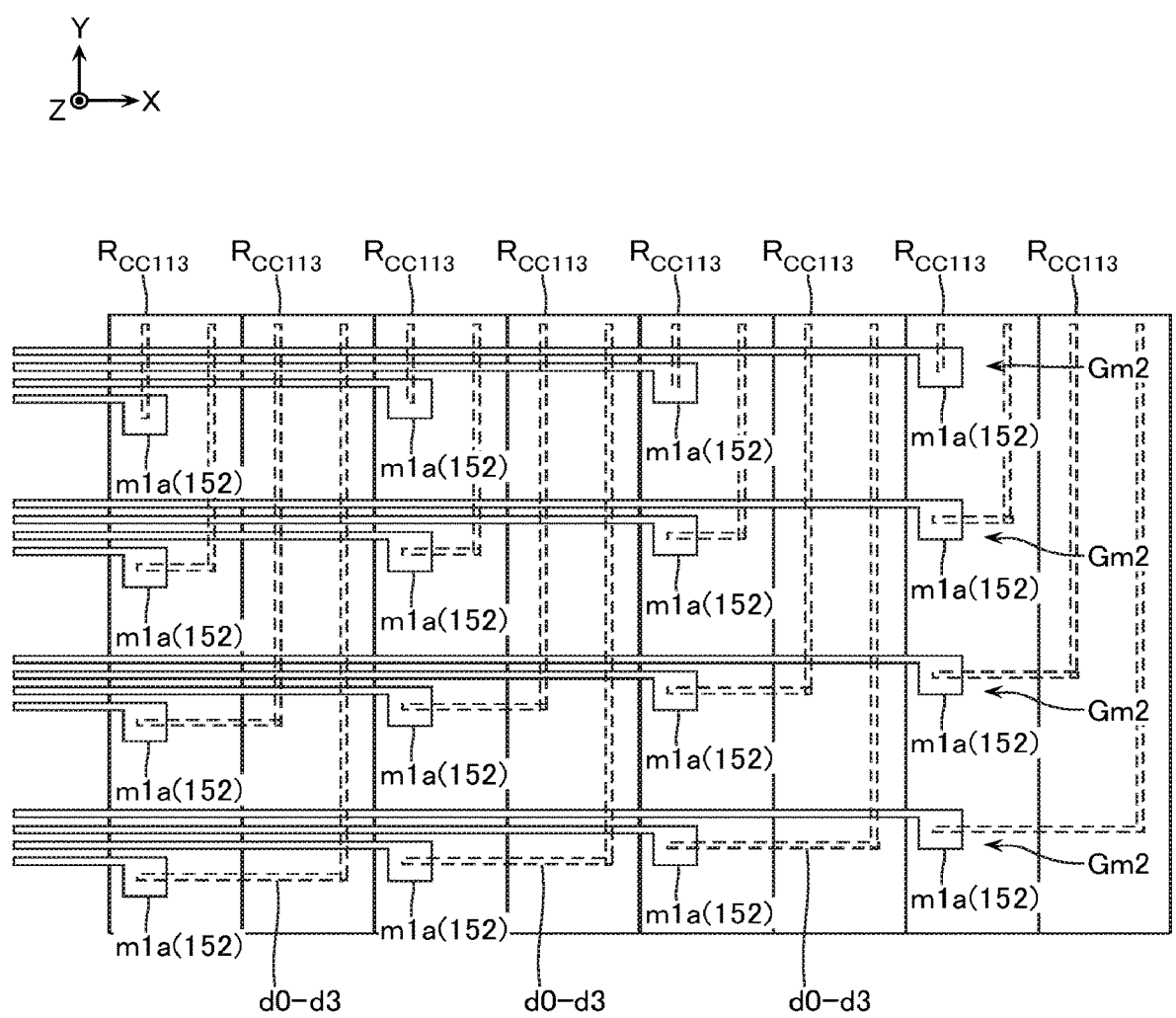
FIG. 22 is a schematic plan view showing a configuration of a part of the same semiconductor memory device.

Moreover, in the example of FIG. 22, the plurality of (in the example illustrated, four) portions 152 included in the plurality of (in the example illustrated, four) wiring groups Gm2 are respectively provided at positions that, viewed from the Z direction, overlap the $2n+1^{th}$ (where n is an integer of 0 or more) regions $R_{CC113}$ counting from a negative side in the X direction. Moreover, positions that, viewed from the Z direction, overlap the $2n+2^{th}$ regions $R_{CC113}$ counting from a negative side in the X direction, are not provided with the portions 152. The four portions 152 overlapping the $2n+1^{th}$ region $R_{CC113}$ are respectively electrically connected to the four sense amplifier circuits SADL (refer to FIG. 12) included in the $2n+1^{th}$ region $R_{CC113}$ and $2n+2^{th}$ region $R_{CC113}$.

The portions 152 of the plurality of wirings m1a exemplified in FIG. 22 are respectively connected to the likes of the transistors Tr in their corresponding region $R_{CC113}$, via the wirings d0 to d3 described with reference to FIGS. 6 and 7.

Figure 23:
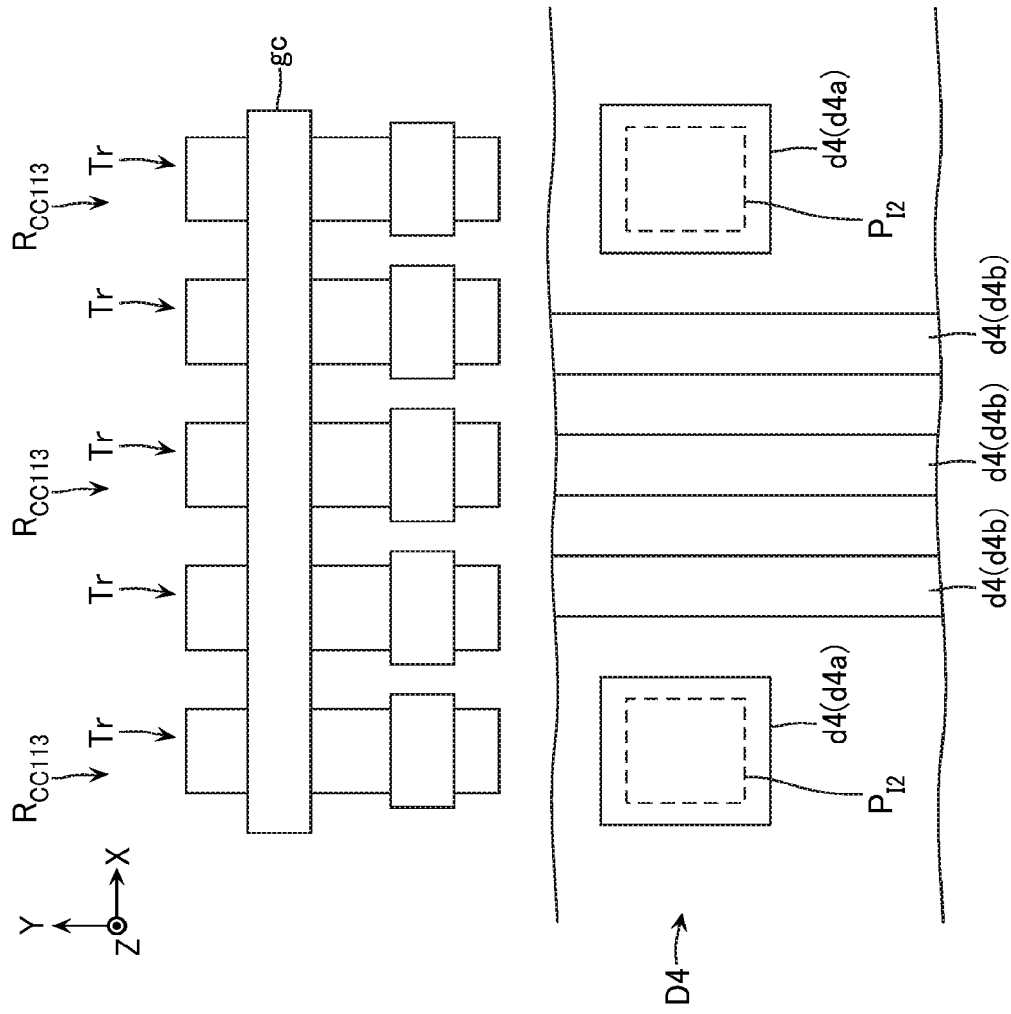
FIG. 23 is a schematic plan view showing a configuration of a part of the same semiconductor memory device.

FIG. 23 exemplifies configurations in the wiring layer D4. The wiring layer D4 exemplified in FIG. 23 comprises wirings d4a, d4b. The wirings d4a, d4b are some of the plurality of wirings d4 described with reference to FIGS. 6, 7, and so on.

The wiring d4a is formed in a substantially rectangular shape. An upper surface of the wiring d4a is connected to the bonding electrode $P_{I2}$. A length in the Y direction of the wiring d4a is larger than a length in the Y direction of the bonding electrode $P_{I2}$. Moreover, a length in the X direction of the wiring d4a is larger than a length in the X direction of the bonding electrode $P_{I2}$. The wiring d4a covers the entire lower surface of the bonding electrode $P_{I2}$.

The wiring d4b is provided between two wirings d4a having different positions in the X direction, and extends in the Y direction. In the example of FIG. 23, three wirings d4b are provided between two wirings d4a arranged in the X direction.

Figure 24:
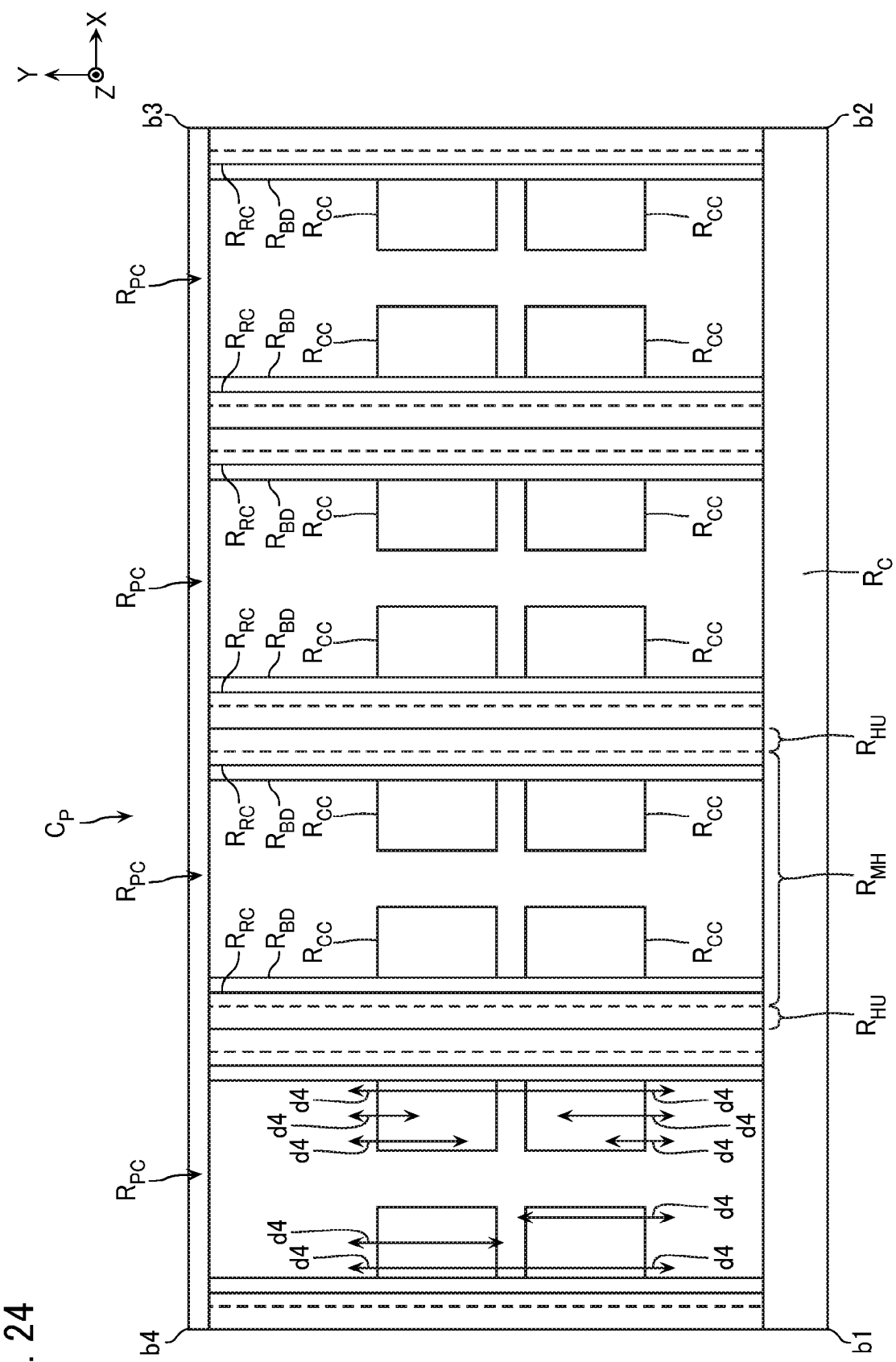
FIG. 24 is a schematic plan view showing a configuration of a part of the same semiconductor memory device.

As shown in FIG. 24, for example, such a configuration makes it possible for configurations in the column control circuit region $R_{CC}$ and configurations disposed on an outer side of the column control circuit region $R_{CC}$ to be electrically connected by the wirings d4. Moreover, it makes it possible for configurations provided further to a positive side in the Y direction than the column control circuit region $R_{CC}$ and configurations provided further to a negative side in the Y direction than the column control circuit region $R_{CC}$ to be electrically connected via the column control circuit region $R_{CC}$, by the wirings d4.

Figure 25:
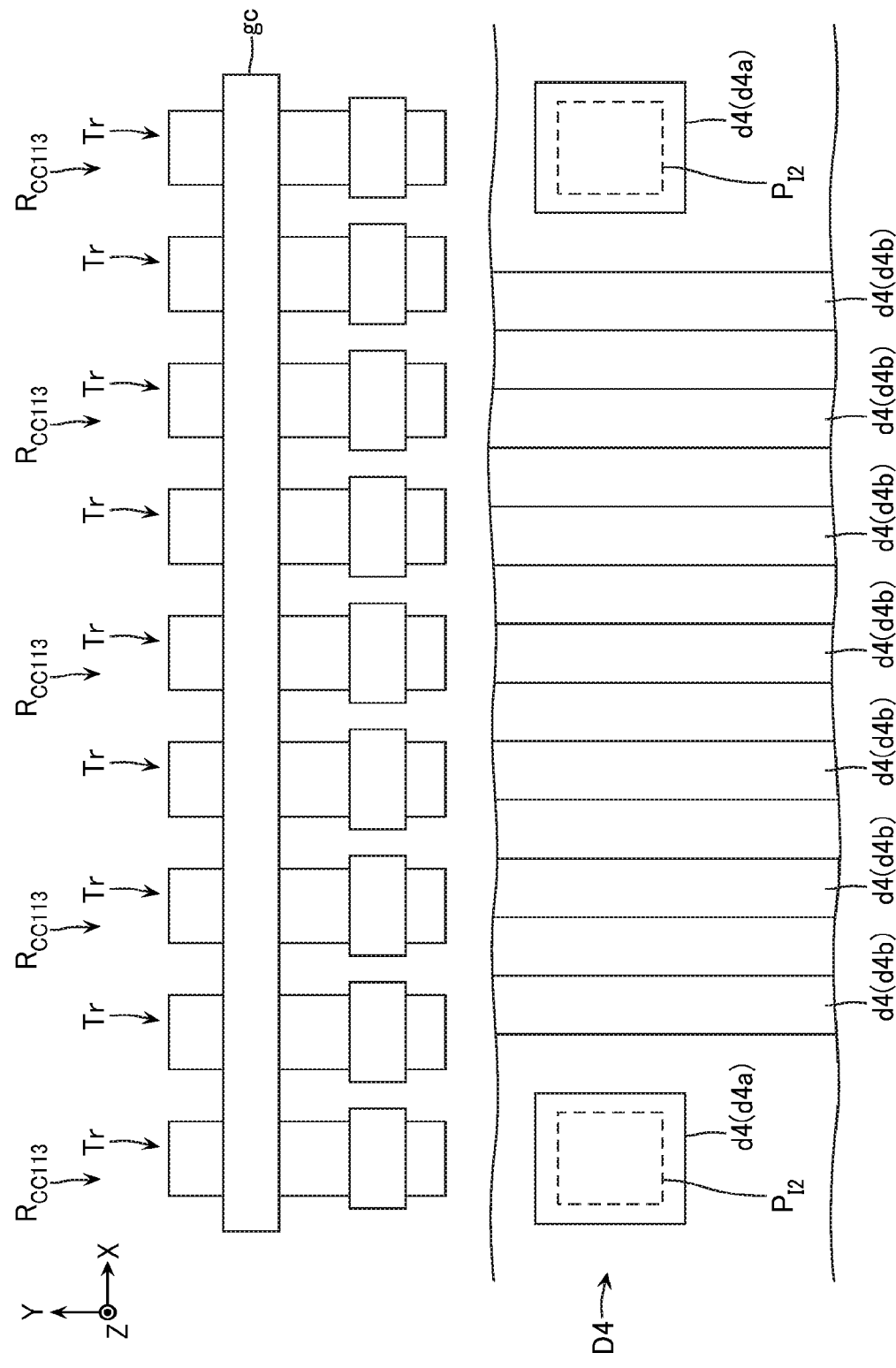
FIG. 25 is a schematic plan view showing a configuration of a part of the same semiconductor memory device.

Note that in FIG. 22, there was shown an example where the plurality of portions 152 included in the plurality of wiring groups Gm2 are respectively provided at positions that, viewed from the Z direction, overlap the $2n+1^{th}$ regions $R_{CC113}$ counting from a negative side in the X direction. However, such a configuration is merely an exemplification. For example, the plurality of portions 152 included in the plurality of wiring groups Gm2 may be respectively provided at positions that, viewed from the Z direction, overlap the $4n+1^{th}$ regions $R_{CC113}$ counting from a negative side in the X direction. In such a case, as shown in FIG. 25, for example, it is possible for an even larger number of wirings d4b to be provided between two wirings d4a arranged in the X direction.

Third Embodiment

Figure 26:
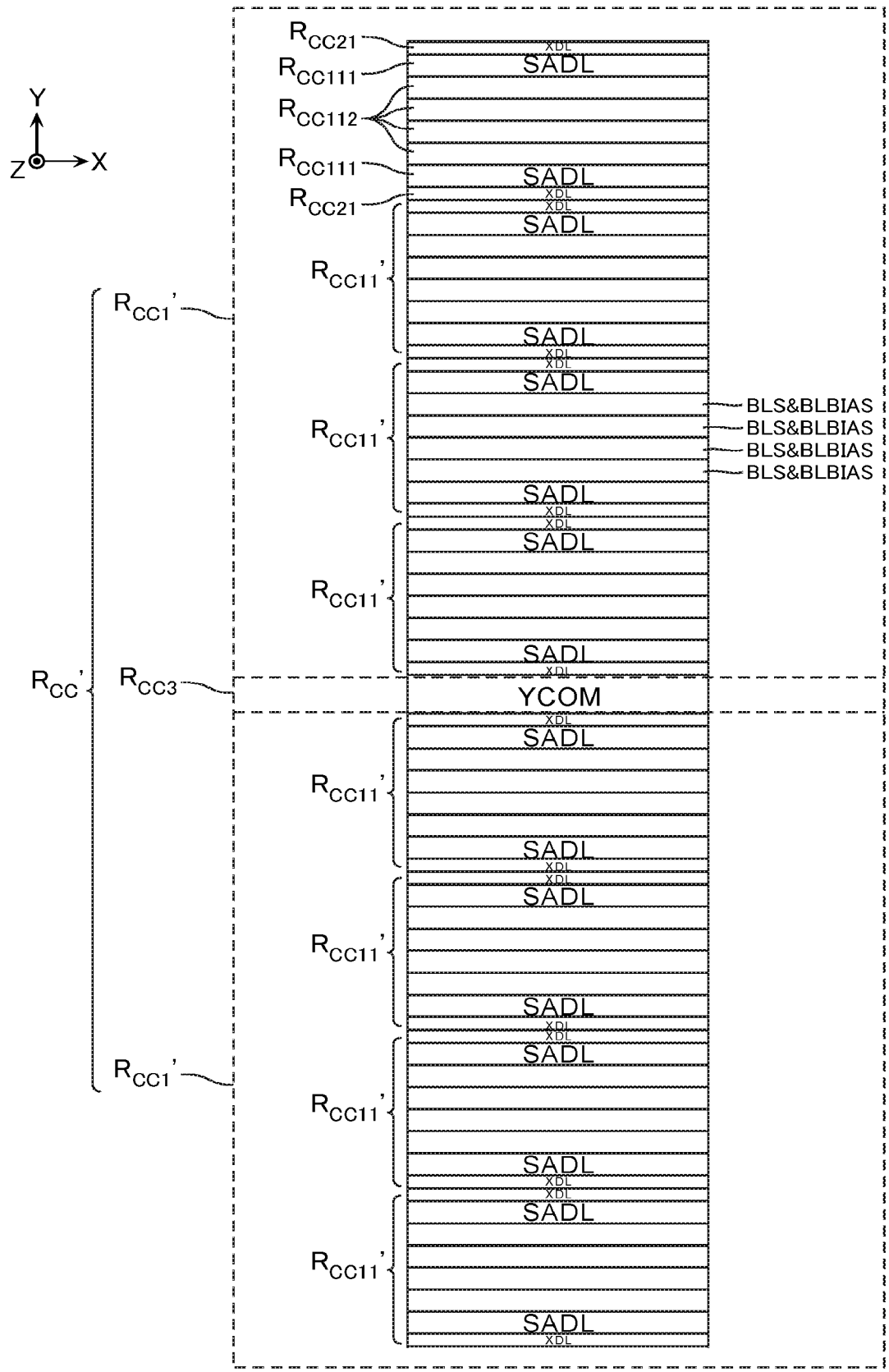
FIG. 26 is a schematic plan view showing a configuration of a part of a semiconductor memory device according to a third embodiment.

FIG. 26 is a schematic plan view showing a configuration of a part of a semiconductor memory device according to a third embodiment. In the following description, portions similar to in the first embodiment will be assigned with the same symbols as in the first embodiment, and descriptions thereof omitted.

The semiconductor memory device according to the third embodiment is basically configured similarly to the semiconductor memory device according to the first embodiment.

However, the semiconductor memory device according to the third embodiment comprises a column control circuit region $R_{CC}'$, instead of the column control circuit region $R_{CC}$. As shown in FIG. 26, the column control circuit region $R_{CC}'$ comprises: two regions $R_{CC1}'$ arranged in the Y direction; and the region $R_{CC3}$ provided between these two regions $R_{CC1}'$.

The region $R_{CC1}'$ comprises eight regions $R_{CC11}'$ arranged in the X direction and the Y direction. These eight regions $R_{CC11}'$ each comprise: two of the regions $R_{CC21}$ arranged in the Y direction; two of the regions $R_{CC111}$ provided between these two regions $R_{CC21}$ and arranged in the Y direction; and four of the regions $R_{CC112}$ provided between these two regions $R_{CC111}$ and arranged in the Y direction.

Now, the region $R_{CC11}'$ includes the region $R_{CC21}$, in addition to the configurations in the region $R_{CC11}$ described with reference to FIG. 11. Hence, width in the Y direction of the region $R_{CC11}'$ is larger than width in the Y direction of the region $R_{CC11}$. Such a configuration makes it possible for the number of wirings m1a, m1b included in the wiring group Gm1 to be increased, compared to in the first embodiment.

Fourth Embodiment

Figure 27:
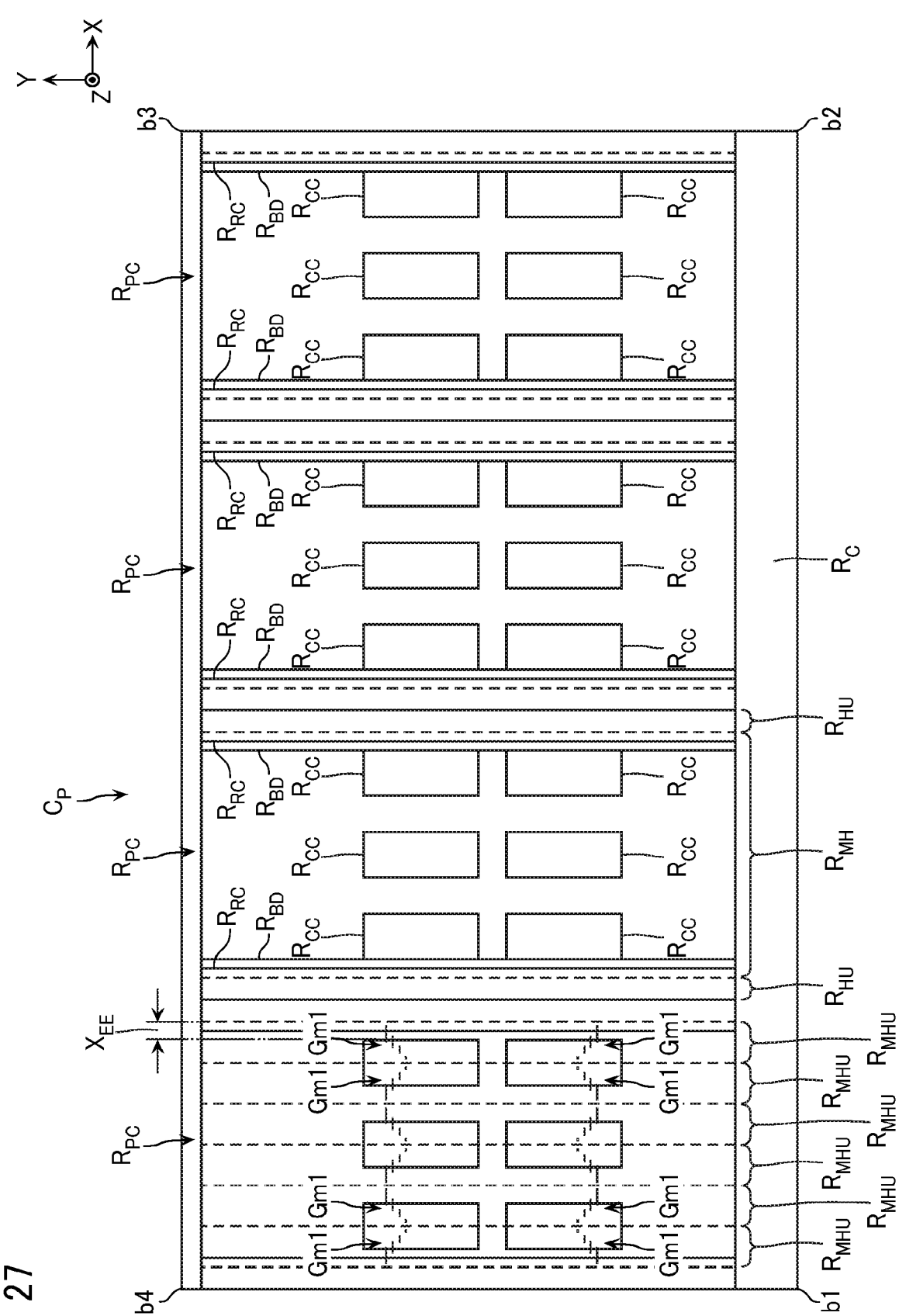
FIG. 27 is a schematic plan view showing a configuration of a part of a semiconductor memory device according to a fourth embodiment.

FIG. 27 is a schematic plan view showing a configuration of a part of a semiconductor memory device according to a fourth embodiment. In the following description, portions similar to in the first embodiment will be assigned with the same symbols as in the first embodiment, and descriptions thereof omitted.

The semiconductor memory device according to the fourth embodiment is basically configured similarly to the semiconductor memory device according to the first embodiment.

However, in the first embodiment, as described with reference to FIG. 10, the peripheral circuit region $R_{PC}$ is provided with four column control circuit regions $R_{CC}$ arranged in the X direction and the Y direction. Moreover, the peripheral circuit region $R_{PC}$ is provided with the regions $R_{MHU}$ by which the memory hole region $R_{MH}$ is divided into four portions in the X direction, and the center position in the X direction of the column control circuit region $R_{CC}$ coincides with the boundary of the $1^{st}$ and $2^{nd}$ of the regions Rou counting from a negative side in the X direction or boundary of the 3$^{rd}$ and 4$^{th}$ of the regions R$_{MHU}$ counting from a negative side in the X direction.

However, such a configuration is merely an exemplification. For example, when the number of column control circuit regions R$_{CC}$ arranged in the Y direction in one peripheral circuit region R$_{PC}$ is assumed to be a (where a is an integer of 1 or more) and the number of column control circuit regions R$_{CC}$ arranged in the X direction in one peripheral circuit region R$_{PC}$ is assumed to be b (where b is an integer of 1 or more), then it is possible for a and b to be appropriately adjusted. Moreover, it is possible too for the peripheral circuit region R$_{PC}$ to be provided with regions R$_{MHU}$ by which the memory hole region R$_{MH}$ is divided into 2b portions in the X direction, for example. Widths in the X direction of these 2b items of regions R$_{MHU}$ may be all the same, but need not be all the same. Moreover, the center position in the X direction of the column control circuit region R$_{CC}$ may coincide with a boundary of the 2n+1$^{th}$ and 2n+2$^{th}$ (where n is an integer not less than 0 and not more than b−1) of the regions R$_{HMU}$ counting from a negative side in the X direction, but need not do so.

In the example of FIG. 27, a is 2, and b is 3, for example. Hence, the peripheral circuit region R$_{PC}$ is provided with six column control circuit regions R$_{CC}$ arranged in the X direction and the Y direction. Moreover, the peripheral circuit region R$_{PC}$ is provided with regions R$_{MHU}$ by which the memory hole region R$_{MH}$ is divided into six portions in the X direction. Moreover, the center position in the X direction of the column control circuit region R$_{CC}$ coincides with a boundary of the 1$^{st}$ and 2$^{nd}$ of the regions R$_{MHU}$ counting from a negative side in the X direction, boundary of the 3$^{rd}$ and 4$^{th}$ of the regions R$_{MHU}$ counting from a negative side in the X direction, or boundary of the 5$^{th}$ and 6$^{th}$ of the regions R$_{MHU}$ counting from a negative side in the X direction. Note that the center position in the X direction of the column control circuit region R$_{CC}$ need not coincide with the boundary of the 1$^{st}$ and 2$^{nd}$ of the regions R$_{MHU}$ counting from a negative side in the X direction, boundary of the 3$^{rd}$ and 4$^{th}$ of the regions R$_{MHU}$ counting from a negative side in the X direction, or boundary of the 5$^{th}$ and 6$^{th}$ of the regions R$_{HU}$ counting from a negative side in the X direction.

Fifth Embodiment

Figure 28:
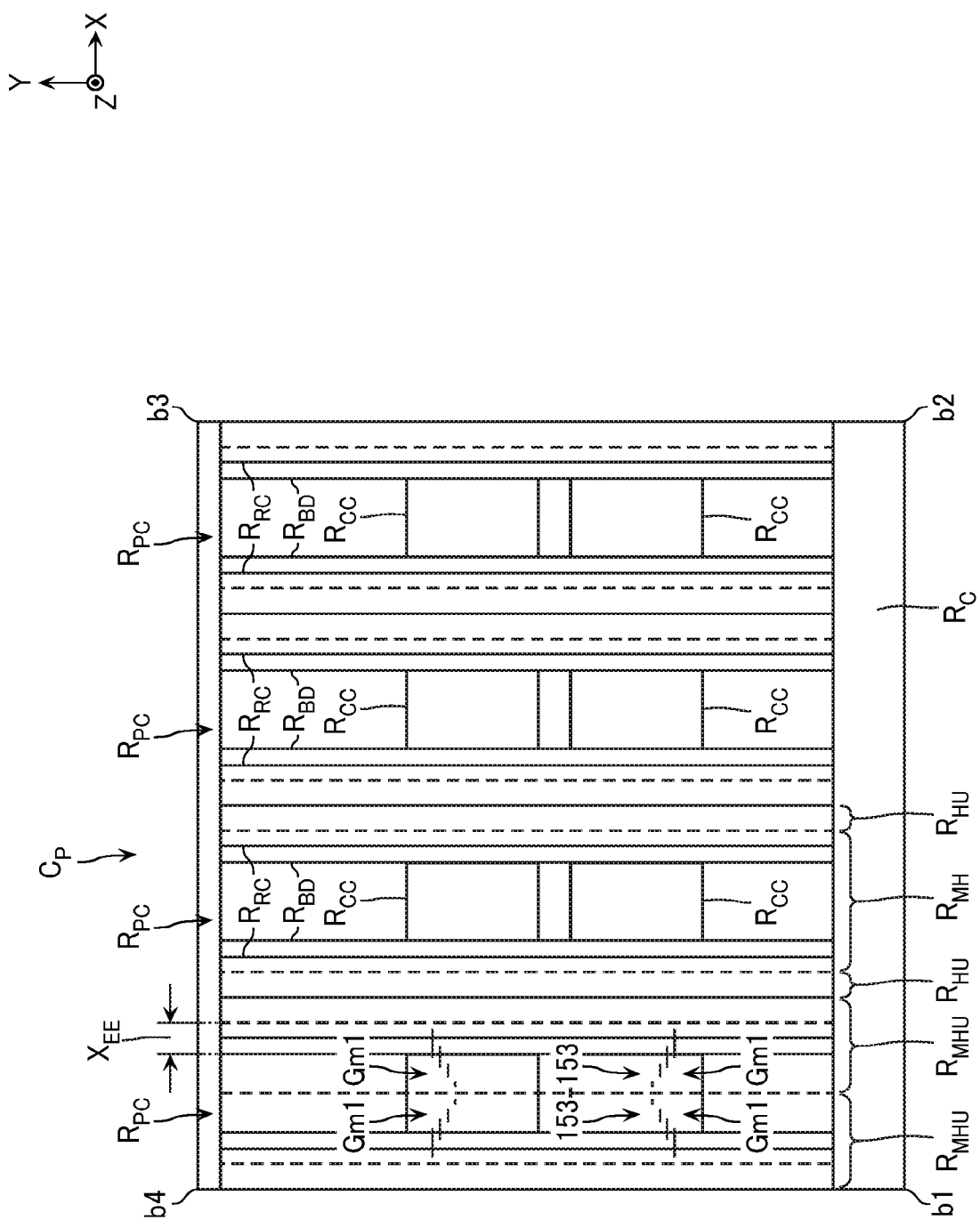
FIG. 28 is a schematic plan view showing a configuration of a part of a semiconductor memory device according to a fifth embodiment.

FIG. 28 is a schematic plan view showing a configuration of a part of a semiconductor memory device according to a fifth embodiment. In the following description, portions similar to in the first embodiment will be assigned with the same symbols as in the first embodiment, and descriptions thereof omitted.

As described with reference to FIG. 27, the number a of column control circuit regions R$_{CC}$ arranged in the Y direction and number b of column control circuit regions R$_{CC}$ arranged in the X direction in one peripheral circuit region R$_{PC}$ can be appropriately adjusted. In the example of FIG. 28, a is 2, and b is 1, for example. Note that in other respects, the semiconductor memory device according to the fifth embodiment is configured similarly to the semiconductor memory device according to the first embodiment.

Sixth Embodiment

Figure 29:
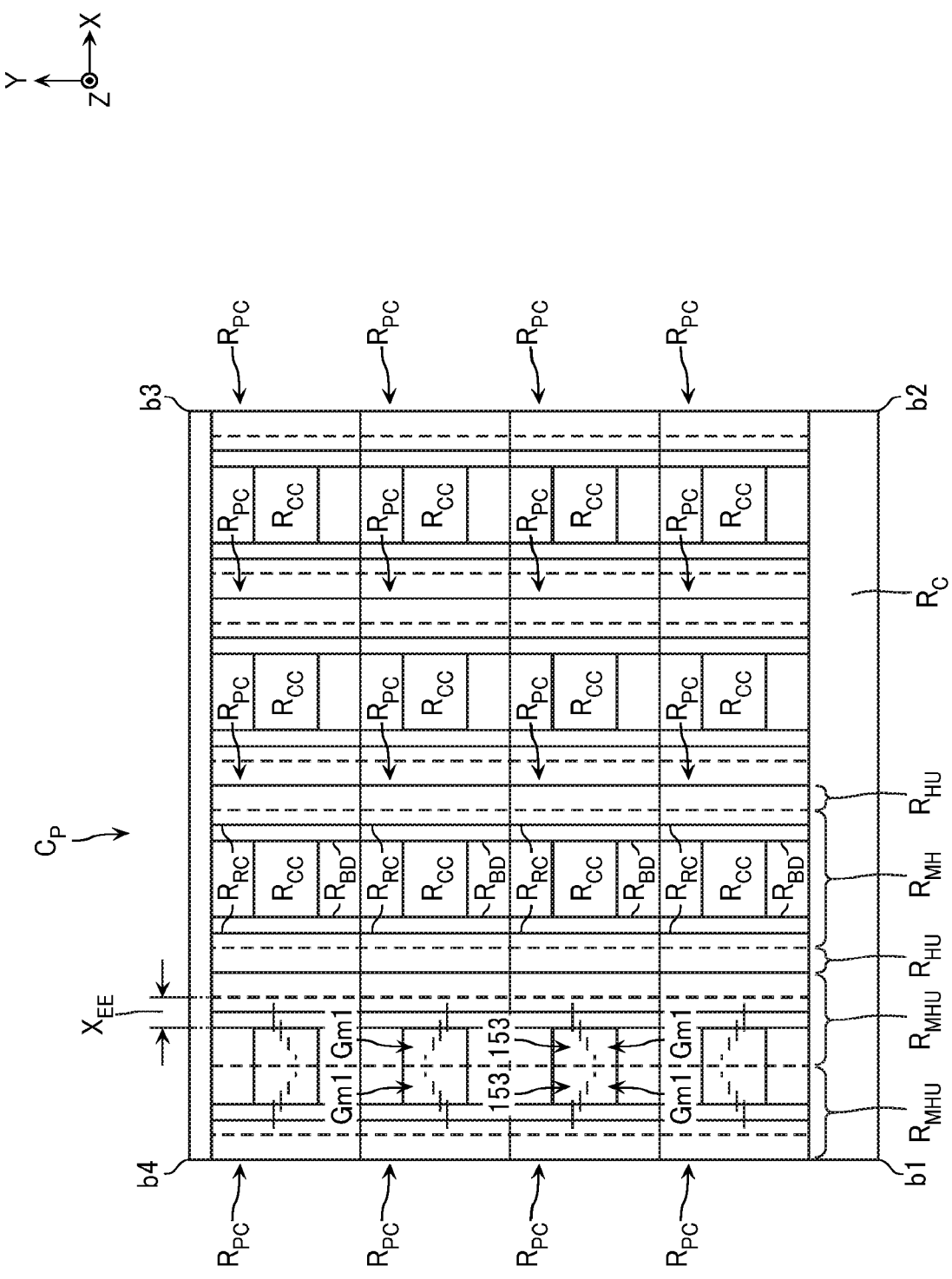
FIG. 29 is a schematic plan view showing a configuration of a part of a semiconductor memory device according to a sixth embodiment.

FIG. 29 is a schematic plan view showing a configuration of a part of a semiconductor memory device according to a sixth embodiment. In the following description, portions similar to in the first embodiment will be assigned with the same symbols as in the first embodiment, and descriptions thereof omitted.

As described with reference to FIGS. 27 and 28, the number a of column control circuit regions R$_{CC}$ arranged in the Y direction and number b of column control circuit regions R$_{CC}$ arranged in the X direction in one peripheral circuit region R$_{PC}$ can be appropriately adjusted. In the example of FIG. 29, a is 1, and b is 1, for example.

Note that in the first embodiment, as described with reference to FIG. 5, the chip C$_M$ is provided with four memory planes MP arranged in the X direction. Moreover, as described with reference to FIG. 10, the chip C$_P$ is provided with four peripheral circuit regions R$_{PC}$ arranged in the X direction correspondingly to these four memory planes MP.

On the other hand, in the sixth embodiment, the chip C$_M$ is provided with a total of 16 memory planes MP arranged four at a time in the X direction and four at a time in the Y direction. Moreover, as shown in FIG. 29, the chip C$_P$ is provided with a total of 16 peripheral circuit regions R$_{PC}$ arranged four at a time in the X direction and four at a time in the Y direction correspondingly to these 16 memory planes MP.

In other respects, the semiconductor memory device according to the sixth embodiment is configured similarly to the semiconductor memory device according to the first embodiment.

Seventh Embodiment

Figure 30:
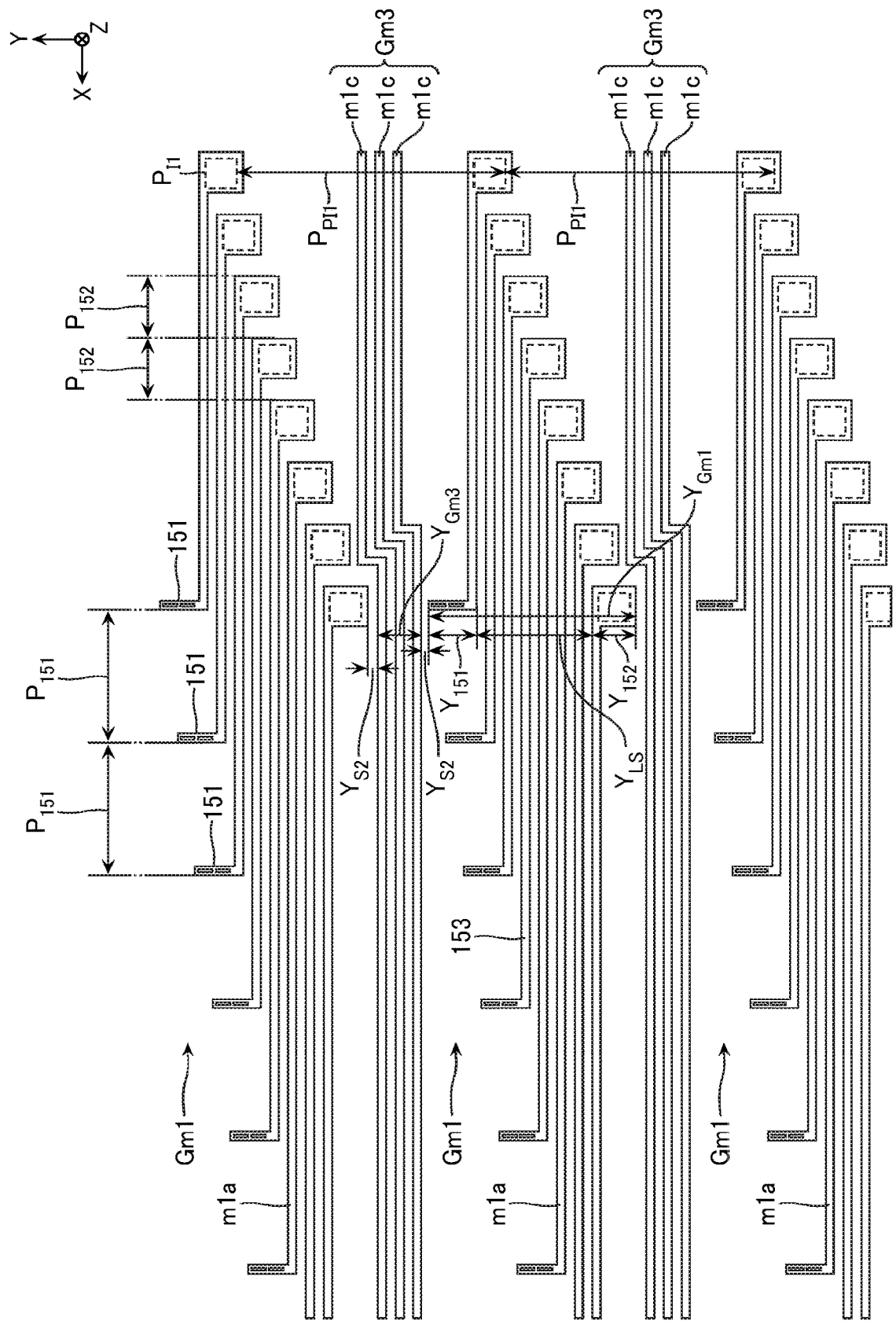
FIG. 30 is a schematic bottom view showing a configuration of a part of a semiconductor memory device according to a seventh embodiment.

FIG. 30 is a schematic bottom view showing a configuration of a part of a semiconductor memory device according to a seventh embodiment. In the following description, portions similar to in the first embodiment will be assigned with the same symbols as in the first embodiment, and descriptions thereof omitted.

The semiconductor memory device according to the seventh embodiment is basically configured similarly to the semiconductor memory device according to the first embodiment.

However, in the seventh embodiment, as shown in FIG. 30, a wiring group Gm3 is provided between two of a plurality of the wiring groups Gm1 arranged in the Y direction. The wiring group Gm3 comprises a plurality of wirings m1c arranged in the Y direction. The wiring m1c extends in the X direction. The wirings m1c are some of the plurality of wirings m1 described with reference to FIGS. 6, 7, and so on. The wiring m1c may be the wiring CG described with reference to FIG. 2, or may be a wiring electrically connected to the select gate lines (SGD, SGS), for example. Moreover, the wiring m1c may be the signal supply line BLKSEL described with reference to FIG. 2, or may be a signal supply line supplying an inverted signal of the signal supply line BLKSEL. Moreover, the wiring m1c may be another wiring.

Next, the pitch P$_{PI1}$ in the Y direction of the bonding electrodes P$_{I1}$ will be described.

In the example of FIG. 30, the pitch P$_{PI1}$ in the Y direction of the bonding electrodes P$_{I1}$ is conceivably assumed to be greater than or equal to a total value of: the width Y$_{Gm1}$ in the Y direction of the wiring group Gm1; a width Y$_{Gm3}$ in the Y direction of the wiring group Gm3; and a distance twice that of a minimum distance Y$_{S2}$ permissible as a distance between the wiring group Gm1 and the wiring group Gm3.

As mentioned above, it is possible for the width $Y_{Gm1}$ in the Y direction of the wiring group Gm1 to be expressed as a total value of: the width $Y_{151}$; the width $Y_{152}$; and the width $Y_{LS}$.

Hence, in the example of FIG. 30, the pitch $P_{PI1}$ in the Y direction of the bonding electrodes $P_{I1}$ may be assumed to be greater than or equal to a total value of: the width $Y_{151}$; the width $Y_{152}$; the width $Y_{LS}$; the width $Y_{Gm3}$; and a distance twice that of the minimum distance $Y_{S2}$.

Note that it is possible for the width $Y_{Gm3}$ in the Y direction of the wiring group Gm3 to be expressed as a total width of widths in the Y direction of the plurality of wirings m1c included in the wiring group Gm3 and distances between these plurality of wirings m1c.

Eighth Embodiment

Figure 31:
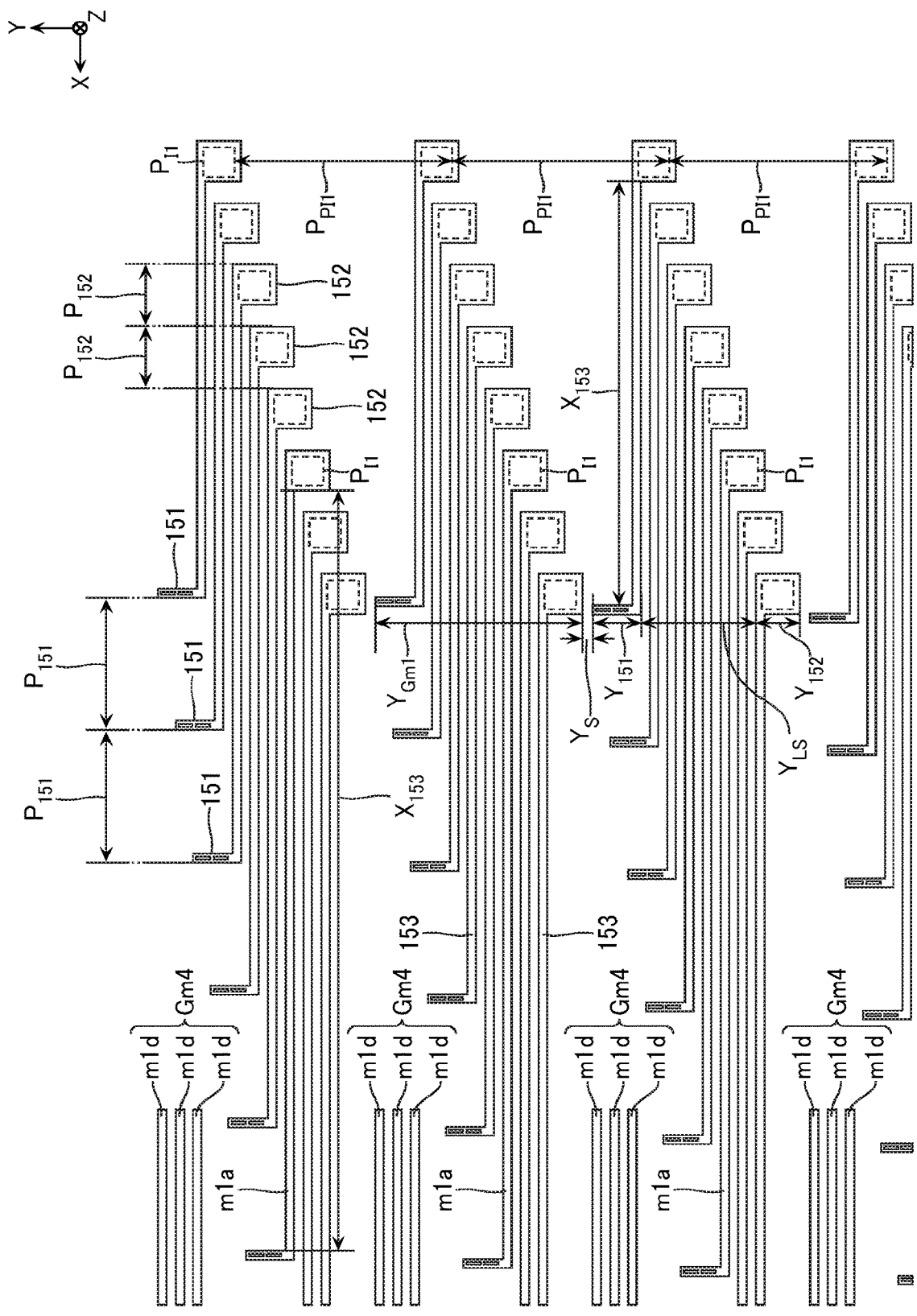
FIG. 31 is a schematic bottom view showing a configuration of a part of a semiconductor memory device according to an eighth embodiment.

FIG. 31 is a schematic bottom view showing a configuration of a part of a semiconductor memory device according to an eighth embodiment. In the following description, portions similar to in the first embodiment will be assigned with the same symbols as in the first embodiment, and descriptions thereof omitted.

The semiconductor memory device according to the eighth embodiment is basically configured similarly to the semiconductor memory device according to the first embodiment.

However, in the eighth embodiment, as shown in FIG. 31, a wiring group Gm4 is provided in a region between the column control circuit region $R_{CC}$ (FIG. 10) and row control circuit region $R_{RC}$ (FIG. 10). The wiring group Gm4 comprises a plurality of wirings m1d. In the example illustrated, the wirings m1d are arranged in the Y direction and extend in the X direction. The wirings m1d are some of the plurality of wirings m1 described with reference to FIGS. 6, 7, and so on. The wiring m1d may be the wiring CG described with reference to FIG. 2, or may be a wiring electrically connected to the select gate lines (SGD, SGS), for example. Moreover, the wiring m1d may be the signal supply line BLKSEL described with reference to FIG. 2, or may be a signal supply line supplying an inverted signal of the signal supply line BLKSEL.

Moreover, the wiring m1d may be another wiring.

Ninth Embodiment

Figure 32:
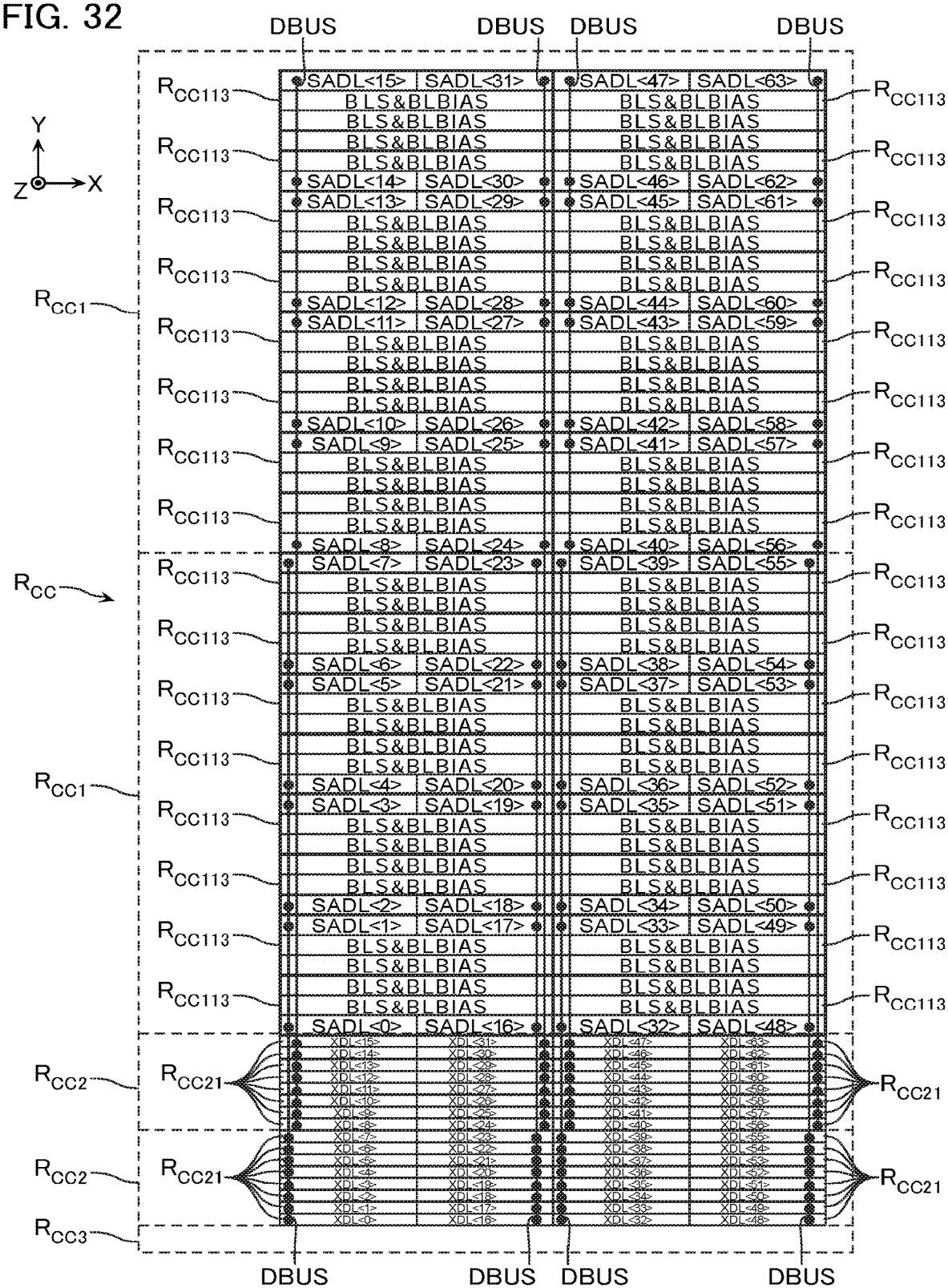
FIG. 32 is a schematic plan view showing a configuration of a part of a semiconductor memory device according to a ninth embodiment.

FIG. 32 is a schematic plan view showing a configuration of a part of a semiconductor memory device according to a ninth embodiment. In the following description, portions similar to in the first embodiment will be assigned with the same symbols as in the first embodiment, and descriptions thereof omitted. Note that in FIG. 12, the region $R_{CC113}$ is illustrated as a vertically long region (a region having a shape whose length in the Y direction is longer than its length in the X direction). On the other hand, in FIG. 32, for convenience of illustration, the region $R_{CC113}$ is illustrated as a horizontally long region (a region having a shape whose length in the X direction is longer than its length in the Y direction). However, the region $R_{CC113}$ shown in FIG. 12 and region $R_{CC113}$ shown in FIG. 32 denote similar configurations.

The column control circuit region $R_{CC}$ exemplified in FIG. 11 comprises: two of the regions $R_{CC1}$ arranged in the Y direction; two of the regions $R_{CC2}$ provided between these two regions $R_{CC1}$ and arranged in the Y direction; and the region $R_{CC3}$ provided between these two regions $R_{CC2}$. Moreover, the column control circuit region $R_{CC}'$ exemplified in FIG. 26 comprises: two of the regions $R_{CC1}'$ arranged in the Y direction; and the region $R_{CC3}$ provided between these two regions $R_{CC1}'$.

However, such configurations are merely exemplifications, and disposition of each of the regions in the column control circuit regions $R_{CC}$, $R_{CC}'$ may be appropriately adjusted.

For example, as shown in FIG. 32, the column control circuit region $R_{CC}$ may comprise: two of the regions $R_{CC1}$ arranged in the Y direction; two of the regions $R_{CC2}$ provided further to a negative side in the Y direction than these two regions $R_{CC1}$, and arranged in the Y direction; and the region $R_{CC3}$ provided further to a negative side in the Y direction than these two regions $R_{CC2}$. Moreover, although illustration of the following is omitted, the column control circuit region $R_{CC}'$ may comprise: two of the regions $R_{CC1}'$ arranged in the Y direction; and the region $R_{CC3}$ provided further to a negative side in the Y direction than these two regions $R_{CC1}'$.

Note that in FIG. 32, 64 sense amplifier circuits SADL<0> to SADL<63> are exemplified as the sense amplifier circuits SADL. In the example illustrated, 16 of the sense amplifier circuits SADL<16n> to SADL<16n+15> (where n is an integer of 0 or more) at a time are arranged over four columns, from a negative side in the Y direction to a positive side in the Y direction. The sense amplifier circuits SADL<0> to SADL<63> are respectively electrically connected to $1^{st}$ through $64^{th}$ bit lines BL counting from a negative side in the X direction.

Moreover, in FIG. 32, 64 latch circuits XDL<0> to XDL<63> are exemplified as the latch circuits XDL. In the example illustrated, 16 of the latch circuits XDL<16n> to XDL<16n+15> at a time are arranged over four columns, from a negative side in the Y direction to a positive side in the Y direction. These 64 latch circuits XDL<0> to XDL<63> are respectively provided correspondingly to the 64 sense amplifier circuits SADL<0> to SADL<63>.

Moreover, in FIG. 32, eight wirings DBUS extending in the Y direction are exemplified. These eight wirings DBUS are respectively connected to eight at a time of the sense amplifier circuits SADL<8m> to SADL<8m+7> (where m is an integer of 0 or more) arranged in the Y direction and eight at a time of the latch circuits XDL<8m> to XDL<8m+7> arranged in the Y direction.

Tenth Embodiment

Figure 33:
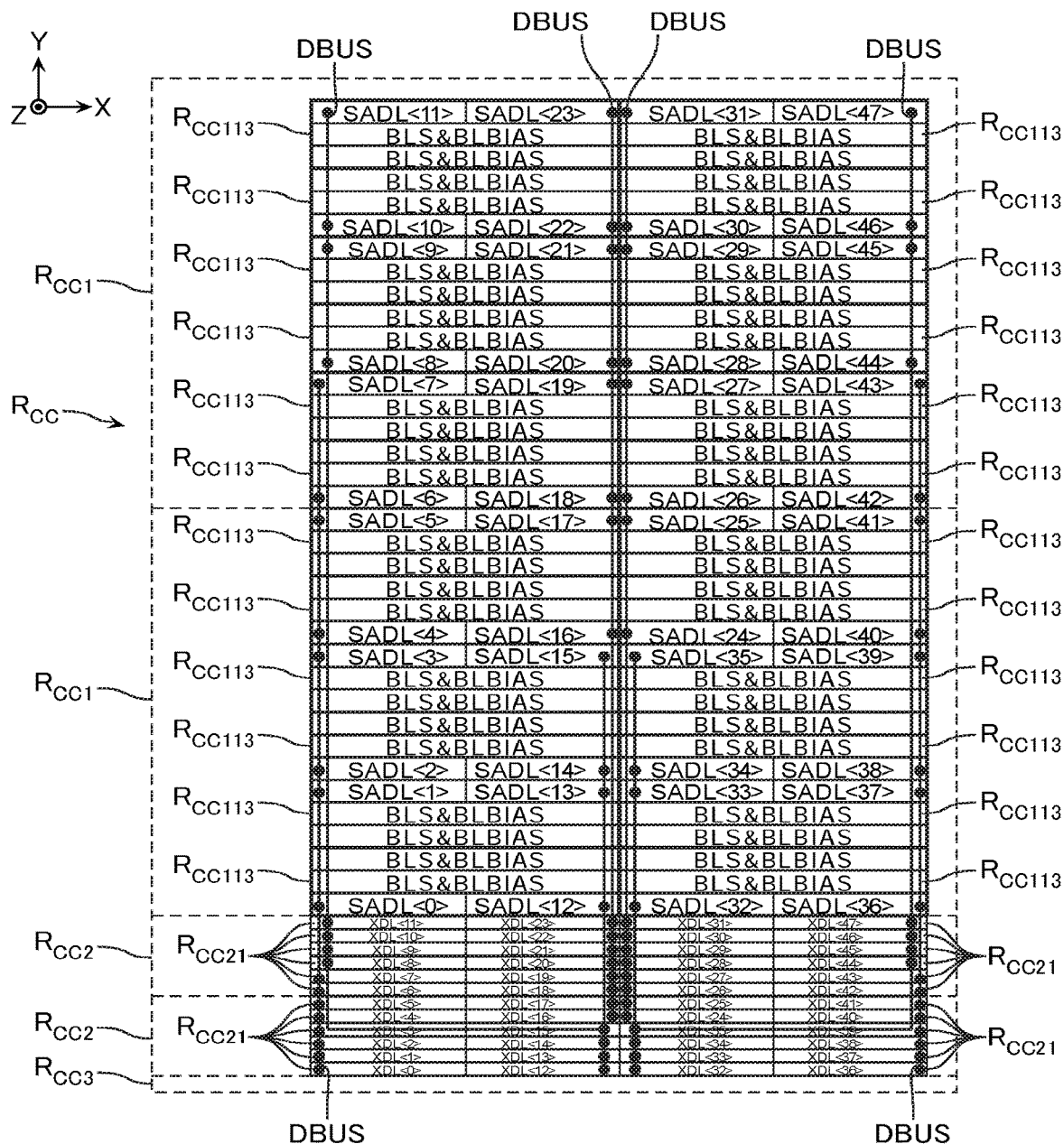
FIG. 33 is a schematic plan view showing a configuration of a part of a semiconductor memory device according to a tenth embodiment.
Figure 34:
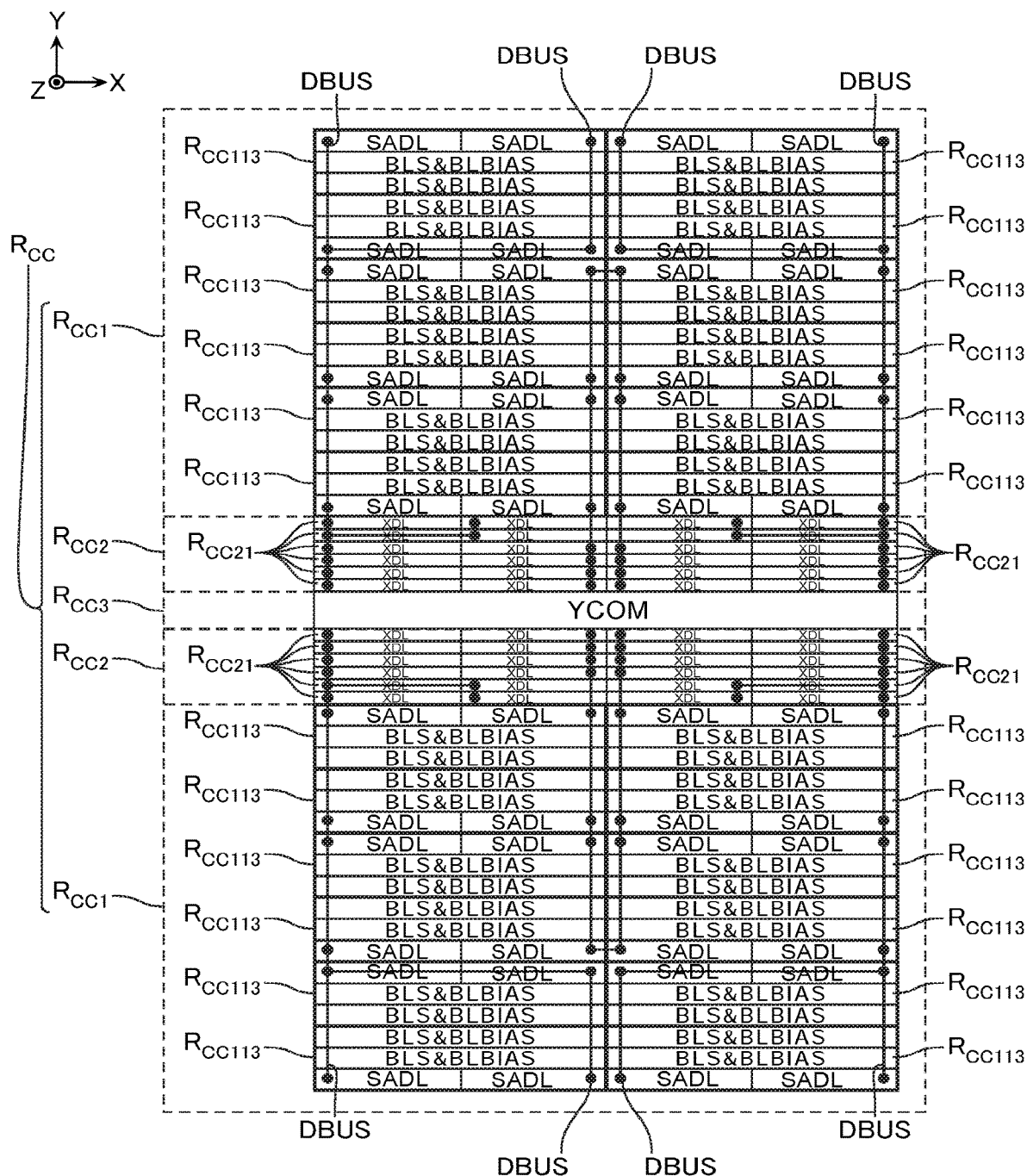
FIG. 34 is a schematic plan view showing part of another configuration example of the semiconductor memory device according to the tenth embodiment.

FIG. 33 is a schematic plan view showing a configuration of a part of a semiconductor memory device according to a tenth embodiment. FIG. 34 is a schematic plan view showing part of another configuration example of the semiconductor memory device according to the tenth embodiment. In the following description, portions similar to in the first embodiment will be assigned with the same symbols as in the first embodiment, and descriptions thereof omitted. Note that in FIGS. 33 and 34 too, the region $R_{CC113}$ is illustrated as a horizontally long region. However, the region $R_{CC113}$ shown in FIG. 12 and regions $R_{CC113}$ shown in FIGS. 33 and 34 denote similar configurations.

In the column control circuit region $R_{CC}$ exemplified in FIG. 11, 16 sense amplifier circuits SADL are arranged in the Y direction. Moreover, similarly, in the column control circuit region $R_{CC}'$ exemplified in FIG. 26 and column control circuit region $R_{CC}$ exemplified in FIG. 32 too, 16 sense amplifier circuits SADL are arranged in the Y direction.

However, such configurations are merely exemplifications, and the number of sense amplifier circuits SADL arranged in the Y direction in the column control circuit regions $R_{CC}$, $R_{CC}'$ may be appropriately adjusted.

For example, in the column control circuit region $R_{CC}$, 12 sense amplifier circuits SADL may be arranged in the Y direction, as exemplified in FIG. 33. Moreover, similarly, in the column control circuit region $R_{CC}$ exemplified in FIG. 11 too, 12 sense amplifier circuits SADL may be arranged in the Y direction, as exemplified in FIG. 34. Moreover, similarly, in the column control circuit region $R_{CC}'$ exemplified in FIG. 26 too, 12 sense amplifier circuits SADL may be arranged in the Y direction, although illustration of this is omitted.

Note that in FIG. 33, 48 sense amplifier circuits SADL<0> to SADL<47> are exemplified as the sense amplifier circuits SADL. In the example illustrated, 12 of the sense amplifier circuits SADL at a time are arranged in the Y direction over four columns. In columns other than the $3^{rd}$ column counting from a negative side in the X direction, the sense amplifier circuits SADL<$12n_1$> to SADL<$12n_1$+11> (where $n_1$ is 0, 1, or 3) are arranged from a negative side in the Y direction to a positive side in the Y direction. Moreover, in the $3^{rd}$ column counting from a negative side in the X direction, the sense amplifier circuits SADL<32> to SADL<35>, SADL<24> to SADL<31> are arranged from a negative side in the Y direction to a positive side in the Y direction.

Moreover, in FIG. 33, 48 latch circuits XDL<0> to XDL<47> are exemplified as the latch circuits XDL. In the example illustrated, 12 of the latch circuits XDL at a time are arranged in the Y direction over four columns. In columns other than the $3^{rd}$ column counting from a negative side in the X direction, the latch circuits XDL<$12n_1$> to XDL<$12n_1$+11> are arranged from a negative side in the Y direction to a positive side in the Y direction. Moreover, in the $3^{rd}$ column counting from a negative side in the X direction, the latch circuits XDL<32> to XDL<35>, XDL<24> to XDL<31> are arranged from a negative side in the Y direction to a positive side in the Y direction.

Moreover, in FIG. 33, six wirings DBUS are exemplified. Four of these six wirings DBUS extend in the Y direction, and are respectively connected to eight at a time of the sense amplifier circuits SADL<$8m_1$> to SADL<$8m_1$+7> (where $m_1$ is 0, 2, 3, or 5) arranged in the Y direction and eight at a time of the latch circuits XDL<$8m_1$> to XDL<$8m_1$+7> arranged in the Y direction. Moreover, the remaining two of these six wirings DBUS each comprise two portions extending in the Y direction. Ones of these two portions are connected to four at a time of the sense amplifier circuits SADL<$8m_2$> to SADL<$8m_2$+3> (where $m_2$ is 1 or 4) arranged in the Y direction and four at a time of the latch circuits XDL<$8m_2$> to XDL<$8m_2$+3> arranged in the Y direction. Moreover, the others of these two portions are connected to the four sense amplifier circuits SADL<12> to SADL<15> arranged in the Y direction and four latch circuits XDL<12> to XDL<15> arranged in the Y direction, or are connected to the four sense amplifier circuits SADL<44> to SADL<47> arranged in the Y direction and four latch circuits XDL<44> to XDL<47> arranged in the Y direction.

Eleventh Embodiment

Figure 35:
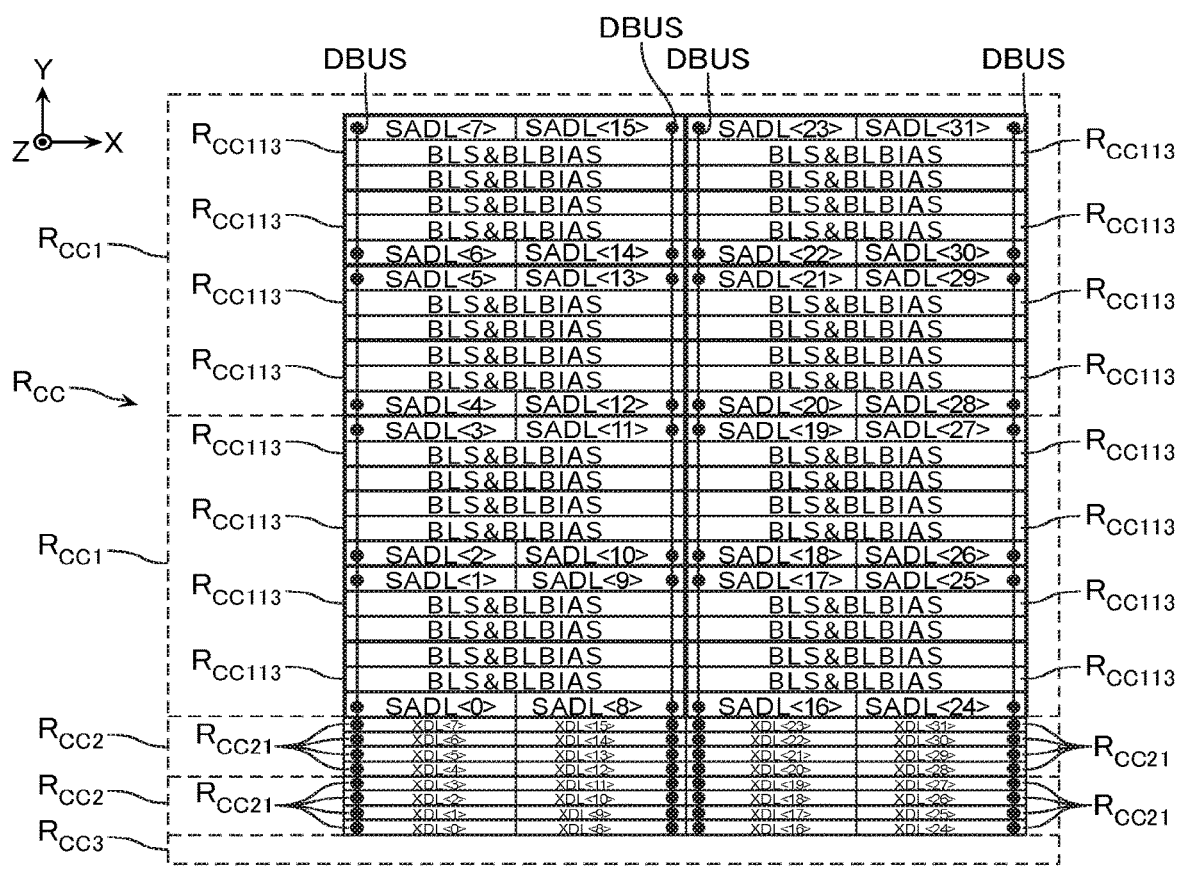
FIG. 35 is a schematic plan view showing a configuration of a part of a semiconductor memory device according to an eleventh embodiment.
Figure 36:
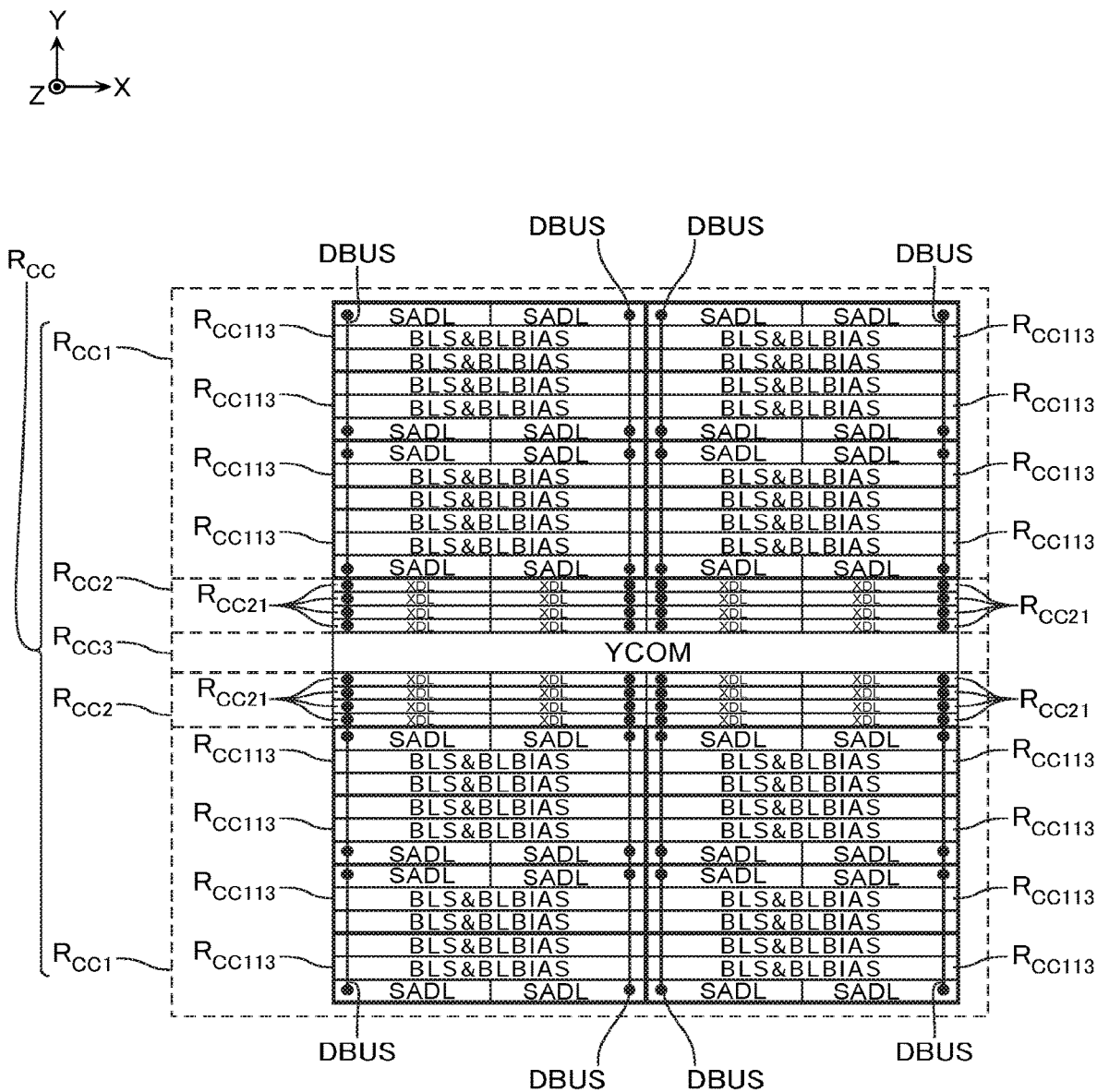
FIG. 36 is a schematic plan view showing part of another configuration example of the semiconductor memory device according to the eleventh embodiment.

FIG. 35 is a schematic plan view showing a configuration of a part of a semiconductor memory device according to an eleventh embodiment. FIG. 36 is a schematic plan view showing part of another configuration example of the semiconductor memory device according to the eleventh embodiment. In the following description, portions similar to in the first embodiment will be assigned with the same symbols as in the first embodiment, and descriptions thereof omitted. Note that in FIGS. 35 and 36 too, the region $R_{CC113}$ is illustrated as a horizontally long region. However, the region $R_{CC113}$ shown in FIG. 12 and regions $R_{CC113}$ shown in FIGS. 35 and 36 denote similar configurations.

As described with reference to FIGS. 33 and 34, the number of sense amplifier circuits SADL arranged in the Y direction in the column control circuit regions $R_{CC}$, $R_{CC}'$ may be appropriately adjusted.

For example, in the column control circuit region $R_{CC}$, eight sense amplifier circuits SADL may be arranged in the Y direction, as exemplified in FIG. 35. Moreover, similarly, in the column control circuit region $R_{CC}$ exemplified in FIG. 11 too, eight sense amplifier circuits SADL may be arranged in the Y direction, as exemplified in FIG. 36. Moreover, similarly, in the column control circuit region $R_{CC}'$ exemplified in FIG. 26 too, eight sense amplifier circuits SADL may be arranged in the Y direction, although illustration of this is omitted.

Note that in FIG. 35, 32 sense amplifier circuits SADL<0> to SADL<31> are exemplified as the sense amplifier circuits SADL. In the example illustrated, eight at a time of the sense amplifier circuits SADL<$8n$> to SADL<$8n$+7> are arranged over four columns, from a negative side in the Y direction to a positive side in the Y direction.

Moreover, in FIG. 35, 32 latch circuits XDL<0> to XDL<31> are exemplified as the latch circuits XDL. In the example illustrated, eight at a time of the latch circuits XDL<$8n$> to XDL<$8n$+7> are arranged over four columns, from a negative side in the Y direction to a positive side in the Y direction.

Moreover, in FIG. 35, four wirings DBUS are exemplified. These four wirings DBUS are respectively connected to eight at a time of the sense amplifier circuits SADL<$8m$> to SADL<$8m$+7> arranged in the Y direction and eight at a time of the latch circuits XDL<$8m$> to XDL<$8m$+7> arranged in the Y direction.

Twelfth Embodiment

Figure 37:
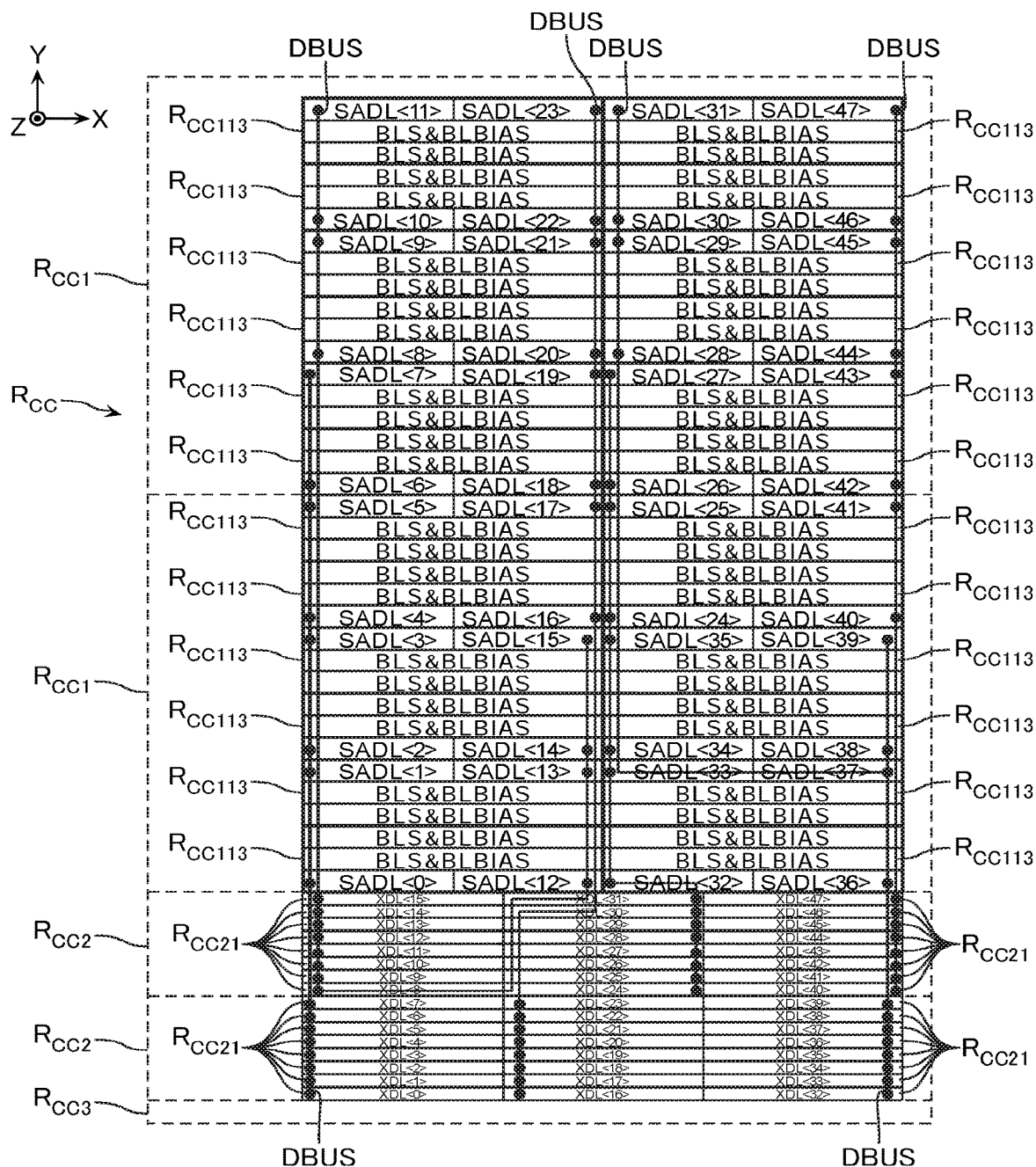
FIG. 37 is a schematic plan view showing a configuration of a part of a semiconductor memory device according to a twelfth embodiment.
Figure 38:
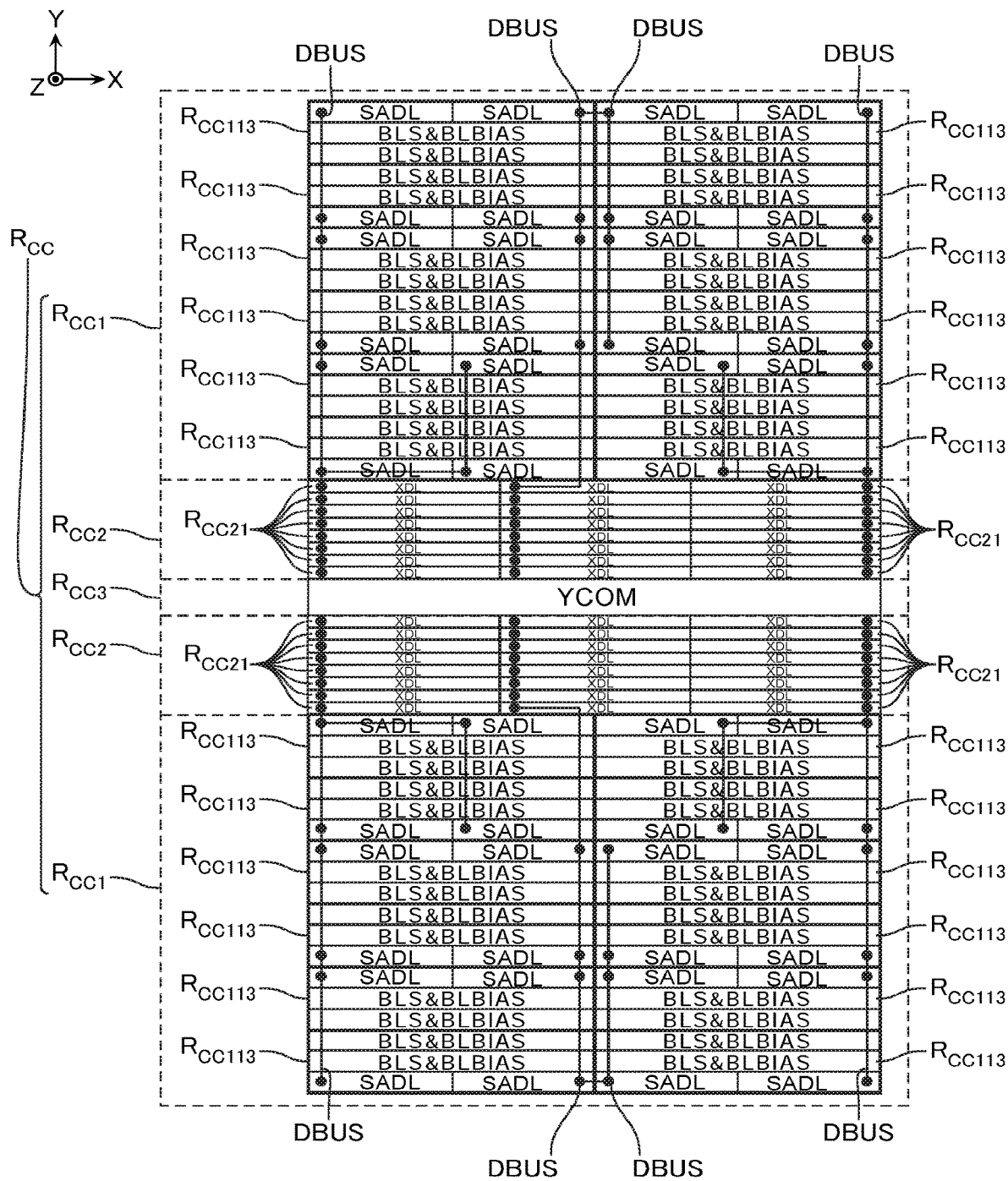
FIG. 38 is a schematic plan view showing part of another configuration example of the semiconductor memory device according to the twelfth embodiment.

FIG. 37 is a schematic plan view showing a configuration of a part of a semiconductor memory device according to a twelfth embodiment. FIG. 38 is a schematic plan view showing part of another configuration example of the semiconductor memory device according to the twelfth embodiment. In the following description, portions similar to in the first embodiment will be assigned with the same symbols as in the first embodiment, and descriptions thereof omitted. Note that in FIGS. 37 and 38 too, the region $R_{CC113}$ is illustrated as a horizontally long region. However, the region $R_{CC113}$ shown in FIG. 12 and regions $R_{CC113}$ shown in FIGS. 37 and 38 denote similar configurations.

In the column control circuit regions $R_{CC}$ exemplified in FIGS. 11 and 32 to 36 and column control circuit region $R_{CC}'$ exemplified in FIG. 26, the number of sense amplifier circuits SADL arranged in the X direction and number of latch circuits XDL arranged in the X direction are equal.

However, such configurations are merely exemplifications, and the number of sense amplifier circuits SADL arranged in the X direction and number of latch circuits XDL arranged in the X direction in the column control circuit regions $R_{CC}$, $R_{CC}'$ may differ.

For example, in FIGS. 37 and 38, a total of 48 sense amplifier circuits SADL<0> to SADL<47> arranged 12 at a time in the Y direction and four at a time in the X direction, are exemplified. Moreover, a total of 48 latch circuits XDL<0> to SADL<47> arranged 16 at a time in the Y direction and three at a time in the X direction, are exemplified.

Note that in FIG. 37, six wirings DBUS are exemplified. These six wirings DBUS are respectively connected to eight at a time of the sense amplifier circuits SADL<8m> to SADL<8m+7> and eight at a time of the latch circuits XDL<8m> to XDL<8m+7>.

Thirteenth Embodiment

Figure 39:
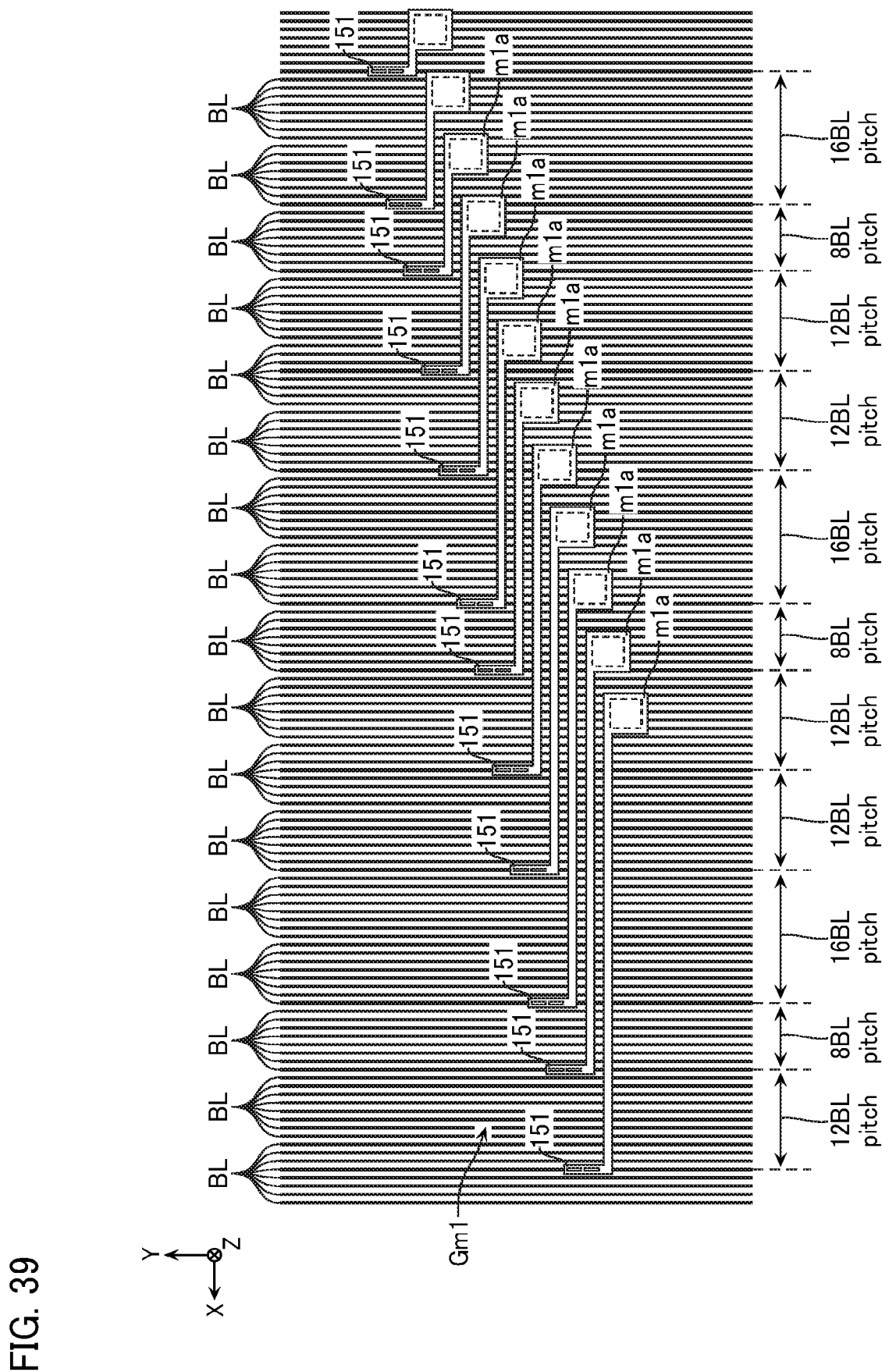
FIG. 39 is a schematic bottom view showing a configuration of a part of a semiconductor memory device according to a thirteenth embodiment.
Figure 40:
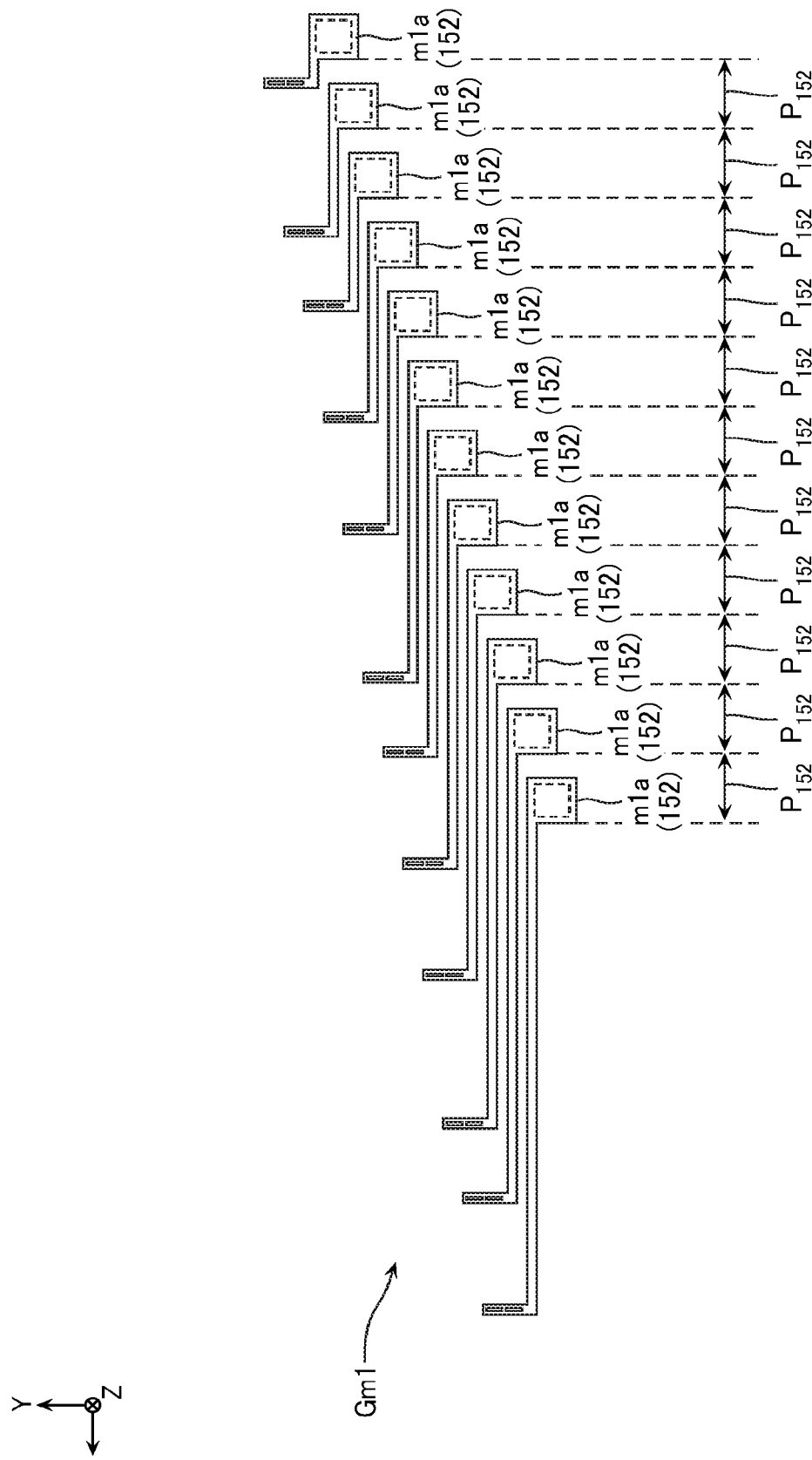
FIG. 40 is a schematic bottom view showing a configuration of a part of the same semiconductor memory device.

FIGS. 39 and 40 are schematic bottom views showing a configuration of a part of a semiconductor memory device according to a thirteenth embodiment. FIG. 40 illustrates configurations of a region corresponding to FIG. 39. However, in FIG. 40, the bit lines BL are omitted. In the following description, portions similar to in the first embodiment will be assigned with the same symbols as in the first embodiment, and descriptions thereof omitted.

In the example of FIG. 15, positions in the X direction of the portions 151 of the plurality of wirings m1a included in each wiring group Gm1 are equally spaced in the X direction. However, such a configuration is merely an exemplification, and positions in the X direction of the portions 151 of the plurality of wirings m1a included in each wiring group Gm1 need not be equally spaced.

For example, in the case of the column control circuit region $R_{CC}$ described with reference to FIG. 33 being adopted, the sense amplifier circuit SADL<4> is arranged with the sense amplifier circuits SADL<16>, SADL<24>, SADL<40> in the X direction. Furthermore, in the case of the number of sense amplifier circuits SADL arranged in the X direction being 49 or more in the column control circuit region $R_{CC}$, the sense amplifier circuit SADL<4> is arranged with the sense amplifier circuits SADL<48n+4>, SADL<48n+16>, SADL<48n+24>, SADL<48n+40> in the X direction.

FIG. 39 shows one example of the wiring group Gm1 corresponding to the sense amplifier circuits SADL<48n+4>, SADL<48n+16>, SADL<48n+24>, SADL<48n+40>. The wiring group Gm1 exemplified in FIG. 39 comprises 12 wirings m1a.

In FIG. 39, the bit lines BL are arranged equally spaced in the X direction. Moreover, the two bit lines BL corresponding to the sense amplifier circuits SADL<48n+4>, SADL<48n+16> and two portions 151 connected to these two 10 bit lines BL are separated by 12 portions of the inter-bit line BL pitch. Moreover, the two bit lines BL corresponding to the sense amplifier circuits SADL<48n+16>, SADL<48n+24> and two portions 151 connected to these two bit lines BL are separated by eight portions of the inter-bit line BL pitch. Moreover, the two bit lines BL corresponding to the sense amplifier circuits SADL<48n+24>, SADL<48n+40> and two portions 151 connected to these two bit lines BL are separated by 16 portions of the inter-bit line BL pitch. Moreover, the two bit lines BL corresponding to the sense amplifier circuits SADL<48n+40>, SADL<48n+52> and two portions 151 connected to these two bit lines BL are separated by 12 portions of the inter-bit line BL pitch.

An average value of pitch in the X direction of the portions 151 of the plurality of wirings m1a included in the wiring group Gm1 exemplified in FIG. 39 is 12 portions of the inter-bit line BL pitch. This is larger than the pitch $P_{152}$ (FIG. 40) in the X direction of the portions 152 of the plurality of wirings m1a included in the wiring group Gm1 exemplified in FIG. 39.

Other Embodiments

That concludes description of the semiconductor memory devices according to the first through thirteenth embodiments. However, the configurations described above are merely exemplifications, and specific configurations may be appropriately adjusted.

For example, in the column control circuit region $R_{CC}$ exemplified in FIG. 32, 16 at a time of the sense amplifier circuits SADL<16n> to SADL<16n+15> arranged from a negative side in the Y direction to a positive side in the Y direction are respectively connected to 16 of the bit lines BL arranged consecutively from a negative side in the X direction to a positive side in the X direction. However, such a configuration is merely an exemplification, and a correspondence relationship of the bit lines BL and sense amplifier circuits SADL may be appropriately adjusted.

For example, in the column control circuit region $R_{CC}$ exemplified in FIG. 32, eight of the sense amplifier circuits SADL and eight of the latch circuits XDL are connected to one wiring DBUS common thereto. However, such a configuration is merely an example, and the numbers of sense amplifier circuits SADL and latch circuits XDL connected to one wiring DBUS may be appropriately adjusted.

Moreover, in the above embodiments, there have been described examples of applying to a NAND flash memory. However, technology described in the present specification may also be applied to a configuration other than a NAND flash memory, such as a three-dimensional type NOR flash memory, for example. Moreover, technology described in the present specification may also be applied to a configuration other than a flash memory, such as a three-dimensional type DRAM, for example.

[Example of DRAM]

Figure 41:
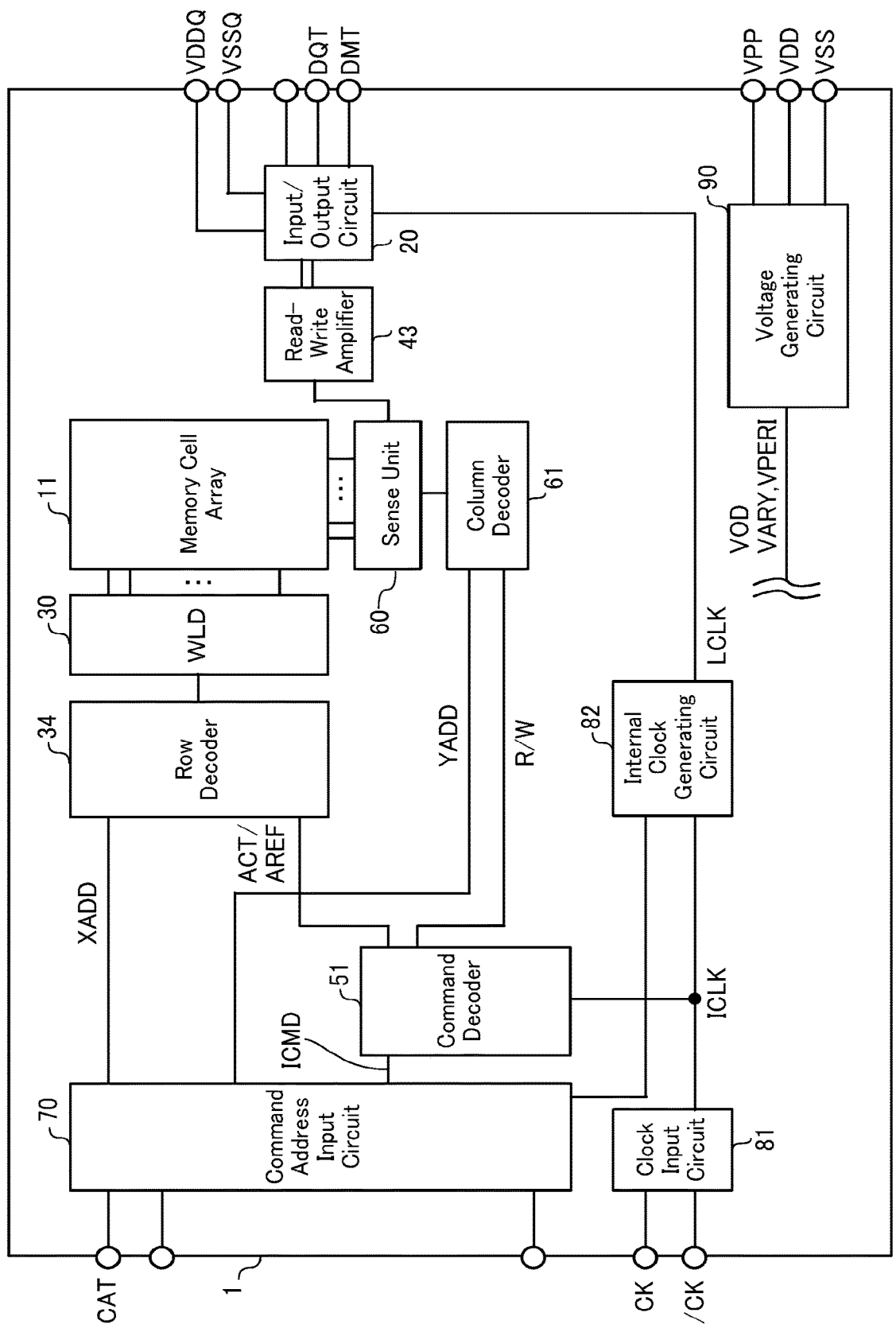
FIG. 41 is a schematic block diagram showing a configuration example of a DRAM 1.
Figure 42:
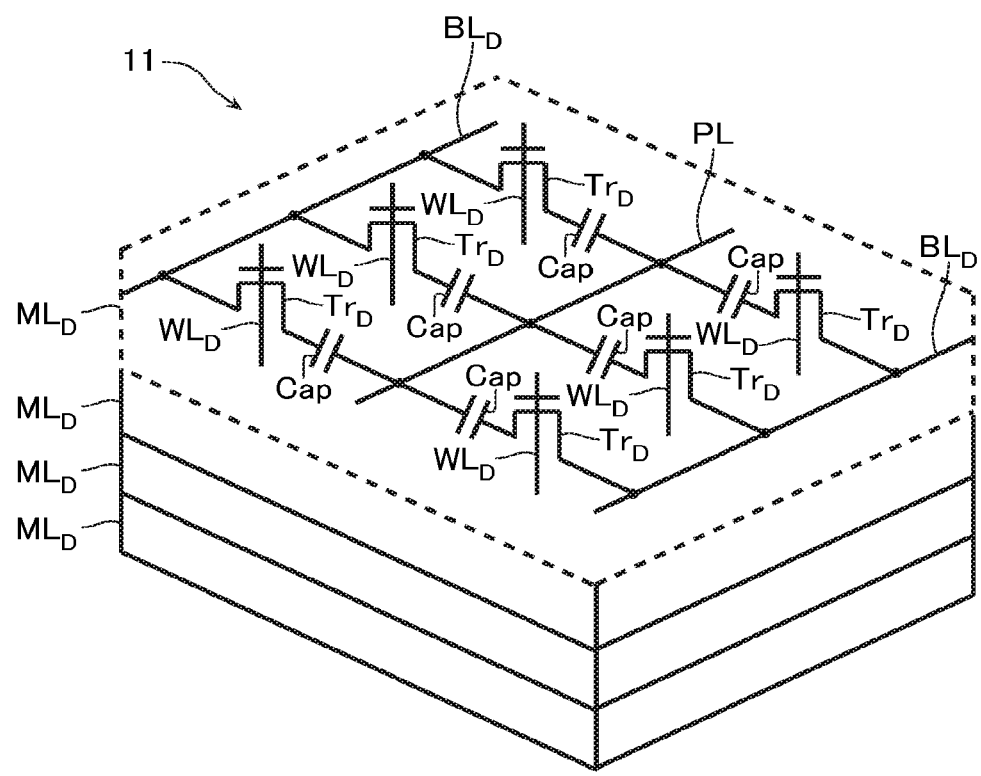
FIG. 42 is a schematic circuit diagram showing a configuration example of a memory cell array 11 of the DRAM 1.

FIG. 41 is a schematic block diagram showing a configuration example of a DRAM 1. FIG. 42 is a schematic circuit diagram showing a configuration example of a memory cell array 11 of the DRAM 1.

As shown in FIG. 41, the DRAM 1 comprises a memory cell array 11, an input/output circuit 20, a word line driver 30 (denoted as WLD in FIG. 41), a row decoder 34, a read-write amplifier 43, a command decoder 51, a sense unit 60, a column decoder 61, a command address input circuit 70, a clock input circuit 81, an internal clock generating circuit 82, and a voltage generating circuit 90.

In addition, the DRAM 1 comprises clock terminals CK, /CK, a command/address terminal CAT, a data terminal DQT, a data mask terminal DMT, and a plurality of external terminals such as power supply terminals VPP, VDD, VSS, VDDQ, VSSQ.

As shown in FIG. 42, the memory cell array 11 comprises a plurality of memory layers $ML_D$. These plurality of memory layers $ML_D$ are arranged in a vertical direction with a substrate. Moreover, these plurality of memory layers $ML_D$ each comprise: a bit line $BL_D$; a plurality of transistors $Tr_D$ connected to the bit line $BL_D$; a plurality of capacitors Cap connected to these plurality of transistors $Tr_D$; and a plate line PL commonly connected to these plurality of capacitors Cap. A source electrode of the transistor $Tr_D$ is connected to the bit line $BL_D$. A drain electrode of the transistor $Tr_D$ is connected to the capacitor Cap. A gate electrode of the transistor $Tr_D$ is connected to a word line $WL_D$. Moreover, the word line $WL_D$ and plate line PL are respectively connected to the transistors $Tr_D$ in the plurality of memory layers $ML_D$.

When a low-level or high-level voltage is applied to the word line $WL_D$ and a low-level or high-level voltage is applied to the bit line $BL_D$, the transistor $Tr_D$ attains an ON state or an OFF state. As a result, a charge is accumulated in the capacitor Cap, or an accumulated charge is discharged.

In the DRAM 1, data is stored correspondingly to the charge accumulated in the capacitor Cap. Moreover, in the DRAM 1, there is performed a processing where, in order for the charge accumulated in the capacitor Cap to be maintained, the charge of the capacitor Cap is periodically refreshed by a refresh circuit. In FIG. 41, the refresh circuit, and so on, are omitted for convenience of explanation.

Combinations of a plurality of memory cells (in the DRAM 1, the transistors $Tr_D$ and capacitors Cap) in the memory cell array 11 are respectively corresponded with memory addresses. The command/address terminal CAT (FIG. 41), of the plurality of external terminals receives a memory address from an external device such as a memory controller, for example. The memory address received by the command/address terminal CAT is relayed to the command address input circuit 70. Upon receiving the memory address, the command address input circuit 70 transmits a decoded row address XADD to the row decoder 34, and transmits a decoded column address YADD to the column decoder 61.

In addition, the command/address terminal CAT receives a command from an external device such as a memory controller, for example. The command received by the command/address terminal CAT is relayed to the command address input circuit 70. Upon receiving the command, the command address input circuit 70 transmits the received command to the command decoder 51 as an internal command signal ICMD.

The command decoder 51 includes a circuit that decodes the internal command signal ICMD to generate a signal for executing an internal command. The command decoder 51 transmits an activated command ACT and refresh command AREF, for example, to the row decoder 34. The row decoder 34 selects the word line $WL_D$ according to the command ACT and refresh command AREF received from the command decoder 51. The row decoder 34 transmits a signal indicating the selected word line $WL_D$ to the word line driver 30.

The word line driver 30 is connected to the word line $WL_D$ (FIG. 42). The word line driver 30 receives the signal from the row decoder 34, and applies a low-level or high-level voltage to the word line $WL_D$ instructed by that signal.

Moreover, the command decoder 51 transmits a read/write command R/W, for example, to the column decoder 61. The column decoder 61 selects the bit line $BL_D$ (FIG. 42) according to the read/write command R/W received from the command decoder 51. The column decoder 61 transmits a signal indicating the selected bit line $BL_D$ to the sense unit 60.

The sense unit 60 is connected to the bit line $BL_D$.

The sense unit 60 receives the signal from the column decoder 61, and applies a low-level or high-level voltage to the bit line $BL_D$ instructed by that signal.

At a time of reading data, a memory address along with a read command are received by the command/address terminal CAT. As a result, data is read from the memory cell MC in the memory cell array 11 designated by the memory address. Read data is outputted to outside from the data terminal DQT via the sense unit 60, the read-write amplifier 43, and the input/output circuit 20.

At a time of writing data, a memory address along with a write command are received by the command/address terminal CAT, and write data is received by the data terminal DQT. Moreover, a data mask is received by the data mask terminal DMT as required. Write data is transmitted to the memory cell array 11 via the input/output circuit 20, the read-write amplifier 43, and the sense unit 60. As a result, the write data is written to the memory cell designated by the memory address.

The read-write amplifier 43 comprises various kinds of latch circuits for temporarily storing the read data and write data.

The voltage generating circuit 90 is connected to the power supply terminals VPP, VDD, VSS. The voltage generating circuit 90 is supplied with power supply voltages from the power supply terminals VPP, VDD, VSS, and generates various kinds of internal voltages VOD, VARY, VPERI based on these power supply voltages. The internal voltages VOD, VARY are used mainly by the sense unit 60, and the internal voltage VPERI is used by other peripheral circuits.

Moreover, the input/output circuit 20 is connected to the power supply terminals VDDQ, VSSQ. The power supply terminals VDDQ, VSSQ are supplied with a dedicated power supply voltage, in order to prevent power supply noise generated by the input/output circuit 20 from being propagated to another circuit block. Note that the power supply voltages supplied to the power supply terminals VDDQ, VSSQ may be the same voltages as the power supply voltages supplied to the power supply terminals VDD, VSS.

The clock terminals CK, /CK are inputted with complementary external clock signals. The external clock signals are supplied to the internal clock generating circuit 82. The internal clock generating circuit 82 generates an internal clock signal ICLK. The internal clock signal ICLK is supplied to the internal clock generating circuit 82 and the command decoder 51.

Upon being enabled by clock enabling from the command address input circuit 70, the internal clock generating circuit 82 generates a variety of internal clock signals LCLK. The internal clock signals LCLK are used for measuring timing of various internal operations. For example, the internal clock signal LCLK is outputted to the input/output circuit 20. The input/output circuit 20 transmits/receives data from the data terminal DQT, based on the internal clock signal LCLK the input/output circuit 20 has been inputted with.

Figure 43:
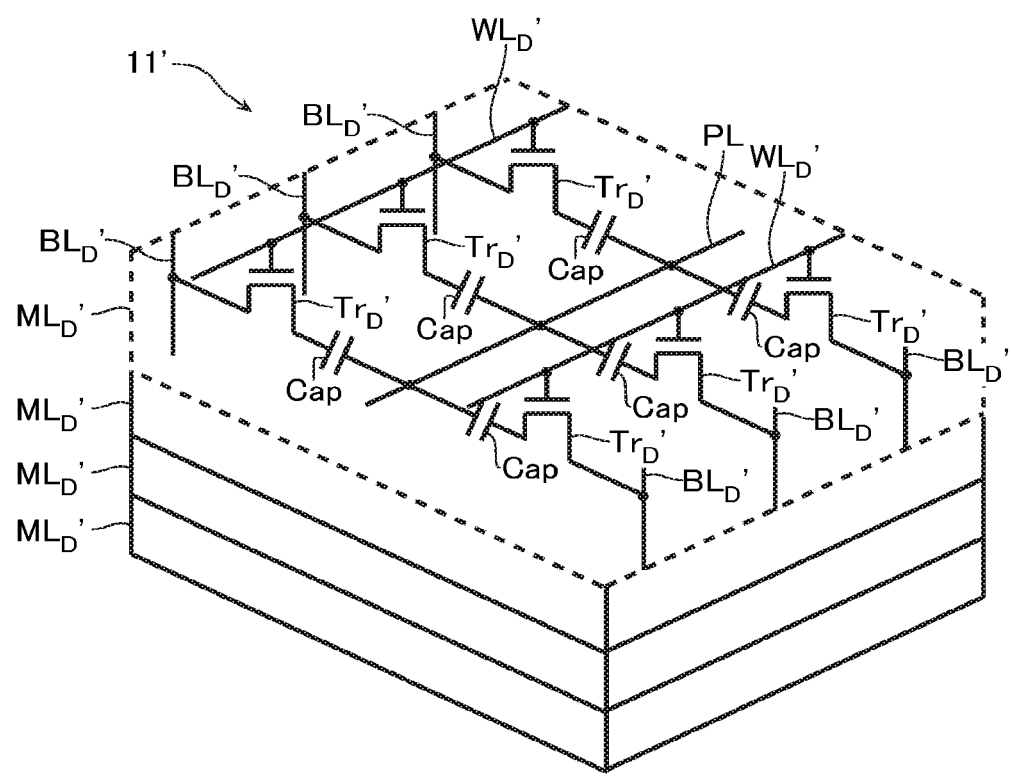
FIG. 43 is a schematic circuit diagram showing a memory cell array 11' according to another configuration example of the DRAM 1.

FIG. 43 is a schematic circuit diagram showing a memory cell array 11' according to another configuration example of the DRAM 1.

As shown in FIG. 43, the memory cell array 11' comprises a plurality of memory layers $ML_D'$. These plurality of memory layers $ML_D'$ are arranged in a vertical direction with the substrate. Moreover, these plurality of memory layers $ML_D'$ each comprise: a word line $WL_D'$; a plurality of transistors $Tr_D'$ connected to the word line $WL_D'$; a plurality of the capacitors Cap connected to these plurality of transistors $Tr_D'$; and the plate line PL commonly connected to these plurality of capacitors Cap. A source electrode of the transistor $Tr_D'$ is connected to a bit line $BL_D'$. A drain electrode of the transistor $Tr_D'$ is connected to the capacitor Cap. A gate electrode of the transistor $Tr_D'$ is connected to the word line $WL_D'$. Moreover, the bit line $BL_D'$ and plate line PL are respectively connected to the transistors $Tr_D'$ in the plurality of memory layers $ML_D'$.

In this kind of configuration too, there is a risk that due to increase in the number of memory layers $ML_D$, area of the peripheral circuit increases on the unillustrated semiconductor substrate. Moreover, this kind of configuration too may be applied with the technology described in the present specification.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising
   a first chip and a second chip that have been bonded via a plurality of bonding electrodes,
   the first chip comprising:
   a semiconductor substrate; and
   a plurality of transistors provided on the semiconductor substrate,
   the second chip comprising:
   a plurality of first conductive layers arranged in a first direction that intersects a surface of the semiconductor substrate;
   a plurality of semiconductor layers extending in the first direction and facing the plurality of first conductive layers;
   a first wiring layer provided between the plurality of semiconductor layers and the first chip, and including a plurality of bit lines electrically connected to the plurality of semiconductor layers;
   a second wiring layer provided between the first wiring layer and the first chip, and including a plurality of wirings; and
   a second chip bonding electrode layer provided between the second wiring layer and the first chip, and including a plurality of first bonding electrodes being some of the plurality of bonding electrodes,
   the plurality of bit lines extending in a second direction that intersects the first direction, and being arranged in a third direction that intersects the first direction and the second direction,
   the plurality of wirings in the second wiring layer each comprising:
   a first portion that is provided in a region overlapping one of the plurality of bit lines viewed from the first direction, extends in the second direction, and is electrically connected to the one of the plurality of bit lines; and
   a second portion that is provided in a region overlapping one of the plurality of first bonding electrodes viewed from the first direction, and is electrically connected to the one of the plurality of first bonding electrodes, and
   at least some of the plurality of wirings in the second wiring layer each comprising a third portion that extends in the third direction and is connected to one end portion in the second direction of the first portion and one end portion in the second direction of the second portion.

2. The semiconductor memory device according to claim 1, wherein
   in some of the wirings in the second wiring layer, one end portion in the second direction of the first portion is connected to the second portion.

3. A semiconductor memory device comprising
   a first chip and a second chip that have been bonded via a plurality of bonding electrodes,
   the first chip comprising:
   a semiconductor substrate; and
   a plurality of transistors provided on the semiconductor substrate,
   the second chip comprising:
   a plurality of first conductive layers arranged in a first direction that intersects a surface of the semiconductor substrate;
   a plurality of semiconductor layers extending in the first direction and facing the plurality of first conductive layers;
   a first wiring layer provided between the plurality of semiconductor layers and the first chip, and including a plurality of bit lines electrically connected to the plurality of semiconductor layers;
   a second wiring layer provided between the first wiring layer and the first chip, and including a plurality of wiring groups; and
   a second chip bonding electrode layer provided between the second wiring layer and the first chip, and including a plurality of first bonding electrodes being some of the plurality of bonding electrodes,
   the plurality of bit lines extending in a second direction that intersects the first direction, and being arranged in a third direction that intersects the first direction and the second direction,
   the plurality of wiring groups in the second wiring layer each comprising a plurality of wirings,
   the plurality of wirings each comprising:
   a first portion that is provided in a region overlapping one of the plurality of bit lines viewed from the first direction, extends in the second direction, and is electrically connected to the one of the plurality of bit lines; and
   a second portion that is provided in a region overlapping one of the plurality of first bonding electrodes viewed from the first direction, and is electrically connected to the one of the plurality of first bonding electrodes, and
   at least some of the plurality of wirings each comprising a third portion that extends in the third direction and is connected to one end portion in the second direction of the first portion and one end portion in the second direction of the second portion.

4. The semiconductor memory device according to claim 3, wherein
   in some of the wirings in the second wiring layer, one end portion in the second direction of the first portion is connected to the second portion.

5. The semiconductor memory device according to claim 3, wherein
   assuming one of the plurality of wiring groups to be a first wiring group,
   assuming a pitch in the third direction of the first portions of the plurality of wirings included in the first wiring group to be a first pitch, and
   assuming a pitch in the third direction of the second portions of the plurality of wirings included in the first wiring group to be a second pitch,
   the first pitch is larger than the second pitch.

6. The semiconductor memory device according to claim 3, wherein assuming one of the plurality of wiring groups to be a first wiring group, assuming another one of the plurality of wiring groups that is adjacent to the first wiring group in the second direction to be a second wiring group, and assuming a plurality of first bonding electrodes arranged in the second direction correspondingly to a plurality of the wiring groups arranged in the second direction, of the plurality of first bonding electrodes to be a plurality of second bonding electrodes, a pitch in the second direction of the plurality of second bonding electrodes is greater than or equal to a total value of: a width in the second direction of the first wiring group; and a distance in the second direction between the first wiring group and the second wiring group.

7. The semiconductor memory device according to claim 6, wherein the width in the second direction of the first wiring group is a total value of:

a width in the second direction of the first portion, of a first wiring being one of the plurality of wirings included in the first wiring group;

a width in the second direction of the second portion, of a second wiring being another one of the plurality of wirings included in the first wiring group;

a total value of widths in the second direction of the third portions, of a plurality of third wirings being a plurality of wirings excluding the first wiring and the second wiring, of the plurality of wirings included in the first wiring group; and a total value of distances in the second direction between the plurality of wirings included in the first wiring group.

8. The semiconductor memory device according to claim 3, wherein the second chip comprises a memory plane, the first chip comprises a circuit region provided in a region overlapping the memory plane viewed from the first direction, the circuit region comprises:

two first circuit regions arranged in the third direction; and one or a plurality of second circuit regions provided between the two first circuit regions, a (where a is an integer of 1 or more) of the second circuit regions being arranged in the second direction and b (where b is an integer of 1 or more) of the second circuit regions being arranged in the third direction, the two first circuit regions each comprise a plurality of first transistors electrically connected to at least some of the plurality of first conductive layers, and the one or plurality of second circuit regions each comprise a plurality of second transistors electrically connected to some of the plurality of bit lines.

9. The semiconductor memory device according to claim 8, wherein the memory plane comprises:

a first region where the plurality of semiconductor layers are provided; and a second region including a plurality of first via contact electrodes that are connected to the plurality of first conductive layers, a part of the first circuit region is provided in a region overlapping the second region viewed from the first direction, and another part of the first circuit region is provided in a region overlapping the first region viewed from the first direction.

10. The semiconductor memory device according to claim 9, wherein assuming in the case of the first region having been divided into 2b regions in the third direction, these 2b regions to be third regions, the plurality of wiring groups are each provided in any of these 2b third regions.

11. The semiconductor memory device according to claim 9, wherein assuming in the case of the first region having been divided into 2b regions in the third direction, these 2b regions to be third regions, a maximum length in the third direction of the pluralities of wirings included in the plurality of wiring groups is smaller than a width in the third direction of these 2b third regions.

12. The semiconductor memory device according to claim 8, wherein b is an integer of 3 or more.

13. The semiconductor memory device according to claim 8, wherein the second circuit region comprises n sense amplifier circuits arranged in the second direction, and assuming in the case of the second circuit region having been divided into n regions in the second direction, these n regions to be fourth regions, the plurality of wiring groups are each provided in a range of any of these n fourth regions.

14. The semiconductor memory device according to claim 13, wherein a number of the plurality of wiring groups arranged in the second direction is n.

15. The semiconductor memory device according to claim 13, wherein a number of the plurality of wiring groups arranged in the second direction is an integer multiple of n.

16. The semiconductor memory device according to claim 8, wherein the circuit region comprises a third circuit region provided between the first circuit region and the second circuit region, and the third circuit region outputs a signal to a plurality of signal lines connected to gate electrodes of the plurality of first transistors.

17. The semiconductor memory device according to claim 1, comprising a second via contact electrode provided between the first wiring layer and the second wiring layer, wherein one end portion in the first direction of the second via contact electrode is connected to one of the plurality of bit lines, and the other end portion in the first direction of the second via contact electrode is connected to the first portion of one of the plurality of wirings.

18. The semiconductor memory device according to claim 17, wherein a length in the second direction of the second via contact electrode is larger than a length in the third direction of the second via contact electrode.

19. The semiconductor memory device according to claim 1, wherein one end portion in the first direction of one of the plurality of first bonding electrodes is connected to the second portion of one of the plurality of wirings.

20. The semiconductor memory device according to claim 1, wherein the first chip comprises:
a third wiring layer provided between the semiconductor substrate and the second chip; and
a first chip bonding electrode layer provided between the third wiring layer and the second chip, and including a plurality of third bonding electrodes being some of the plurality of bonding electrodes, and the third wiring layer comprises:
a fourth wiring connected to one end portion in the first direction of one of the plurality of third bonding electrodes and connected to one of the plurality of bit lines via the one of the plurality of third bonding electrodes;
a fifth wiring connected to one end portion in the first direction of another of the plurality of third bonding electrodes and connected to another of the plurality of bit lines via the another of the plurality of third bonding electrodes, the fifth wiring's position in the third direction differing from that of the fourth wiring; and
a sixth wiring provided between the fourth wiring and the fifth wiring and extending in the second direction.

* * * * *